(12) United States Patent
Choi et al.

(10) Patent No.: US 12,490,604 B2
(45) Date of Patent: Dec. 2, 2025

(54) DISPLAY DEVICE

(71) Applicant: Samsung Display Co., Ltd., Yongin-Si (KR)

(72) Inventors: Yoon Sun Choi, Hwaseong-si (KR); Seung Hwan Cho, Yongin-si (KR); Won Suk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 696 days.

(21) Appl. No.: 17/877,113

(22) Filed: Jul. 29, 2022

(65) Prior Publication Data

US 2023/0247870 A1    Aug. 3, 2023

(30) Foreign Application Priority Data

Jan. 28, 2022  (KR) .................. 10-2022-0013408

(51) Int. Cl.
*H10K 59/131*  (2023.01)
*H10K 59/40*  (2023.01)

(52) U.S. Cl.
CPC .......... *H10K 59/131* (2023.02); *H10K 59/40* (2023.02)

(58) Field of Classification Search
None
See application file for complete search history.

(56) References Cited

U.S. PATENT DOCUMENTS

| 2021/0303040 A1 | 9/2021 | Choi et al. |
| 2021/0320163 A1 * | 10/2021 | Bang .................... H10K 59/131 |
| 2022/0045142 A1 | 2/2022 | Choi et al. |

* cited by examiner

*Primary Examiner* — Kyoung Lee
(74) *Attorney, Agent, or Firm* — Innovation Counsel LLP

(57) ABSTRACT

Provided is a display device. The display device includes a display area including a hole and sub-pixels displaying an image, first data lines disposed on one side of the hole in the display area and extending in a second direction crossing a first direction, second data lines disposed on the other side of the hole in the display area and extending in the second direction, and bypass lines bypassing the hole in the display area and connecting the first data lines and the second data lines, respectively. Each the bypass lines includes a first sub-bypass line extending in the first direction and connected to any one of the first data lines, a second sub-bypass line extending in the second direction and connected to the first sub-bypass line, and a third sub-bypass line extending in the first direction and connecting the second sub-bypass line and any one of the second data.

35 Claims, 38 Drawing Sheets

FIG. 28
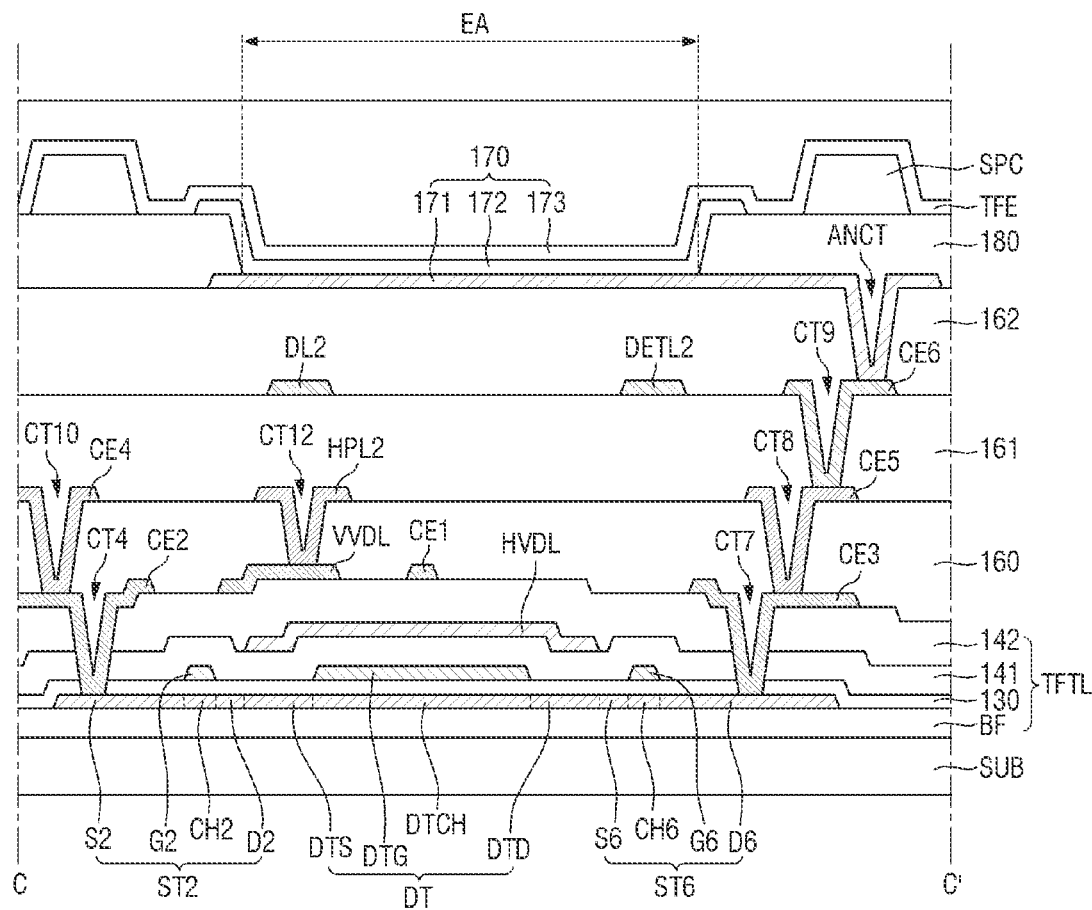
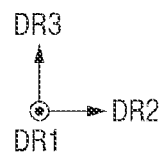

DISPLAY DEVICE

CROSS-REFERENCE TO RELATED APPLICATION

This application claims priority to Korean Patent Application No. 10-2022-0013408 filed on Jan. 28, 2022, and all the benefits accruing therefrom under 35 U.S.C. § 119, the content of which in its entirety is herein incorporated by reference.

BACKGROUND

1. Field of the Disclosure

The present disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions.

The display device may include pixels emitting predetermined light, scan lines, data lines, and power supply lines for driving the pixels, a scan driver outputting scan signals to the scan lines, and a display driver outputting data voltages to the data lines.

The display device includes a display area including the pixels to display an image and a non-display area disposed around the display area. Recently, an area of the non-display area in the display device has been minimized, but a space in which fan out lines connecting the display driver and the data lines to each other is disposed in the non-display area may be insufficient due to the minimization of the area of the non-display area.

SUMMARY

Aspects of the present disclosure provide a display device capable of solving an insufficiency of a space in which fan-out lines are disposed due to a decrease in an area of a non-display area.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, a display device includes a display area including a hole and sub-pixels displaying an image, a plurality of first data lines disposed on one side of the hole in the display area and extending in a second direction crossing a first direction, a plurality of second data lines disposed on the other side of the hole in the display area and extending in the second direction, and a plurality of bypass lines bypassing the hole in the display area and connecting the first data lines and the second data lines, respectively. Each of the plurality of bypass lines includes a first sub-bypass line extending in the first direction and connected to any one of the plurality of first data lines, a second sub-bypass line extending in the second direction and connected to the first sub-bypass line, and a third sub-bypass line extending in the first direction and connecting the second sub-bypass line and any one of the plurality of second data lines.

The display device may further include a plurality of first horizontal power supply lines which extend in the first direction in the display area and to which a first source voltage is applied, a plurality of second horizontal power supply lines which extend in the first direction in the display area and to which a second source voltage higher than the first source voltage is applied, and a first vertical power supply line extending in the second direction in the display area and disposed to be spaced apart from one end of the second sub-bypass line along the second direction.

The first vertical power supply line may be connected to any one of the plurality of first horizontal power supply lines.

A first spacing portion disposed between the first vertical power supply line and the one end of the second sub-bypass line of a first bypass line of the plurality of bypass lines overlaps any one of the plurality of second horizontal power supply lines.

Each of the second sub-bypass line of the first bypass line and the first vertical power supply line may include a first line portion having a first width, and a second line portion having a second width greater than the first width. The first spacing portion may be a gap between the first line portion of the second sub-bypass line of the first bypass line and the first line portion of the first vertical power supply line.

A second spacing portion at which the second sub-bypass line of a second bypass line of the plurality of bypass lines and the first vertical power supply line are disposed to be spaced apart from each other may not overlap the plurality of second horizontal power supply lines.

Each of the second sub-bypass line of the second bypass line and the first vertical power supply line may include a first line portion having a first width, and a second line portion having a second width greater than the first width.

The second spacing portion may be a gap between the first line portion of the second sub-bypass line of the second bypass line and the second line portion of the first vertical power supply line or a gap between the second line portion of the second sub-bypass line and the first line portion of the first vertical power supply line.

The second spacing portion may be a gap between the second line portion of the second sub-bypass line of the second bypass line and the second line portion of the first vertical power supply line.

The display device may further include a vertical dummy pattern extending in the second direction in the display area and disposed to be spaced apart from the other end of the second sub-bypass line along the second direction.

The display device may further include a second power supply line which is disposed in a non-display area around the display area and to which the second source voltage is applied. The vertical dummy pattern may be connected to the second power supply line in the non-display area.

The display device may further include a plurality of first horizontal dummy patterns extending in the first direction in the display area and disposed to be spaced apart from one end of the first sub-bypass line along the first direction.

The first horizontal dummy patterns may be connected to the first vertical power supply line through first power holes, respectively.

The first power holes may be arranged in the second direction.

The first power holes may overlap a center of the hole in the second direction.

The display device may further include a plurality of second horizontal dummy patterns extending in the first direction in the display area and disposed to be spaced apart from one end of the third sub-bypass line along the first direction.

The display device may further include a second vertical power supply line extending in the second direction in the display area. The second horizontal dummy patterns may be connected to the second vertical power supply line through second power holes.

The second power holes may be arranged in the second direction.

The second power holes may overlap a center of the hole in the second direction.

The first vertical power supply line may receive the first source voltage. The second vertical power supply line may receive the second source voltage higher than the first source voltage.

Second sub-bypass lines and third sub-bypass lines of some of the plurality of bypass lines may be disposed in the display area. Second sub-bypass lines and third sub-bypass lines of the rest of the plurality of bypass lines may be disposed in the non-display area.

The display device may further include a first power supply line which is disposed in a non-display area disposed around the display area and to which the first source voltage is applied. The second sub-bypass lines and the third sub-bypass lines of the rest of the plurality of bypass lines may be disposed between the first power supply line and the second power supply line.

A second sub-bypass line and a third sub-bypass line adjacent to each other among the second sub-bypass lines and the third sub-bypass lines of the rest of the plurality of bypass lines may be disposed at different layers.

The display device may further include an optical device disposed in the hole and sensing light incident through the hole.

The display device may further include a plurality of active patterns, at least one insulating film disposed on the plurality of active patterns, and an exposure hole formed through the at least one insulating layer to expose any one of the plurality of active patterns.

The display device may further include a dummy pattern disposed on the active pattern in the exposure hole.

The dummy pattern may be disposed to be spaced apart from a sidewall of the at least one insulating film in the exposure hole.

The active pattern may be disposed between the hole and the sub-pixels.

The active pattern may be disposed in a non-display area around the display area.

Second sub-bypass lines and third sub-bypass lines of some of the plurality of bypass lines may be disposed in the display area. Second sub-bypass lines and third sub-bypass lines of the rest of the plurality of bypass lines may be disposed in the non-display area. The active pattern may be disposed between a second sub-bypass line and a third sub-bypass line adjacent to each other among the second sub-bypass lines and the third sub-bypass lines of the rest of the plurality of bypass lines.

According to an embodiment of the present disclosure, a display device includes a plurality of first data lines extending in a second direction crossing a first direction, a plurality of second data lines extending in the second direction, a plurality of bypass lines connecting the first data lines and the second data lines, respectively, a plurality of first horizontal power supply lines which extend in the first direction and to which a first source voltage is applied, and a plurality of vertical power supply lines which extend in the second direction and to which a second source voltage is applied. Each of the plurality of bypass lines includes a first sub-bypass line extending in the first direction and connected to any one of the plurality of first data lines, a second sub-bypass line extending in the second direction and connected to the first sub-bypass line, and a third sub-bypass line extending in the first direction and connecting the second sub-bypass line and any one of the plurality of second data lines. A first spacing portion disposed between a second sub-bypass line of a first bypass line of the plurality of bypass lines and any one of the vertical power supply lines overlaps any one of the plurality of first horizontal power supply lines.

A second spacing portion disposed between a second sub-bypass line of a second bypass line of the plurality of bypass lines and another of the vertical power supply lines may not overlap the plurality of first horizontal power supply lines.

The display device may further include a plurality of second horizontal power supply lines which extend in the first direction and to which a second source voltage higher than the first source voltage is applied. The vertical power supply line may be connected to any one of the plurality of second horizontal power supply lines.

According to an embodiment of the present disclosure, a display device includes a plurality of first data lines extending in a second direction crossing a first direction, a plurality of second data lines extending in the second direction, a plurality of bypass lines connecting the first data lines and the second data lines, respectively, a plurality of horizontal power supply lines which extend in the first direction and to which a first source voltage is applied, and a plurality of vertical power supply lines which extend in the second direction and to which a second source voltage is applied. Each of the plurality of bypass lines includes a first sub-bypass line extending in the first direction and connected to any one of the plurality of first data lines, a second sub-bypass line extending in the second direction and connected to the first sub-bypass line, and a third sub-bypass line extending in the first direction and connecting the second sub-bypass line and any one of the plurality of second data lines. A first spacing portion disposed between a second sub-bypass line of a first bypass line of the plurality of bypass lines and any one of the vertical power supply lines does not overlap the plurality of horizontal power supply lines.

A second spacing portion disposed between a second sub-bypass line of a second bypass line of the plurality of bypass lines and another of the vertical power supply lines may overlap any one of the plurality of horizontal power supply lines.

According to an embodiment of the disclosure, a plurality of data lines disposed on one side of a hole are connected to a plurality of data lines disposed on the other side of the hole through a plurality of bypass lines. Therefore, a bypass line portion disposed adjacent to the hole and bypassing the hole may be omitted, and thus, a distance between the hole and an area in which sub-pixels are disposed may be minimized. Accordingly, it is possible to suppress an area between the hole and the sub-pixels from being recognized by a user as a non-display area.

According to an embodiment of the disclosure, a spacing portion disposed between a second sub-bypass line of a bypass line and a vertical power supply line is disposed to overlap a horizontal power supply line or is disposed not to overlap the horizontal power supply line, such that it is possible to prevent a pattern due to a step of a pixel electrode from being visually recognized by the user.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the inventive concept will become more apparent by describing in detail embodiments thereof with reference to the accompanying drawings, in which:

FIG. 28 is a cross-sectional view illustrating an example of the display panel taken along line C-C' of FIGS. 26 and 27;

DETAILED DESCRIPTION OF THE EMBODIMENTS

Figure 1:
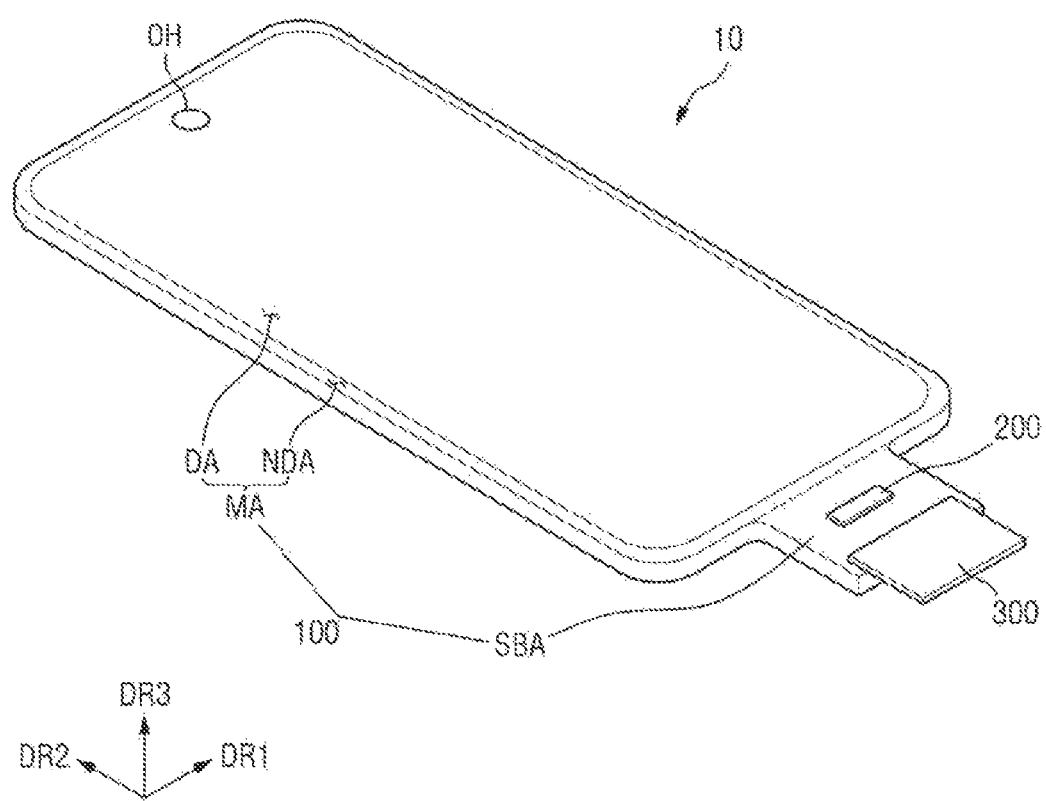
FIG. 1 is a perspective view illustrating a display device according to an exemplary embodiment.

Embodiments of the present disclosure address a problem in which any of a plurality of touch lines overlapping data fan-out line or scan fan-out line produce a parasitic capacitance between the touch line and the data fan-out line or between the touch line and the scan fan-out line. Due to the parasitic capacitance, a touch signal of the touch line may be affected by a data voltage of the data fan-out line or a scan control signal of the scan fan-out line, and thus, a touch sensing error may occur.

Embodiments of the present disclosure provide a display device capable of preventing a touch signal of a touch line from being affected by a data voltage of a data fan-out line or a scan control signal of a scan fan-out line.

The inventive concept now will be described more fully hereinafter with reference to the accompanying drawings, in which various embodiments are shown. This inventive concept may, however, be embodied in many different forms, and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers or sections, these elements, components, regions, layers or sections should not be limited by these terms. These terms are only used to distinguish one element, component, region, layer or section from another element, component, region, layer or section.

Thus, "a first element," "component," "region," "layer" or "section" discussed below could be termed a second element, component, region, layer or section without departing from the teachings herein.

The terminology used herein is for the purpose of describing particular embodiments only and is not intended to be limiting.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

As used herein, the terms "comprises," "comprising," "includes," and "including" mean the presence of stated features, regions, integers, steps, operations, elements, or components, but do not preclude the presence or addition of one or more other features, regions, integers, steps, operations, elements, components, or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the inventive concept present disclosure will be described in detail with reference to the accompanying drawings.

FIG. 1 is a perspective view illustrating a display device according to an exemplary embodiment.

Referring to FIG. 1, a display device 10 is a device that displays a moving image or a still image, and may be used as a display screen of each of various products such as televisions, laptop computers, monitors, billboards, and Internet of Things (JOT) devices as well as portable electronic devices such as mobile phones, smartphones, tablet personal computers (PCs), smart watches, watch phones, mobile communication terminals, electronic notebooks, electronic books, portable multimedia players (PMPs), navigation devices, and ultra mobile PCs (UMPCs).

The display device 10 may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro or nano light emitting diode (micro LED or nano LED). Hereinafter, it will be mainly described that the display device 10 is the organic light emitting display device, but the present disclosure is not limited thereto.

The display device 10 includes a display panel 100, a display driving circuit 200, and a circuit board 300.

The display panel 100 may be formed in a rectangular shape in a plan view and may have short sides in a first direction DR1 and long sides in a second direction DR2 crossing the first direction DR1. A corner where the short side in the first direction DR1 and the long side in the second direction DR2 meet may be rounded with a predetermined curvature or may be right-angled. The shape of the display panel 100 in a plan view is not limited to the rectangular shape, and may be a polygonal shape, a circular shape, or an elliptical shape. The display panel 100 may be formed to be flat, but the shape of the display panel 100 is not limited thereto. For example, the display panel 100 may include curved surface parts formed at left and right ends thereof and having a constant curvature or a variable curvature. In addition, the display panel 100 may be bent, folded, or rolled.

A substrate SUB of the display panel 100 may include a main area MA and a sub-area SBA. The main area MA may include a display area DA displaying an image and a non-display area NDA which is a peripheral area of the display area DA. The display area DA may include sub-pixels SPX (see FIG. 5) displaying the image. The display area DA may include a hole OH that may transmit light therethrough. The hole OH may be a physical hole formed through the display panel 100. Alternatively, the hole OH and may be an optical hole that does not formed through the display panel 100 and may transmit light therethrough.

The sub-area SBA may protrude from one side of the main area MA in the second direction DR2. It has been illustrated in FIG. 1 that the sub-area SBA is unbent, but the sub-area SBA may be bent, and in this case, the sub-area SBA may be disposed on a rear surface of the display panel 100. When the sub-area SBA is bent, the sub-area SBA may overlap the main area MA in a thickness direction DR3 of the substrate SUB. The display driving circuit 200 may be disposed in the sub-area SBA.

The display driving circuit 200 may generate signals and voltages for driving the display panel 100. The display driving circuit 200 may be formed as an integrated circuit (IC) and be attached onto the display panel 100 in a chip on glass (COG) manner, a chip on plastic (COP) manner, or an ultrasonic bonding manner, but the configuration of the display driving circuit 200 is not limited thereto. For example, the display driving circuit 200 may be attached onto the circuit board 300 in a chip on film (COF) manner.

The circuit board 300 may be attached to one end of the sub-area SBA of the display panel 100. Therefore, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip on film.

Figure 2:
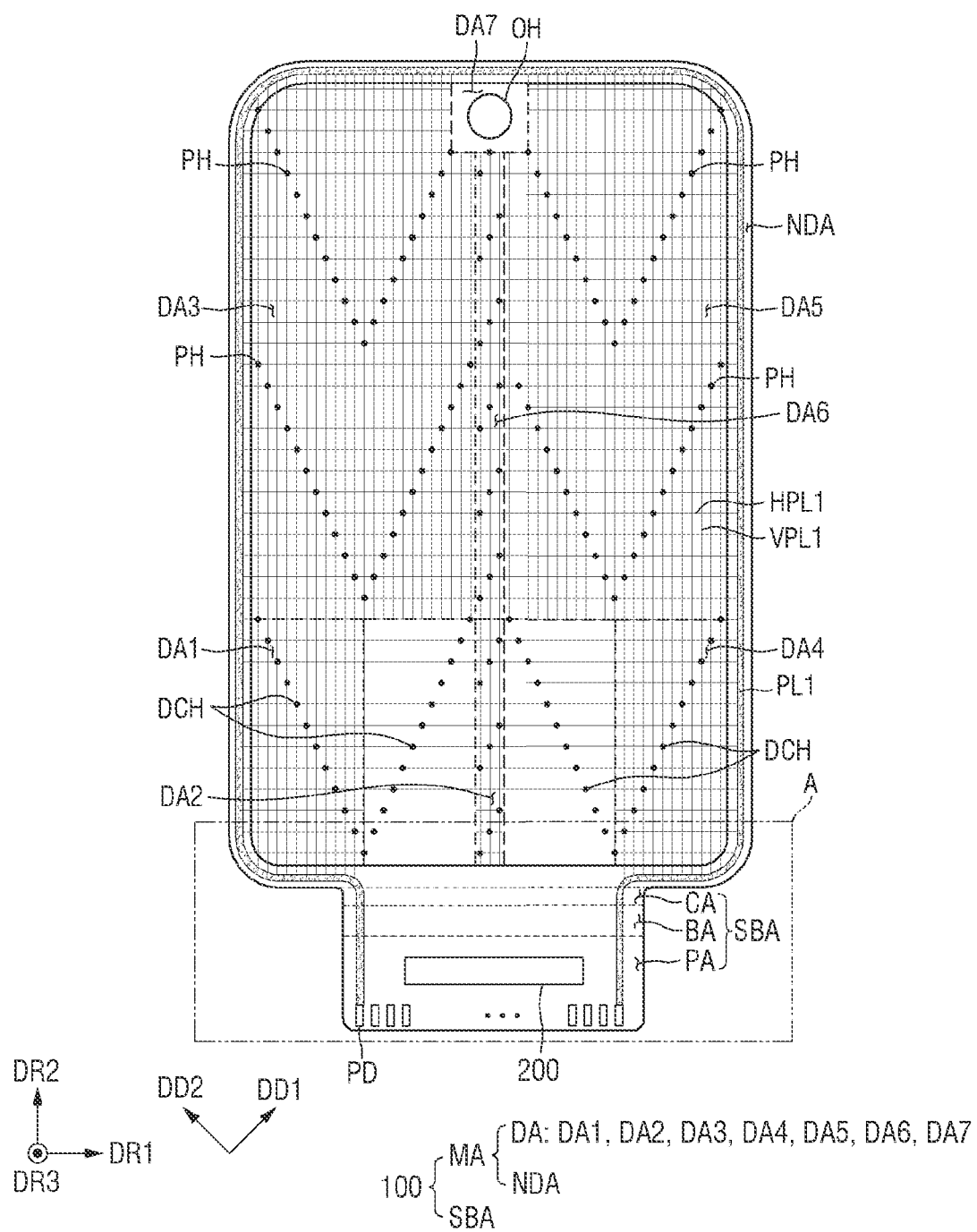
FIG. 2 is a layout diagram illustrating the display device according to an exemplary embodiment.
Figure 3:
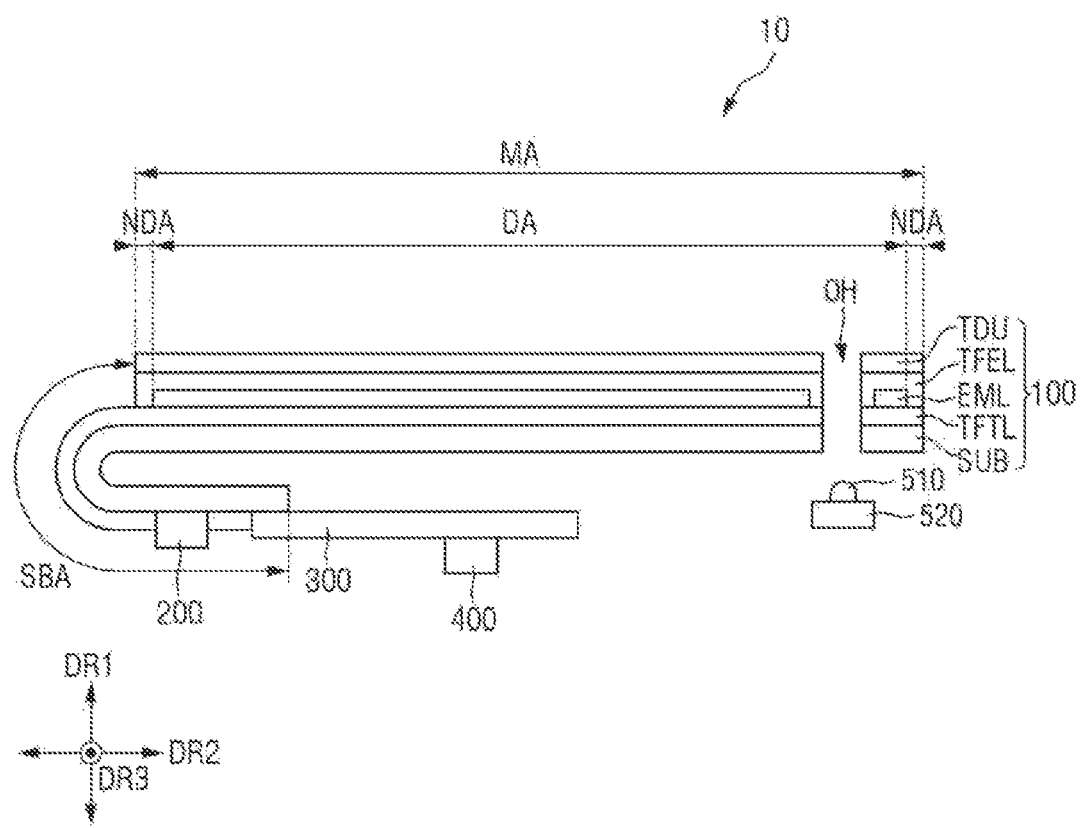
FIG. 3 is a side view illustrating the display device according to an exemplary embodiment.

FIG. 2 is a layout diagram illustrating the display device according to an exemplary embodiment. FIG. 3 is a side view illustrating the display device according to an exemplary embodiment.

FIG. 2 illustrate a display device when the sub-area SBA is not bent. FIG. 3 illustrate a display device when the sub-area SBA is bent toward the rear surface of the display device 10.

Referring to FIGS. 2 and 3, the display panel 100 may include the main area MA and the sub-area SBA.

The main area MA may include the display area DA displaying an image and the non-display area NDA which is the peripheral area of the display area DA. The display area DA may occupy most of the main area MA. The display area DA may be disposed at a center of the main area MA.

The display area DA may include first to seventh display areas DA1, DA2, DA3, DA4, DA5, DA6, and DA7.

Each of the first display area DA1 and the fourth display area DA4 is an area in which first data lines connected to data fan-out lines through data connection lines are disposed. The second display area DA2 may be an area in which second data lines directly connected to the data fan-out lines are disposed. The third display area DA3, the fifth display area DA5, and the sixth display area DA6 may be areas in which power holes PH to which first horizontal power supply lines HPL1 extending in the first direction DR1 and first vertical power supply lines VPL1 are connected are disposed. The seventh display area DA7 may be an area in which the hole OH is disposed.

The first display area DA1 and the third display area DA3 may be disposed on the left side of the display area DA, and the fourth display area DA4 and the fifth display area DA5 may be disposed on the right side of the display area DA. The first display area DA1 may be disposed below the third display area DA3, and the fourth display area DA4 may be disposed below the fifth display area DA5. The second display area DA2 may be disposed between the first display area DA1 and the fourth display area DA4. The sixth display area DA6 and the seventh display area DA7 may be disposed between the third display area DA3 and the fifth display area DA5. The sixth display area DA6 may be disposed between the second display area DA2 and the seventh display area DA7.

A length of the first display area DA1 in the first direction DR1 may be substantially the same as a length of the third display area DA3 in the first direction DR1. In addition, a length of the first display area DA1 in the second direction DR2 may be smaller than a length of the third display area DA3 in the second direction DR2.

The length of the first display area DA1 in the first direction DR1 may be greater than a length of the second display area DA2 in the first direction DR1. The length of the first display area DA1 in the second direction DR2 may be substantially the same as a length of the second display area DA2 in the second direction DR2.

The length of the third display area DA3 in the first direction DR1 may be greater than a length of the sixth display area DA6 in the first direction DR1. The length of the third display area DA3 in the second direction DR2 may be greater than a length of the sixth display area DA6 in the second direction DR2.

A length of the fourth display area DA4 in the first direction DR1 may be substantially the same as a length of the fifth display area DA5 in the first direction DR1. In addition, a length of the fourth display area DA4 in the second direction DR2 may be smaller than a length of the fifth display area DA5 in the second direction DR2.

The length of the fourth display area DA4 in the first direction DR1 may be greater than the length of the second display area DA2 in the first direction DR1. The length of the fourth display area DA4 in the second direction DR2 may be substantially the same as the length of the second display area DA2 in the second direction DR2.

The length of the fifth display area DA5 in the first direction DR1 may be greater than the length of the sixth display area DA6 in the first direction DR1. The length of the fifth display area DA5 in the second direction DR2 may be greater than the length of the sixth display area DA6 in the second direction DR2.

The length of the first display area DA1 in the first direction DR1 may be substantially the same as the length of the fourth display area DA4 in the first direction DR1. In addition, the length of the first display area DA1 in the second direction DR2 may be substantially the same as the length of the fourth display area DA4 in the second direction DR2.

The length of the second display area DA2 in the first direction DR1 may be substantially the same as the length of the sixth display area DA6 in the first direction DR1. In addition, the length of the second display area DA2 in the second direction DR2 may be smaller than the length of the sixth display area DA6 in the second direction DR2.

The length of the third display area DA3 in the first direction DR1 may be substantially the same as the length of the fifth display area DA5 in the first direction DR1. In addition, the length of the third display area DA3 in the second direction DR2 may be substantially the same as the length of the fifth display area DA5 in the second direction DR2.

A length of the seventh display area DA7 in the first direction DR1 may be greater than the length of the sixth display area DA6 in the first direction DR1. A length of the seventh display area DA7 in the second direction DR2 may be smaller than the length of the sixth display area DA6 in the second direction DR2.

For example, when the display area DA includes 1080× 2340 pixels, 484 pixels may be arranged in the first direction DR1 in each of the first display area DA1 and the third display area DA3, 112 pixels may be arranged in the first direction DR1 in each of the second display area DA2 and the sixth display area DA6, and 484 pixels may be arranged in the first direction DR1 in each of the fourth display area DA4 and the fifth display area DA5.

In the display area DA, the first horizontal power supply lines HPL1 and the first vertical power supply lines VPL1 connected to a first power supply line PL1 may be disposed in a mesh shape.

The first power supply line PL1 may be connected to pads PD in the sub-area SBA, and may receive a first source voltage. The first power supply line PL1 may be disposed on the left side, the upper side, and the right side of the display area DA.

The first horizontal power supply lines HPL1 may extend in the first direction DR1 and may be arranged in the second direction DR2. The first horizontal power supply lines HPL1 may be connected to the first power supply line PL1 on the left side and the right side of the display area DA.

The first vertical power supply lines VPL1 may extend in the second direction DR2 and may be arranged in the first direction DR1. The first vertical power supply lines VPL1 may be connected to the first power supply line PL1 on the upper side and the lower side of the display area DA.

The power hole PH may be disposed in each of some of intersection portions between the first horizontal power supply lines HPL1 and the first vertical power supply lines VPL1. The power hole PH may be a contact hole for connecting the first horizontal power supply line HPL1 and the vertical power supply line VPL. The power holes PH may be arranged in a "\/" shape in each of the third display area DA3 and the fifth display area DA5, but an exemplary embodiment of the present disclosure is not limited thereto. For example, the power holes PH may be repeatedly arranged in a "/\" shape or may be arranged in a pattern other than the "\/" shape and the "/\" shape.

The power holes PH may be arranged in a first diagonal direction DD1 between the first direction DR1 and the second direction DR2 in the second display area DA2 and the sixth display area DA6. The first diagonal direction DD1 may be a direction inclined by +45° from the first direction DR1, and may be a direction inclined by −45° from the second direction DR2. Alternatively, the power holes PH may be arranged in a second diagonal direction DD2 orthogonal to the first diagonal direction DD1 in the second display area DA2 and the sixth display area DA6.

In each of the first display area DA1 and the third display area DA3, first connection holes DCH1 (see FIG. 4) through which first data connection lines DCL1 (see FIG. 4) and second data connection lines DCL2 (see FIG. 4) are connected and second connection holes DCH2 (see FIG. 4) through which first data lines DL1 (see FIG. 4) and the second data connection lines DCL2 (see FIG. 4) are connected may be arranged in a "\/" shape. Alternatively, the first connection holes DCH1 (see FIG. 4) and the second connection holes DCH2 (see FIG. 4) may be repeatedly arranged in a "/\" shape or may be arranged in a pattern other than the "\/" shape and the "/\" shape.

The first display area DA1 will be described later in detail with reference to FIG. 7, the second display area DA2 will be described later in detail with reference to FIG. 17, and the third display area DA3 will be described later in detail with reference to FIG. 18. The fourth display area DA4 will be described later in detail with reference to FIG. 19, the fifth display area DA5 will be described later in detail with reference to FIG. 20, and the sixth display area DA6 will be described later in detail with reference to FIG. 21.

The non-display area NDA may be disposed adjacent to the display area DA. The non-display area NDA may be an area outside the display area DA. The non-display area NDA may be disposed to surround the display area DA. The non-display area NDA may be an edge area of the display panel 100.

The sub-area SBA may protrude from one side of the main area MA in the second direction DR2. A length of the sub-area SBA in the second direction DR2 may be smaller than the length of the main area MA in the second direction DR2. A length of the sub-area SBA in the first direction DR1 may be smaller than or substantially the same as a length of the main area MA in the first direction DR1. The sub-area SBA may be bent and be disposed below the display panel 100. In this case, the sub-area SBA may overlap the main area MA in a third direction DR3.

The sub-area SBA may include a connection area CA, a pad area PA, and a bending area BA.

The connection area CA is an area protruding from one side of the main area MA in the second direction DR2. The connection area CA may be disposed between the non-display area NDA of the main area MA and the bending area BA in the second direction DR2.

The pad area PA is an area in which the pads DP and the display driving circuit 200 are disposed. The display driving circuit 200 may be attached to driving pads of the pad area PA using a conductive adhesive member such as an anisotropic conductive film. The circuit board 300 may be attached to the pads PD of the pad area PA using a conductive adhesive member such as an anisotropic conductive film.

The bending area BA is an area that is bent. When the bending area BA is bent, the pad area PA may be disposed below the connection area CA and below the main area MA. The bending area BA may be disposed between the connection area CA and the pad area PA in the second direction DR2.

The display panel 100 may include a substrate SUB, a thin film transistor layer TFTL, a light emitting element layer EML, an encapsulation layer TFEL, and a touch sensing layer TDU, as illustrated in FIG. 3.

The substrate SUB may be made of an insulating material such as a polymer resin. For example, the substrate SUB may be made of polyimide. The substrate SUB may be a flexible substrate that may be bent, folded, and rolled.

The thin film transistor layer TFTL may be disposed on the substrate SUB. The thin film transistor layer TFTL may be disposed in the main area MA and the sub-area SBA. The thin film transistor layer TFTL includes thin film transistors.

The light emitting element layer EML may be disposed on the thin film transistor layer TFTL. The light emitting element layer EML may be disposed in the display area DA of the main area MA. The light emitting element layer EML includes light emitting elements disposed in light emitting areas.

The encapsulation layer TFEL may be disposed on the light emitting element layer EML. The encapsulation layer TFEL may be disposed in the display area DA and the non-display area NDA of the main area MA. The encapsulation layer TFEL includes at least one inorganic film and at least one organic film for encapsulating the light emitting element layer.

The touch sensing layer TDU may be disposed on the encapsulation layer TFEL. The touch sensing layer TDU may be disposed in the display area DA and the non-display area NDA of the main area MA. The touch sensing layer TDU may sense a touch of a person or an object using touch electrodes.

A cover window for protecting an upper portion of the display panel 100 may be disposed on the touch sensing layer TDU. The cover window may be attached onto the touch sensing layer TDU by a transparent adhesive member such as an optically clear adhesive (OCA) film or an optically clear resin (OCR). The cover window may be made of an inorganic material such as glass or be made of an organic material such as plastic or a polymer material.

In addition, an anti-reflection layer may be additionally disposed between the touch sensing layer TDU and the cover window in order to prevent a decrease in visibility of an image displayed by the display panel 100 due to reflection of external light from the display panel 100. The anti-reflection layer may be a polarizing film. Alternatively, the anti-reflection layer may include a light blocking organic film such as a black matrix and a color filter or may include a light blocking organic film such as a black matrix and an anti-reflection organic film.

A touch driving circuit 400 may be disposed on the circuit board 300. The touch driving circuit 400 may be formed as an integrated circuit (IC) and attached to the circuit board 300.

The touch driving circuit 400 may be electrically connected to a plurality of driving electrodes and a plurality of sensing electrodes of the touch sensing layer TDU. The touch driving circuit 400 applies touch driving signals to the plurality of driving electrodes, and senses a touch sensing signal, for example, a charge change amount of mutual capacitance, of each of a plurality of touch nodes through the plurality of sensing electrodes. The touch driving circuit 400 may determine whether or not a user has performed a touch, whether or not the user has approached the display device, and the like, according to the touch sensing signal of each of the plurality of touch nodes. The touch of the user indicates that a user's finger or an object such as a pen comes into direct contact with a front surface of the display device 10 disposed on the touch sensing layer TDU. The approach of the user indicates that the user's finger or the object such as the pen is positioned in front of the front surface of the display device 10 without contacting the front surface of the display device 10, such as hovering.

The hole OH may formed through the substrate SUB, the thin film transistor layer TFTL, the encapsulation layer TFEL, and the touch sensing layer TDU. The hole OH may overlap an optical device 510 in the third direction DR3. The optical device 510 may be an optical sensor sensing light incident through the hole OH, such as a proximity sensor, an illuminance sensor, and a camera sensor. The optical device 510 may be disposed on an optical circuit board 520. The optical circuit board 520 may be a flexible printed circuit board, a printed circuit board, or a flexible film such as a chip on film.

Figure 4:
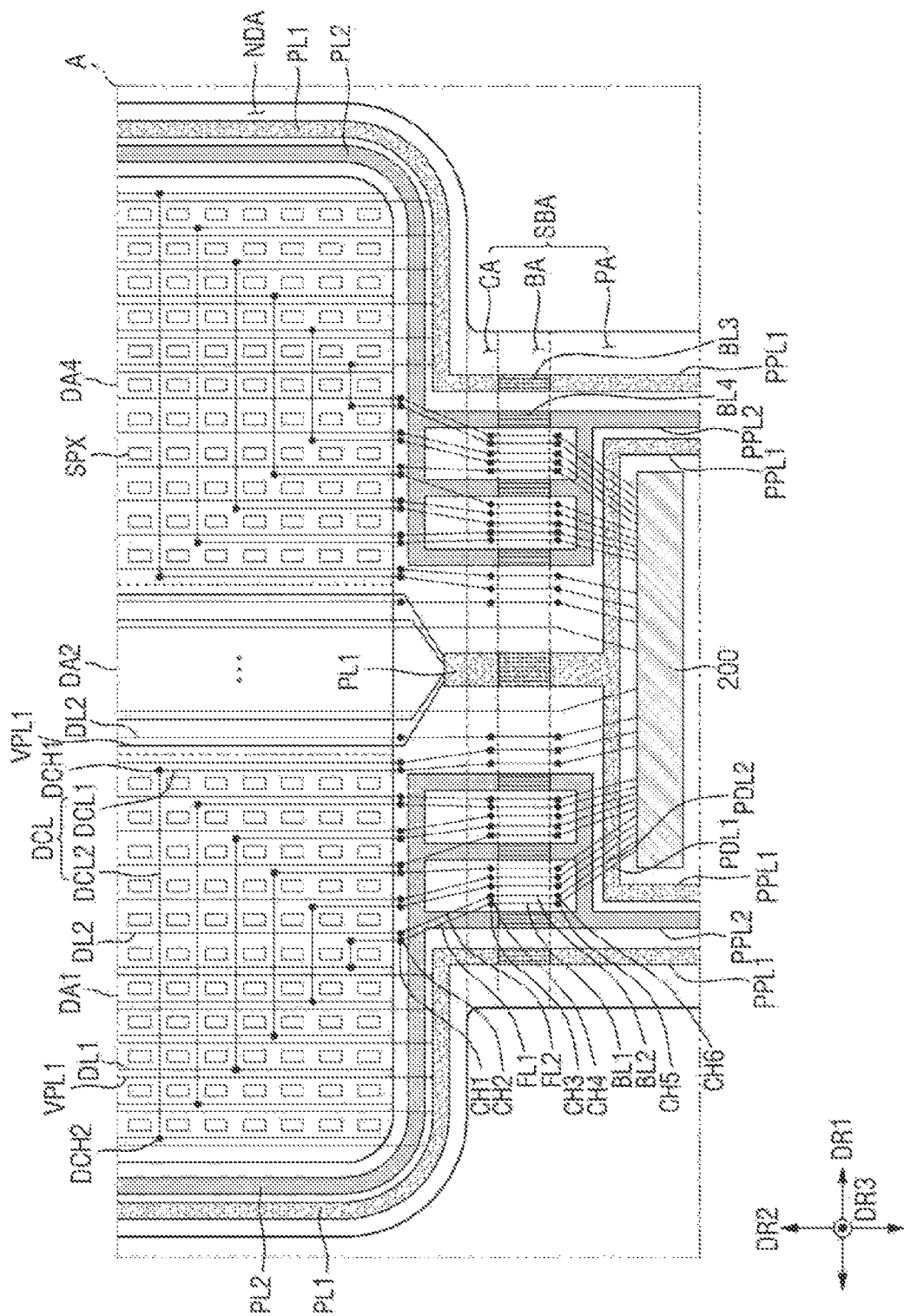
FIG. 4 is a layout diagram illustrating area A of FIG. 2 in detail.

FIG. 4 is a layout diagram illustrating area A of FIG. 2 in detail. In FIG. 4, the first display area DA1, the second display area DA2, the fourth display area DA4, the non-display area NDA, and the sub-area SBA are illustrated in detail.

Referring to FIG. 4, a plurality of first data lines DL1, a plurality of second data lines DL2, a plurality of data connection lines DCL, and a plurality of first vertical power supply lines VPL1 may be disposed in the first display area DA1.

The plurality of first data lines DL1 may extend in the second direction DR2 and may be arranged in the first direction DR1. The plurality of second data lines DL2 may extend in the second direction DR2 and may be arranged in the first direction DR1. The plurality of data connection lines DCL may include first data connection lines DCL1 and second data connection lines DCL2. The plurality of first vertical power supply lines VPL1 may extend in the second direction DR2 and may be arranged in the first direction DR1.

The first data connection lines DCL1 may extend in the second direction DR2 and may be connected to first fan-out lines FL1 through first connection holes CH1. The second data connection lines DCL2 may extend in the first direction DR1 and may be connected to the first data connection lines DCL1 through first data connection holes DCH1.

The plurality of first data lines DL1 may be connected to the second data connection lines DCL2 through second data connection holes DCH2, respectively. The plurality of second data lines DL2 may be connected to second fan-out lines FL2 through second connection holes CH2, respectively. Each of the plurality of first vertical power supply lines VPL1 may be connected to the first power supply line PL1.

A plurality of second data lines DL2 and a plurality of first vertical power supply lines VPL1 may be disposed in the second display area DA2.

The first fan-out lines FL1, the second fan-out lines FL2, first power supply lines PL1, and second power supply lines PL2 may be disposed in the non-display area NDA. The first fan-out lines FL1 may be connected to the first data connection lines DCL1 through the first connection holes CH1, respectively. The second fan-out lines FL2 may be connected to the second data lines DL2 through the second connection holes CH2, respectively.

A first power supply line PL1 disposed at the center among the first power supply lines PL1 may be connected to the plurality of first vertical power supply lines VPL1. First power supply lines PL1 disposed on the left side and the right side among the first power supply lines PL1 may be disposed to surround the second power supply lines PL2. The second power supply lines PL2 may be disposed to surround the display area DA. A first source voltage may be applied to each of the first power supply lines PL1 and a second source voltage higher than the first source voltage may be applied to each of the second power supply lines PL2.

First bending lines BL1, second bending lines BL2, third bending lines BL3, and fourth bending lines BL4 may be disposed in the bending area BA. The first bending lines BL1 may be connected to the first fan-out lines FL1 through third connection holes CH3, respectively. The second bending lines BL2 may be connected to the second fan-out line FL2 through fourth connection holes CH4, respectively. Each of the third bending lines BL3 may be connected to the first power supply line PL1 and each of the fourth bending lines BL4 may be connected to the second power supply line PL2.

First pad lines PDL1, second pad lines PDL2, first power pad lines PPL1, and second power pad lines PPL2 may be disposed in the pad area PA. The first pad lines PDL1 may be connected to the first bending lines BL1 through fifth connection holes CH5, respectively. The second pad lines PDL2 may be connected to the second bending lines BL2 through sixth connection holes CH6, respectively. The first power pad lines PPL1 may be connected to the third bending lines BL3 and the second power pad lines PPL2 may be connected to the fourth bending lines BL4.

The first pad lines PDL1 and the second pad lines PDL2 may be electrically connected to the display driving circuit 200. The first power pad lines PPL1 and the second power pad lines PPL2 may be directly connected to the pads PD. The display driving circuit 200 may be connected to the pads PD through third pad lines PDL3.

As illustrated in FIG. 4, the plurality of first data lines DL1 disposed on the left side and the right side of the display panel 100 are connected to the first fan-out lines FL1 through the data connection lines DCL. Accordingly, areas occupied by the first fan-out lines FL1 and the second fan-out lines FL2 in the non-display area NDA on the lower side of the display panel 100 is significantly reduced. Therefore, even though an area of the non-display area NDA on the lower side of the display panel 100 is decreased, a space in which the fan-out lines FL1 and FL2 are disposed may not be insufficient.

Figure 5:
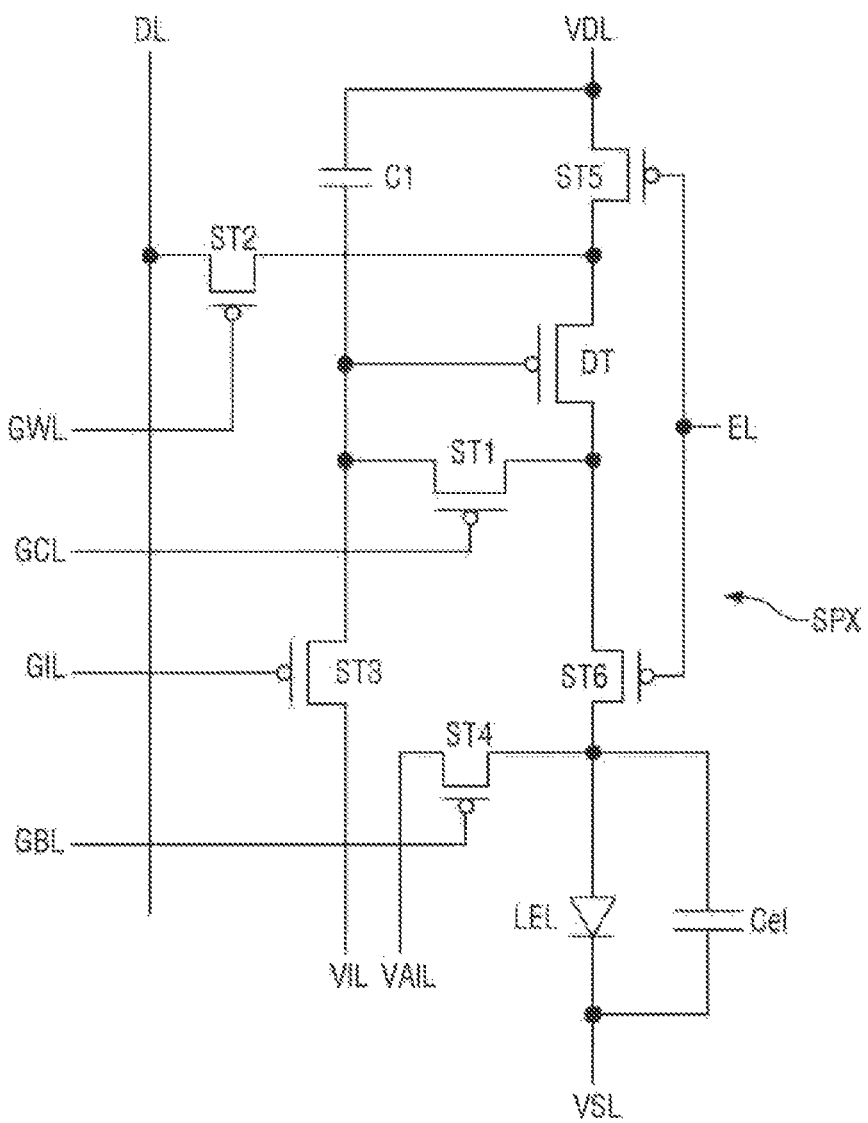
FIG. 5 is a circuit diagram illustrating a sub-pixel according to an exemplary embodiment.

FIG. 5 is a circuit diagram illustrating a sub-pixel according to an exemplary embodiment.

Referring to FIG. 5, a sub-pixel SPX may be connected to at least one of scan lines GWL, GIL, GBL and GCL, any one of emission lines EL, and any one of data lines. For example, the sub-pixel SPX may be connected to a write scan line GWL, an initialization scan line GIL, a control scan line GCL, a bias scan line GBL, an emission line EL, and a data line DL.

The sub-pixel SPX includes a light emitting element LEL and a pixel driving circuit PDU. The pixel driving circuit PDU includes a driving transistor DT, switch elements, and a capacitor C1. The switch elements include first to sixth transistors ST1, ST2, ST3, ST4, ST5, and ST6.

The driving transistor DT includes a gate electrode, a first electrode, and a second electrode. The driving transistor DT controls a drain-source current Ids (hereinafter, referred to as a "driving current") flowing between the first electrode and the second electrode according to a data voltage applied to the gate electrode.

The light emitting element LEL emits light according to the driving current Ids. An amount of light emitted from the light emitting element LEL may be proportional to the driving current Ids.

The light emitting element LEL may be an organic light emitting diode including an anode electrode, a cathode electrode, and an organic light emitting layer disposed between the anode electrode and the cathode electrode. Alternatively, the light emitting element LEL may be an inorganic light emitting element including an anode electrode, a cathode electrode, and an inorganic semiconductor disposed between the anode electrode and the cathode electrode. Alternatively, the light emitting element LEL may be a quantum dot light emitting element including an anode electrode, a cathode electrode, and a quantum dot light emitting layer disposed between the anode electrode and the cathode electrode. Alternatively, the light emitting element LEL may be a micro light emitting diode.

The anode electrode of the light emitting element LEL may be connected to a first electrode of the fourth transistor ST4 and a second electrode of the sixth transistor ST6, and the cathode electrode of the light emitting element LEL may be connected to a low potential line VSL. A parasitic capacitance Cel may be formed between the anode electrode and the cathode electrode of the light emitting element LEL.

The capacitor C1 is formed between a gate electrode of the driving transistor DT and a high potential line VDL. One electrode of the capacitor C1 may be connected to the gate electrode of the driving transistor DT, and the other electrode of the capacitor C1 may be connected to the high potential line VDL.

As illustrated in FIG. 5, all of the first to sixth transistors ST1, ST2, ST3, ST4, ST5, and ST6, and the driving transistor DT may be formed as P-channel metal oxide semiconductor field effect transistors (MOSFETs). An active layer of each of the first to sixth transistors ST1, ST2, ST3, ST4, ST5, and ST6 and the driving transistor DT may be formed of polysilicon or an oxide semiconductor.

A gate electrode of the second transistor ST2 may be connected to the write scan line GWL, and a gate electrode of the first transistor ST1 may be connected to the control scan line GCL. A gate electrode of the third transistor ST3 may be connected to the initialization scan line GIL, and a gate electrode of the fourth transistor ST4 may be connected to a bias scan line GBL. The first to sixth transistors ST1, ST2, ST3, ST4, ST5, and ST6 are formed as the P-channel MOSFETs, and may thus be turned on when a scan signal and an emission signal of a gate low voltage are applied to the control scan line GCL, the initialization scan line GIL, the write scan line GWL, the bias scan line GBL, and the emission line EL, respectively.

One electrode of the third transistor ST3 may be connected to a first initialization voltage line VIL, while one electrode of the fourth transistor ST4 may be connected to a second initialization voltage line VAIL. A first initialization voltage applied to the first initialization voltage line VIL and a second initialization voltage applied to the second initialization voltage line VAIL may be different voltages.

Figure 6:
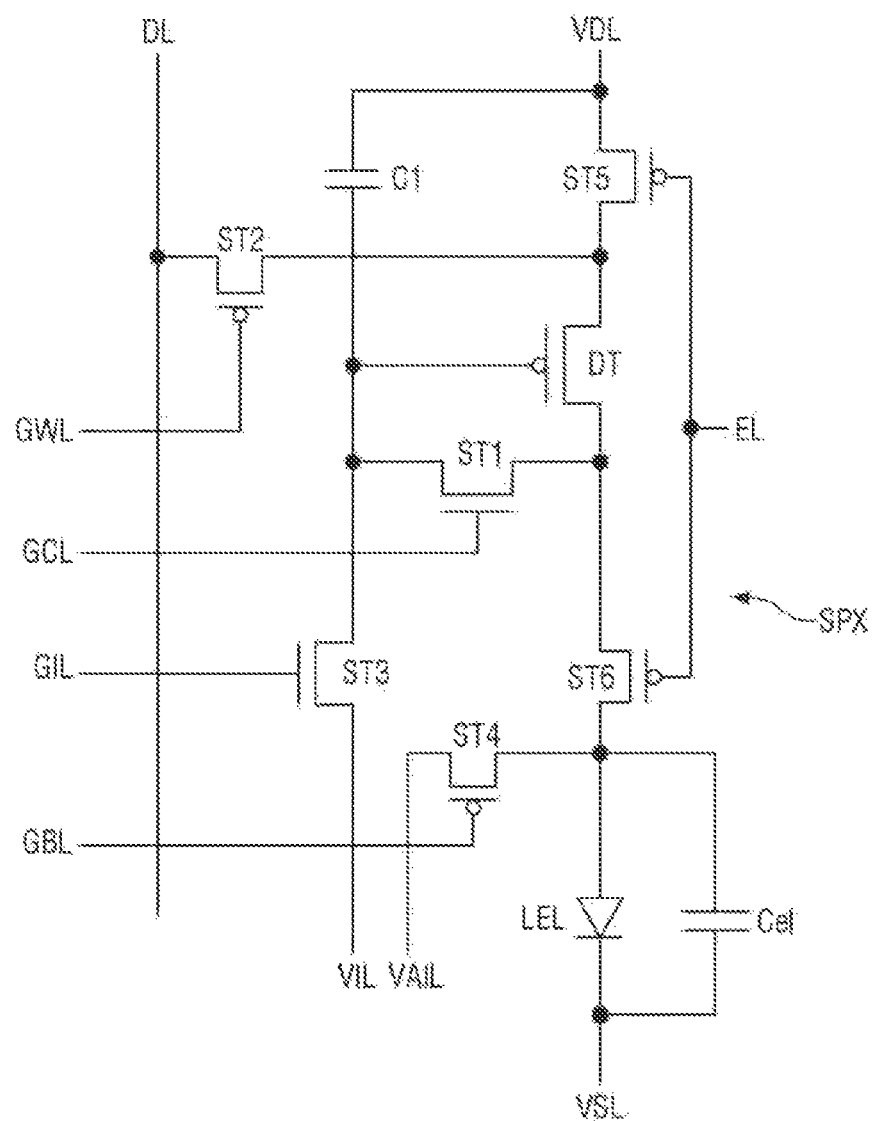
FIG. 6 is a circuit diagram illustrating a sub-pixel according to another exemplary embodiment.

Alternatively, as illustrated in FIG. 6, the driving transistor DT, the second transistor ST2, the fourth transistor ST4, the fifth transistor ST5, and the sixth transistor ST6 may be formed as P-channel MOSFETs, and the first The transistor ST1 and the third transistor ST3 may be formed as N-channel MOSFETs. An active layer of each of the driving transistor DT, the second transistor ST2, the fourth transistor ST4, the fifth transistor ST5, and the sixth transistor ST6 formed as the P-channel MOSFETs may be formed of polysilicon, and an active layer of each of the first transistor ST1 and the third transistor ST3 formed as the N-channel MOSFETs may be formed of an oxide semiconductor. In this case, the transistors formed of the polysilicon and the transistors formed of the oxide semiconductor may be disposed at different layers, and thus, an area in which the transistors are disposed in each of the pixels PX may be decreased.

Alternatively, in FIG. 6, the fourth transistor ST4 may be formed as an N-channel MOSFET. In this case, an active layer of the fourth transistors ST4 may be formed of an oxide semiconductor.

A gate electrode of the second transistor ST2 and a gate electrode of the fourth transistor ST4 may be connected to the write scan line GWL, and a gate electrode of the first transistor ST1 may be connected to the control scan line GCL. A gate electrode of the third transistor ST3 may be connected to the initialization scan line GIL. The first transistor ST1 and the third transistor ST3 are formed as the N-channel MOSFETs, and may thus be turned on when scan signals of a gate high voltage is applied to the control scan line GCL and the initialization scan line GIL. In contrast, the second transistor ST2, the fourth transistor ST4, the fifth transistor ST5, and the sixth transistor ST6 are formed as the P-channel MOSFETs, and may thus be turned on when a scan signal and an emission signal of a gate low voltage are applied to the write scan line GWL and the emission line EL, respectively.

Alternatively, although not illustrated in FIGS. 5 and 6, all of the first to sixth transistors ST1, ST2, ST3, ST4, ST5, and ST6, and the driving transistor DT may be formed as N-channel MOSFETs.

Figure 7:
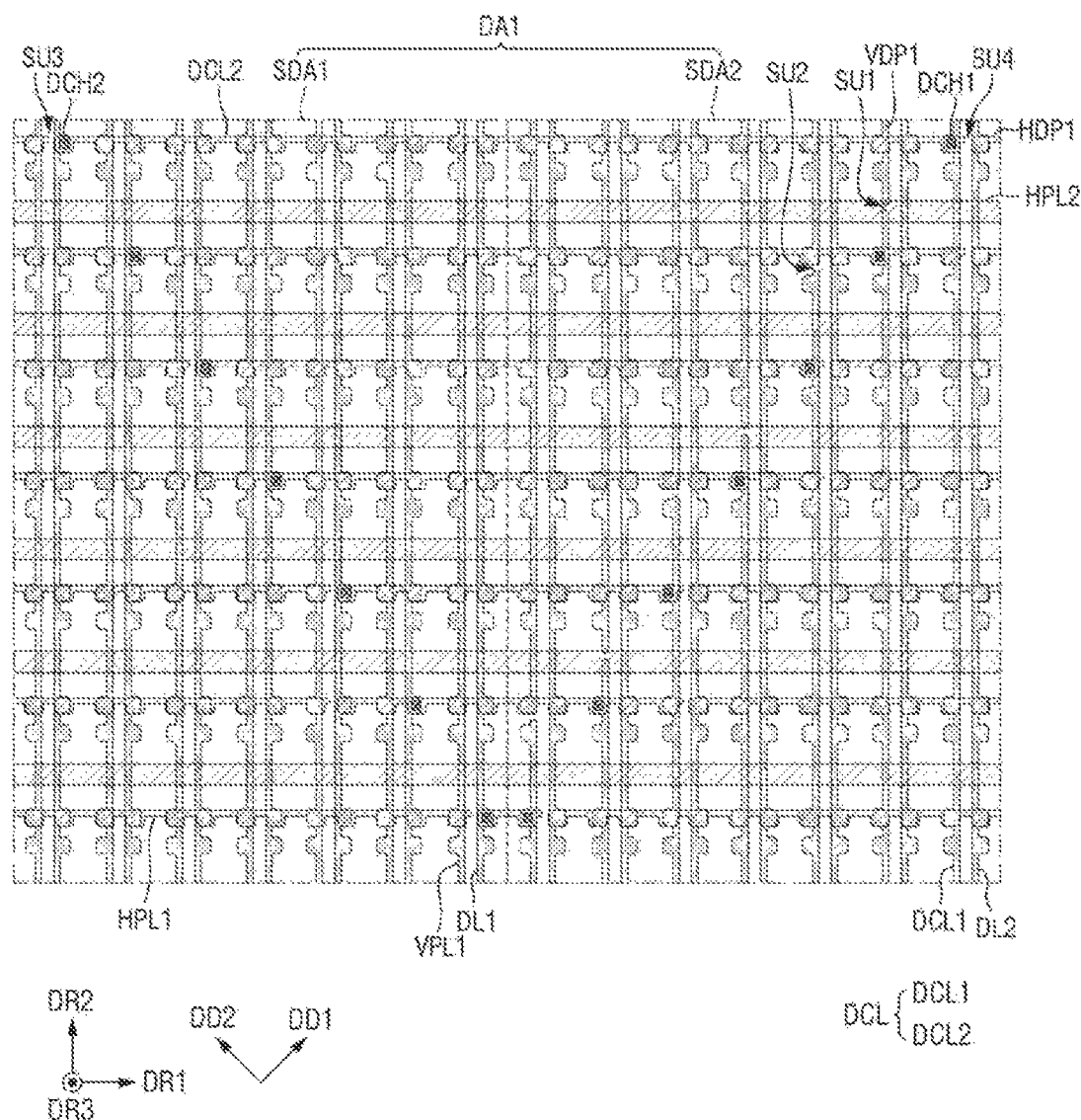
FIG. 7 is a layout diagram illustrating a portion of a first display area of FIG. 2.
Figure 8:
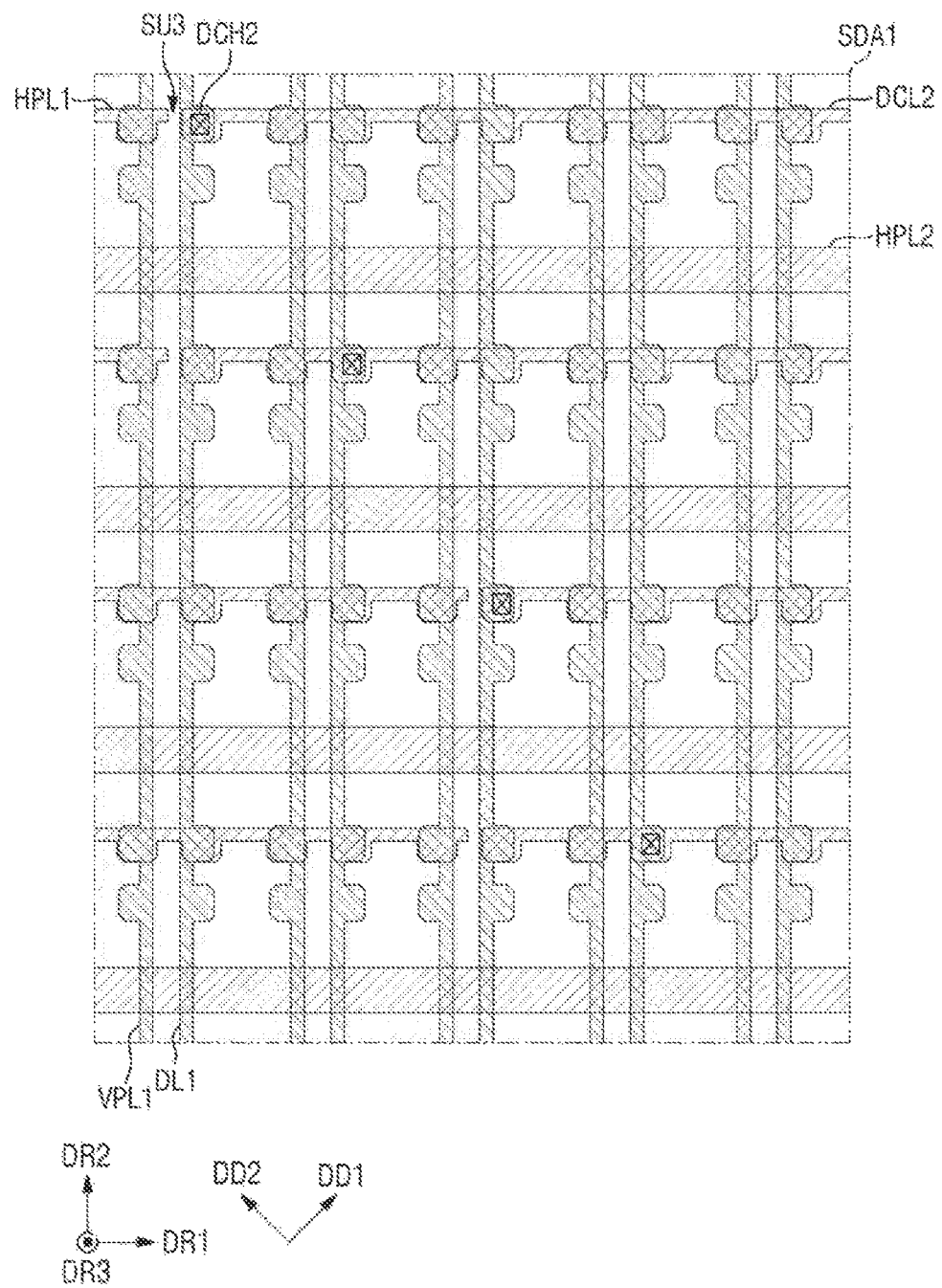
FIG. 8 is a layout diagram illustrating a portion of a first sub-display area of FIG. 7 in detail.
Figure 9:
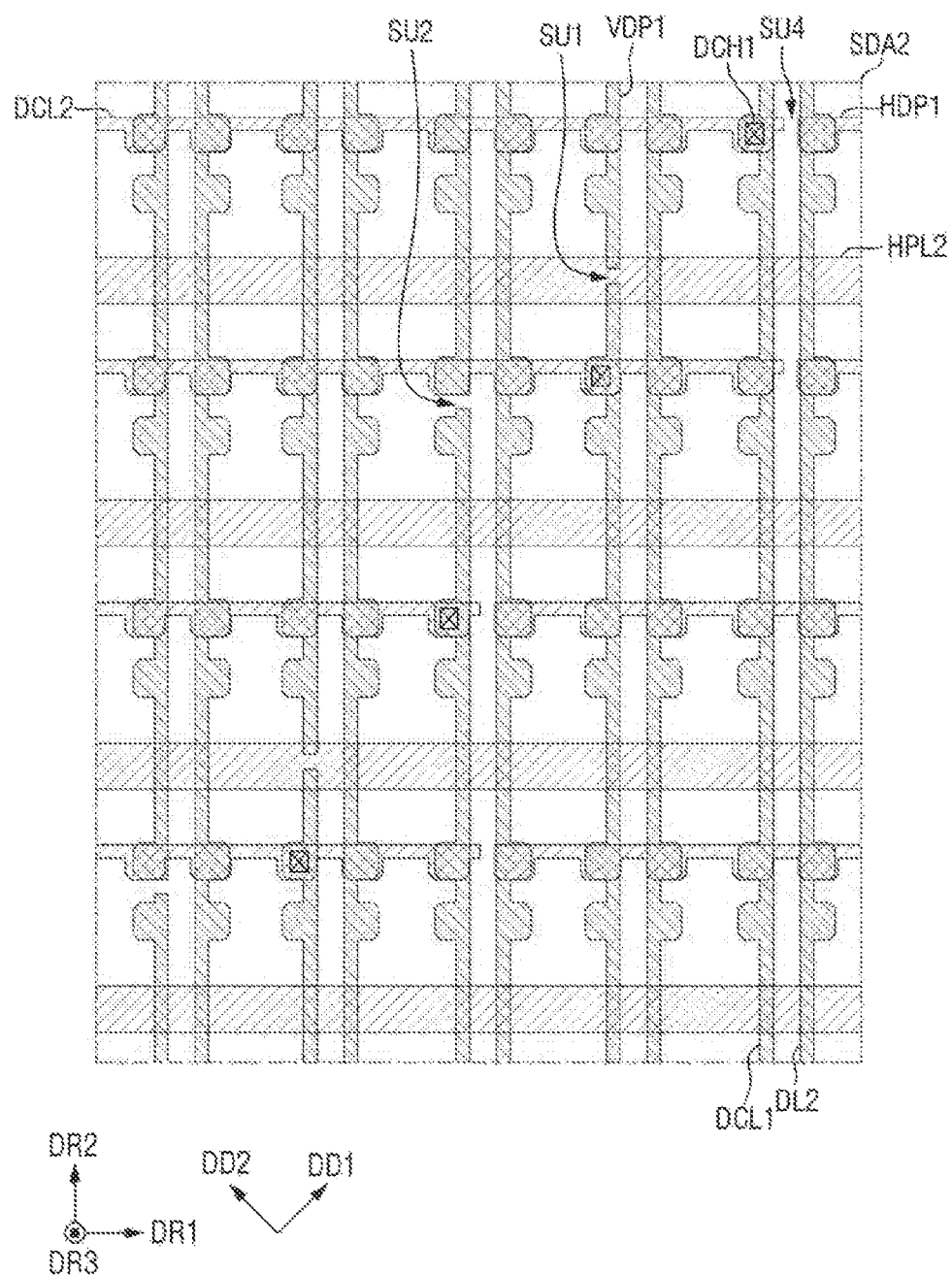
FIG. 9 is a layout diagram illustrating a portion of a second sub-display area of FIG. 7 in detail.

FIG. 7 is a layout diagram illustrating a portion of a first display area of FIG. 2. FIG. 8 is a layout diagram illustrating a portion of a first sub-display area of FIG. 7 in detail. FIG. 9 is a layout diagram illustrating a portion of a second sub-display area of FIG. 7 in detail.

Referring to FIGS. 7 to 9, the first display area DA1 includes a first sub-display area SDA1 and a second sub-display area SDA2. The first sub-display area SDA1 is an area in which the second data connection holes DCH2 through which the second data connection lines DCL2 and the first data lines DL1 are connected to each other, respectively, are disposed, and the second sub-display area SDA2 is an area in which the first data connection holes DCH1 through which the first data connection lines DCL1 and the second data connection lines DCL2 are connected to each other, respectively, are disposed.

The plurality of first data lines DL1 and the plurality of first vertical power supply lines VPL1 may be disposed in the first sub-display area SDA1, and the plurality of second data lines DL2, the first data connection lines DCL1, and a plurality of first vertical dummy patterns VDP1 may be disposed in the second sub-display area SDA2. In addition, the second data connection lines DCL2 and a plurality of first horizontal dummy patterns HDP1 may be disposed in the first sub-display area SDA1 and the second sub-display area SDA2.

In the first sub-display area SDA1, the plurality of first data lines DL1 and the plurality of first vertical power supply lines VPL1 may be alternately disposed in the first direction DR1. That is, the first vertical power supply line VPL1 may be disposed between the first data lines DL1 neighboring to each other in the first direction DR1, and the first data line DL1 may be disposed between the first vertical power supply lines VPL1 neighboring each other in the first direction DR1.

In the second sub-display area SDA2, the plurality of second data lines DL2 and the first data connection lines DCL1 may be alternately disposed in the first direction DR1. That is, the first data connection line DCL1 may be disposed between the second data lines DL2 neighboring to each other in the first direction DR1, and the second data line DL2 may be disposed between the first data connection lines DCL1 neighboring each other in the first direction DR1.

In addition, in the second sub-display area SDA2, the plurality of second data lines DL2 and the plurality of first vertical dummy patterns VDP1 may be alternately disposed in the first direction DR1. That is, the first vertical dummy pattern VDP1 may be disposed between the second data lines DL2 neighboring to each other in the first direction DR1, and the second data line DL2 may be disposed between the first vertical dummy patterns VDP1 neighboring each other in the first direction DR1.

Each of the first data lines DL1, the first vertical power supply lines VPL1, the second data lines DL2, and the first data connection lines DCL1 may include first line portions having a first width and second line portions having a second width greater than the first width. The first line portions and the second line portions may be alternately disposed in the second direction DR2. Some of the second line portions may overlap the second data connection lines DCL2 or the first horizontal dummy patterns HDP1, and the others of the second line portions may not overlap the second data connection lines DCL2 and the first horizontal dummy patterns HDP1.

A plurality of second horizontal power supply lines HPL2 may extend in the first direction DR1 and may be arranged in the second direction DR2. The second source voltage higher than the first source voltage may be applied to the plurality of second horizontal power supply lines HPL2. The first source voltage may be a low potential voltage and the second source voltage may be a high potential voltage.

A plurality of second data connection lines DCL2 may extend in the first direction DR1 and may be arranged in the second direction DR2. In the first display area DA1, the plurality of second horizontal power supply lines HPL2 and the plurality of second data connection lines DCL2 may be alternately disposed in the second direction DR2. That is, the second data connection line DCL2 may be disposed between the second horizontal power supply lines HPL2 neighboring to each other in the second direction DR2, and the second horizontal power supply line HPL2 may be disposed between the second data connection lines DCL2 neighboring to each other in the second direction DR2.

The plurality of first horizontal dummy patterns HDP1 may extend in the first direction DR1 and may be arranged in the second direction DR2. In the first display area DA1, the plurality of second horizontal power supply lines HPL2 and the plurality of first horizontal dummy patterns HDP1 may be alternately disposed in the second direction DR2. That is, the first horizontal dummy pattern HDP1 may be disposed between the second horizontal power supply lines HPL2 neighboring to each other in the second direction DR2, and the second horizontal power supply line HPL2 may be disposed between the first horizontal dummy patterns HDP1 neighboring to each other in the second direction DR2.

Each of the second data connection lines DCL2 and the first horizontal dummy patterns HDP1 may include third line portions having a third width and fourth line portions having a fourth width greater than the third width. The third line portions and the fourth line portions may be alternately disposed in the first direction DR1. Each of the fourth line portions may overlap the first data line DL1, the first vertical power supply line VPL1, the second data line DL2, or the first data connection line DCL1.

The first data connection lines DCL1 may be connected to the second data connection lines DCL2 through the first data connection holes DCH1, respectively. The plurality of first data lines DL1 may be connected to the second data connection lines DCL2 through the second data connection holes DCH2, respectively. The first data connection holes DCH1 may be arranged in the first diagonal direction DD1 in the second sub-display area SDA2. The second data connection holes DCH2 may be arranged in the second diagonal direction DD2 in the first sub-display area SDA1.

Any one of the first data connection lines DCL1 and a first vertical dummy pattern VDP1 neighboring thereto may be disposed to be spaced apart from each other along the second direction DR2. A first spacing portion SU1 between the first data connection line DCL1 and the first vertical dummy pattern VDP1 neighboring thereto may overlap the second horizontal power supply line HPL2 in a plan view. The first spacing portion SU1 will be described later with reference to FIG. 10.

In addition, another of the first data connection lines DCL1 and a first vertical dummy pattern VDP1 neighboring thereto may be disposed to be spaced apart from each other along the second direction DR2. A second spacing portion SU2 between another first data connection line DCL1 and the first vertical dummy pattern VDP1 neighboring thereto may not overlap the second horizontal power supply line HPL2. The second spacing portion SU2 will be described later with reference to FIGS. 11 and 12.

In addition, the second data connection line DCL2 and the first horizontal power supply line HPL1 neighboring thereto along the first direction DR1 may be disposed to be spaced apart from each other. A third spacing portion SU3 between the second data connection line DCL2 and the first horizontal power supply line HPL1 neighboring thereto along the first direction DR1 may be disposed between the first data line DL1 and the first vertical power supply line VPL1 neighboring to each other along the first direction DR1 or be disposed between the second data line DL2 and the first data connection line DCL1 neighboring to each other along the first direction DR1.

In addition, the second data connection line DCL2 and the first horizontal dummy pattern HDP1 neighboring thereto along the first direction DR1 may be disposed to be spaced apart from each other. A fourth spacing portion SU4 between the second data connection line DCL2 and the first horizontal dummy pattern HDP1 neighboring thereto along the first direction DR1 may be disposed between the second data line DL2 and the first data connection line DCL1 neighboring to each other along the first direction DR1.

Figure 10:
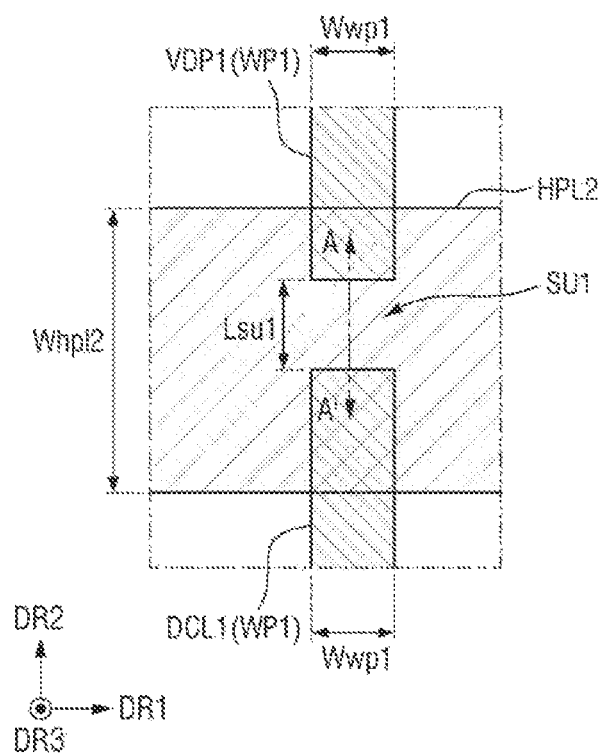
FIG. 10 is an enlarged layout diagram illustrating an example of a first spacing portion of FIG. 9 in detail.

FIG. 10 is an enlarged layout diagram illustrating an example of a first spacing portion of FIG. 9 in detail.

Referring to FIG. 10, the first spacing portion SU1 refers to a gap that is disposed between the first data connection line DCL1 and the first vertical dummy pattern VDP1 neighboring thereto along the second direction DR2 and overlaps the second horizontal power supply line HPL2. The first spacing portion SU1 may be a gap between a first line portion WP1 of the first data connection line DCL1 having a first width Wwp1 and a first line portion WP1 of the first vertical dummy pattern VDP1 having a first width Wwp1.

A length Lsu1 of the first spacing portion SU1 in the second direction DR2 may be smaller than a width Whpl2 of the second horizontal power supply line HPL2. The width Whpl2 of the second horizontal power supply line HPL2 may be a length of the second horizontal power supply line HPL2 in the second direction DR2.

Figure 11:
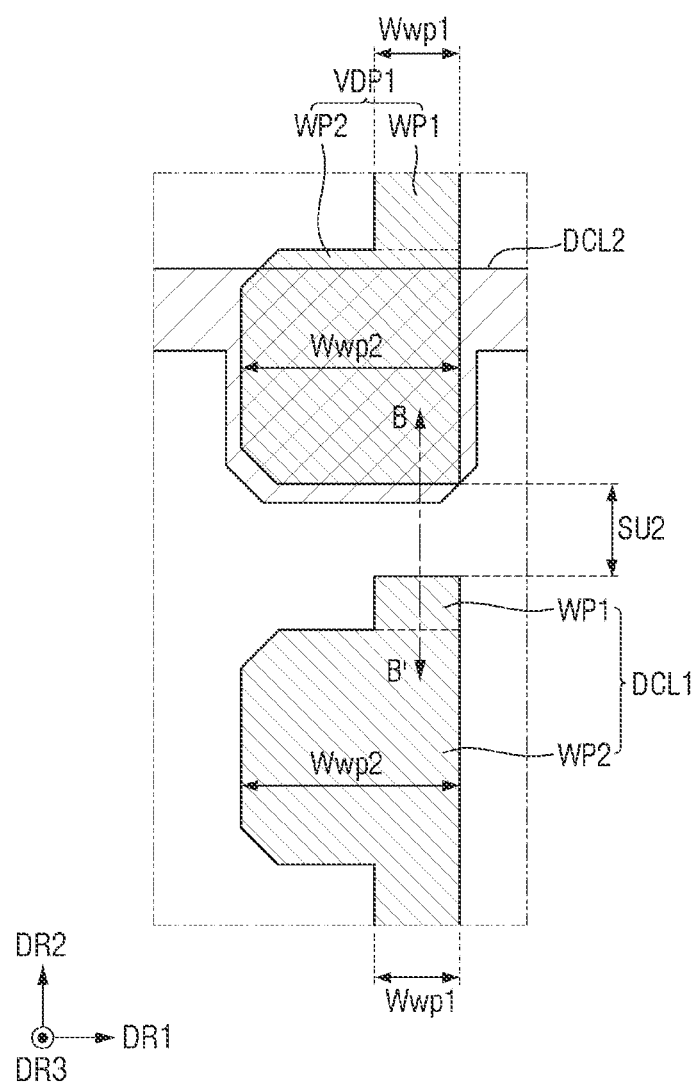
FIG. 11 is an enlarged layout diagram illustrating an example of a second spacing portion of FIG. 9 in detail.

FIG. 11 is an enlarged layout diagram illustrating an example of a second spacing portion of FIG. 9 in detail.

Referring to FIG. 11, the second spacing portion SU2 refers to a gap that is disposed between the first data connection line DCL1 and the first vertical dummy pattern VDP1 neighboring thereto along the second direction DR2 and does not overlap the second horizontal power supply line HPL2. The second spacing portion SU2 may be a gap between a first line portion WP1 of the first data connection line DCL1 having a first width Wwp1 and a second line portion WP2 of the first vertical dummy pattern VDP1 having a second width Wwp2, but an exemplary embodiment of the present disclosure is not limited thereto. The second spacing portion SU2 may be a gap between a second line portion WP2 of the first data connection line DCL1 having a second width Wwp2 and a first line portion WP1 of the first vertical dummy pattern VDP1 having a first width Wwp1.

The second spacing portion SU2 may be formed by removing a pattern connecting the first data connection line DCL1 and the first vertical dummy pattern VDP1 to each other by an etching process. In this case, since the second line portion WP2 of the first data connection line DCL1 has a greater width than the first line portion WP1 of the first data connection line DCL1, when the second spacing portion SU2 is formed as the gap between the first line portion WP1 of the first data connection line DCL1 and the second line portion WP2 of the first vertical dummy pattern VDP1, it is possible to prevent the pattern from being overetched as compared with an original intention in the etching process. In addition, since the second line portion WP2 of the first vertical dummy pattern VDP1 has a greater width than the first line portion WP1 of the first vertical dummy pattern VDP1, when the second spacing portion SU2 is formed as the gap between the second line portion WP2 of the first data connection line DCL1 and the first line portion WP1 of the first vertical dummy pattern VDP1, it is possible to prevent the pattern from being overetched as compared with an original intention in the etching process.

Figure 12:
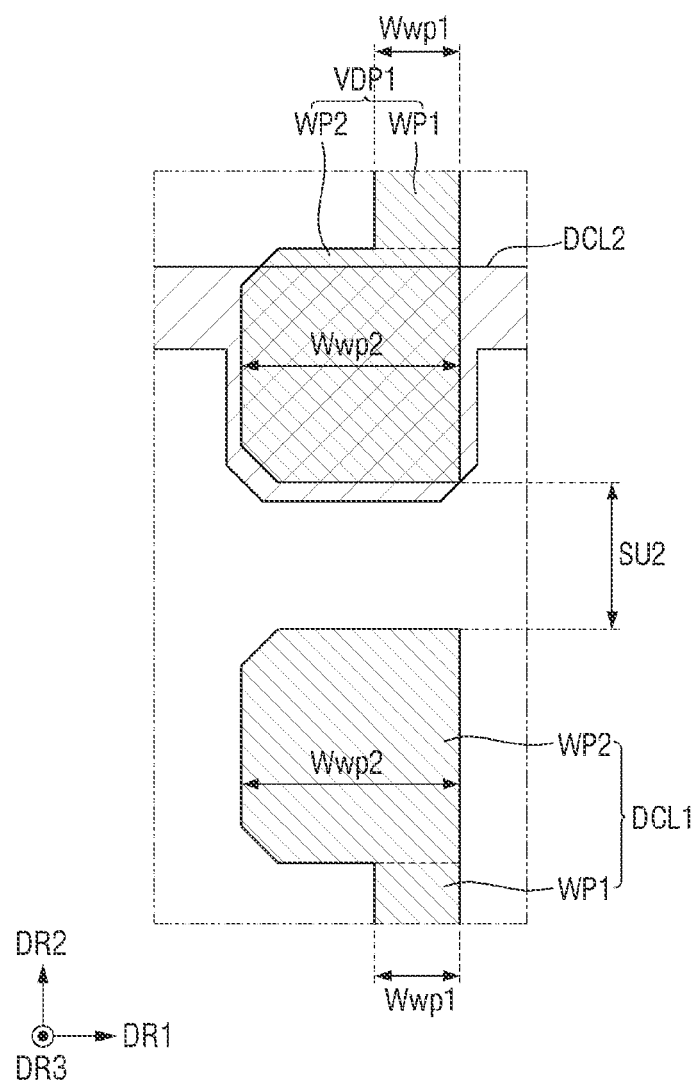
FIG. 12 is an enlarged layout diagram illustrating another example of a second spacing portion of FIG. 9 in detail.

FIG. 12 is an enlarged layout diagram illustrating another example of a second spacing portion of FIG. 9 in detail.

A second spacing portion SU2 illustrated in FIG. 12 is different from the second spacing portion SU2 according to an exemplary embodiment of FIG. 11 in that it is a gap between a second line portion WP2 of the first data connection line DCL1 having a second width Wwp2 and a second line portion WP2 of the first vertical dummy pattern VDP1 having a second width Wwp2.

The second spacing portion SU2 may be formed by removing a pattern connecting the first data connection line DCL1 and the first vertical dummy pattern VDP1 to each other by an etching process. In this case, since the second line portion WP2 of the first data connection line DCL1 has a greater width than a first line portion WP1 of the first data connection line DCL1 and the second line portion WP2 of the first vertical dummy pattern VDP1 has a greater width than a first line portion WP1 of the first vertical dummy pattern VDP1, when the second spacing portion SU2 is formed as the gap between the second line portion WP2 of the first data connection line DCL1 and the second line portion WP2 of the first vertical dummy pattern VDP1, it may be easy to prevent the pattern from being overetched as compared with an original intention in the etching process.

Figure 13:
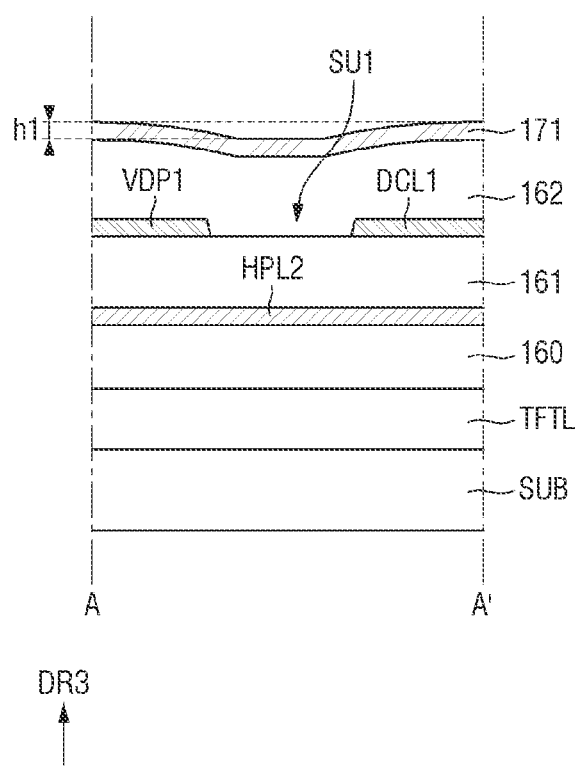
FIG. 13 is a cross-sectional view illustrating an example of a display panel taken along line A-A' of FIG. 10.
Figure 14:
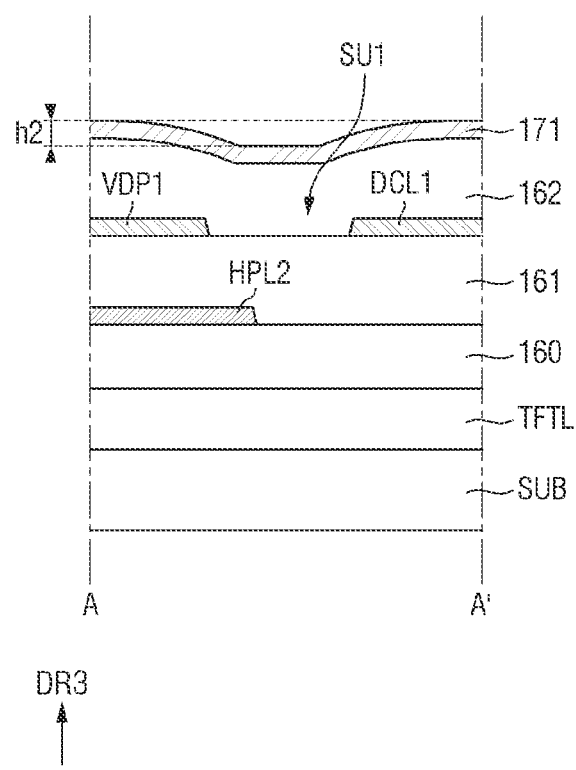
FIG. 14 is a cross-sectional view illustrating a first comparative example of the display panel.
Figure 15:
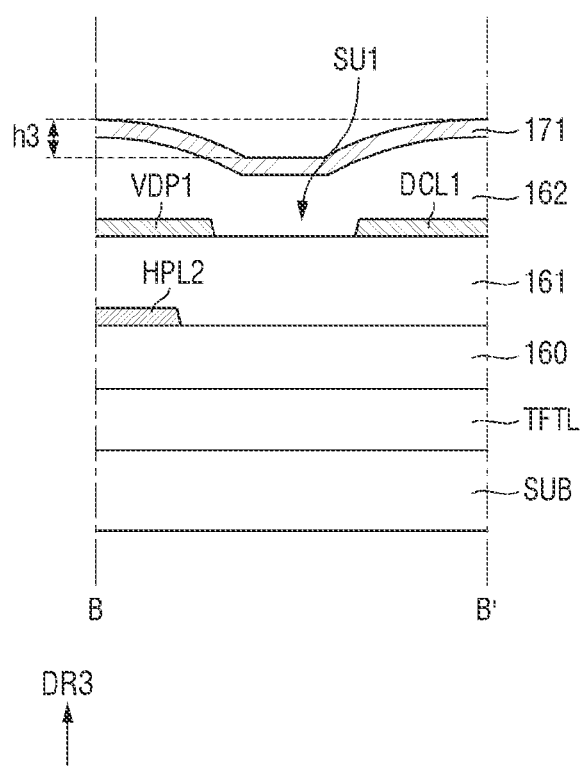
FIG. 15 is a cross-sectional view illustrating a second comparative example of the display panel.
Figure 16:
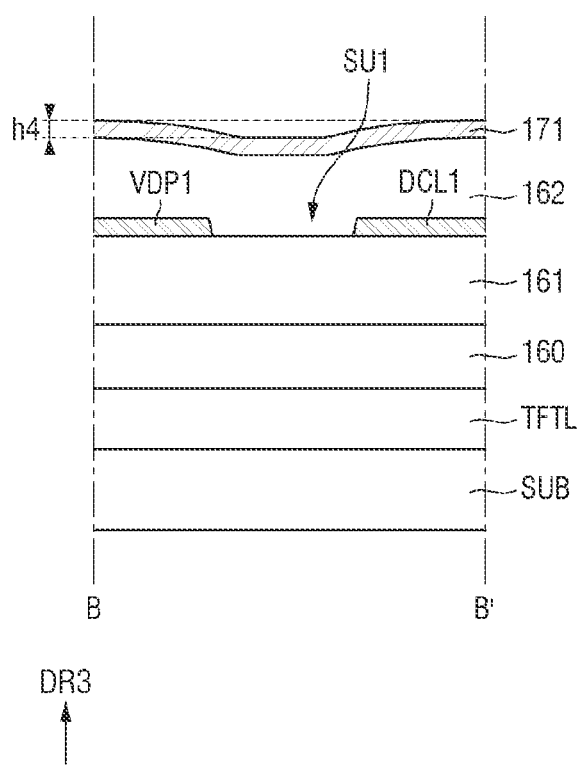
FIG. 16 is a cross-sectional view illustrating an example of the display panel taken along line B-B' of FIG. 11.

FIG. 13 is a cross-sectional view illustrating an example of a display panel taken along line A-A' of FIG. 10. FIG. 14 is a cross-sectional view illustrating a first comparative example of the display panel. FIG. 15 is a cross-sectional view illustrating a second comparative example of the display panel. FIG. 16 is a cross-sectional view illustrating an example of the display panel taken along line B-B' of FIG. 11.

Referring to FIGS. 13 to 15, a thin film transistor layer TFTL may be disposed on a substrate SUB, a first planarization film 160 may be disposed on the thin film transistor layer TFTL, and the second horizontal power supply line HPL2 may be disposed on the first planarization film 160. A second planarization film 161 may be disposed on the second horizontal power supply line HPL2, and the first data connection line DCL1 and the first vertical dummy pattern VDP1 may be disposed on the second planarization film 161. A third planarization film 162 may be disposed on the first data connection line DCL1 and the first vertical dummy pattern VDP1, and a pixel electrode 171 may be disposed on the third planarization film 162.

In this case, flatness of the third planarization film 162 may be affected by a step of the second horizontal power supply line HPL2 and steps of the first data connection line DCL1 and the first vertical dummy pattern VDP1. Accordingly, the pixel electrode 171 disposed on the first spacing portion SU1 may also have a step.

As illustrated in FIG. 13, when the second horizontal power supply line HPL2 overlaps the first spacing portion SU1, the pixel electrode 171 may have a first step h1. In contrast, as illustrated in FIG. 14, when the second horizontal power supply line HPL2 partially overlaps the first spacing portion SU1, the pixel electrode 171 may have a second step h2 greater than the first step h1. In addition, as illustrated in FIG. 15, when the second horizontal power supply line HPL2 does not overlap the first spacing portion SU1 but is disposed adjacent to the first spacing portion SU1, the pixel electrode 171 may have a third step h3 greater than the step h2.

As illustrated in FIG. 16, when the second horizontal power supply line HPL2 does not overlap the first spacing portion SU1, the pixel electrode 171 may have a fourth step h4. The fourth step h4 may be smaller than the second step h2 or the third step h3.

As the step of the pixel electrode 171 increases, when external light is reflected from the display panel 100, a pattern due to the step of the pixel electrode 171 may be visually recognized by a user. By disposing the first spacing portion SU1 so as to overlap the second horizontal power supply line HPL2 as illustrated in FIG. 13 or by disposing the second spacing portion SU2 so as not to overlap the second horizontal power supply line HPL2 as illustrated in FIG. 16, it is possible to prevent the pattern due to the step of the pixel electrode 171 from being visually recognized by the user.

Figure 17:
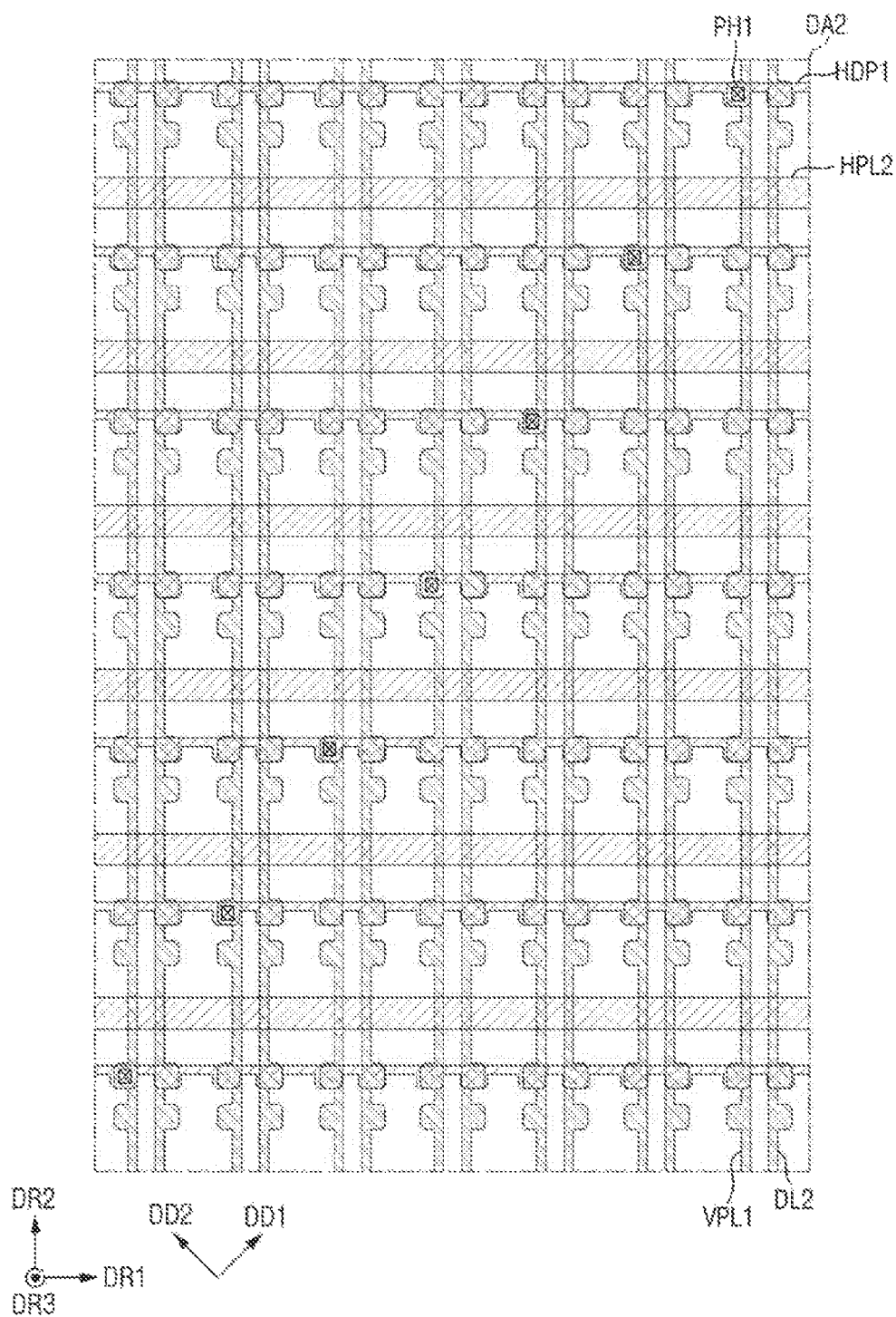
FIG. 17 is a layout diagram illustrating a portion of a second display area of FIG. 2.

FIG. 17 is a layout diagram illustrating a portion of a second display area of FIG. 2 in detail.

Referring to FIG. 17, the second display area DA2 is an area in which the first vertical power supply lines VPL1 are connected to first horizontal dummy patterns HDP1 through first power holes PH1.

The second data lines DL2 and the first vertical power supply lines VPL1 may be alternately disposed in the first direction DR1. That is, the first vertical power supply line VPL1 may be disposed between the second data lines DL2 neighboring to each other in the first direction DR1, and the second data line DL2 may be disposed between the first vertical power supply lines VPL1 neighboring each other in the first direction DR1.

Each of the second data lines DL2 and the first vertical power supply lines VPL1 may include first line portions having a first width and second line portions having a second width greater than the first width. The first line portions and the second line portions may be alternately disposed in the second direction DR2. Some of the second line portions may overlap the first horizontal dummy patterns HDP1, and the others of the second line portions may not overlap the first horizontal dummy patterns HDP1.

A plurality of second horizontal power supply lines HPL2 may extend in the first direction DR1 and may be arranged in the second direction DR2. The second source voltage may be applied to the plurality of second horizontal power supply lines HPL2.

A plurality of first horizontal dummy patterns HDP1 may extend in the first direction DR1 and may be arranged in the second direction DR2. In the second display area DA2, the plurality of second horizontal power supply lines HPL2 and the plurality of first horizontal dummy patterns HDP1 may be alternately disposed in the second direction DR2. That is, the first horizontal dummy pattern HDP1 may be disposed between the second horizontal power supply lines HPL2 neighboring to each other in the second direction DR2, and the second horizontal power supply line HPL2 may be disposed between the first horizontal dummy patterns HDP1 neighboring to each other in the second direction DR2.

The first horizontal dummy patterns HDP1 may include third line portions having a third width and fourth line portions having a fourth width greater than the third width. The third width may be substantially the same as the first width Wwp1, and the fourth width may be substantially the same as the second width Wwp2. The third line portions and the fourth line portions may be alternately disposed in the first direction DR1. Each of the fourth line portions may overlap the second data line DL2 or the first vertical power supply line VPL1.

The plurality of first vertical power supply lines VPL1 may be connected to the first horizontal dummy patterns HDP1 through the first power holes PH1, respectively. It has been illustrated in FIG. 17 that the first power holes PH1 are arranged in the first diagonal direction DD1, but an exemplary embodiment of the present disclosure is not limited thereto. For example, the first power holes PH1 may be arranged in the second diagonal direction DD2. Alternatively, the first power holes PH1 may be arranged in the first diagonal direction DD1 and then arranged in the second diagonal direction DD2. That is, the first power holes PH1 may be arranged in a ">" shape. Alternatively, the first power holes PH1 may be arranged in the second diagonal direction DD2 and then arranged in the first diagonal direction DD1. That is, the first power holes PH1 may be arranged in a "<" shape. Alternatively, the first power holes PH1 may be arranged in a repeated pattern other than the ">" shape and the "<" shape.

Figure 18:
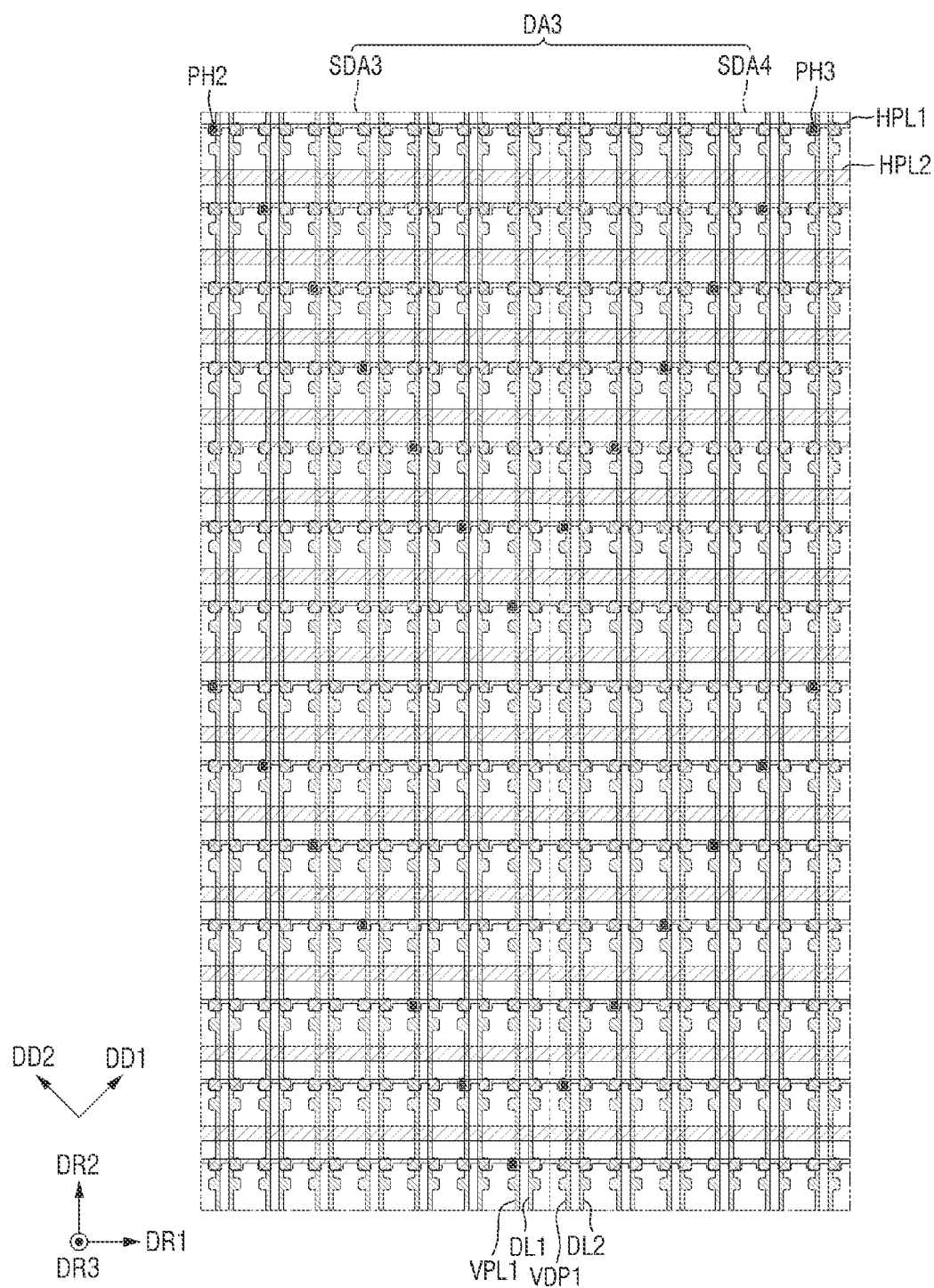
FIG. 18 is a layout diagram illustrating a portion of a third display area of FIG. 2.

FIG. 18 is a layout diagram illustrating a portion of a first display area of FIG. 2.

Referring to FIG. 18, the third display area DA3 includes a third sub-display area SDA3 and a fourth sub-display area SDA4. The third sub-display area SDA3 is an area in which second power holes PH2 through which first horizontal power supply lines HPL1 and first vertical power supply lines VPL are connected to each other, respectively, are disposed, and the fourth sub-display area SDA4 is an area in which third power holes PH3 through which the first horizontal power supply lines HPL1 and first vertical dummy pattern VDP1 are connected to each other, respectively, are disposed.

A plurality of first data lines DL1 and a plurality of first vertical power supply lines VPL1 may be disposed in the third sub-display area SDA3, and a plurality of second data lines DL2 and a plurality of first vertical dummy patterns VDP1 may be disposed in the fourth sub-display area SDA4.

In the third sub-display area SDA3, the plurality of first data lines DL1 and the plurality of first vertical power supply lines VPL1 may be alternately disposed in the first direction DR1. That is, the first vertical power supply line VPL1 may be disposed between the first data lines DL1 neighboring to each other in the first direction DR1, and the first data line DL1 may be disposed between the first vertical power supply lines VPL1 neighboring each other in the first direction DR1.

In the fourth sub-display area SDA4, the plurality of second data lines DL2 and the plurality of first vertical dummy patterns VDP1 may be alternately disposed in the first direction DR1. That is, the first vertical dummy pattern VDP1 may be disposed between the second data lines DL2 neighboring to each other in the first direction DR1, and the second data line DL2 may be disposed between the first vertical dummy patterns VDP1 neighboring each other in the first direction DR1.

Each of the first data lines DL1, the first vertical power supply lines VPL1, and the second data lines DL2 may include first line portions having a first width and second line portions having a second width greater than the first width. The first line portions and the second line portions may be alternately disposed in the second direction DR2. Some of the second line portions may overlap the first horizontal power supply lines HPL1, and the others of the second line portions may not overlap the first horizontal power supply lines HPL1.

A plurality of second horizontal power supply lines HPL2 may extend in the first direction DR1 and may be arranged in the second direction DR2. The second source voltage may be applied to the plurality of second horizontal power supply lines HPL2.

The first horizontal power supply lines HPL1 may include third line portions having a third width and fourth line portions having a fourth width greater than the third width. The third line portions and the fourth line portions may be alternately disposed in the first direction DR1. Each of the fourth line portions may overlap the first data line DL1, the first vertical power supply line VPL1, or the second data line DL2.

The first vertical power supply lines VPL1 may be connected to the first horizontal power supply lines HPL1 through the second power holes PH2, respectively. The first vertical dummy patterns VDP1 may be connected to the first horizontal power supply lines HPL1 through the third power holes PH3, respectively.

It has been illustrated in FIG. 18 that the second power holes PH2 are arranged in the second diagonal direction DD2 and the third power holes PH3 are arranged in the first diagonal direction DD1, such that the second power holes PH2 and the third power holes PH3 are repeatedly arranged in a "\/" shape. However, an exemplary embodiment of the present disclosure is not limited thereto. For example, the second power holes PH2 are arranged in the first diagonal direction DD1 and the third power holes PH3 are arranged in the second diagonal direction DD2, such that the second power holes PH2 and the third power holes PH3 may be repeatedly arranged in a "/\" shape. Alternatively, the second power holes PH2 and the third power holes PH3 may be arranged in a repeated pattern other than the "\/" shape and the "/\" shape.

Figure 19:
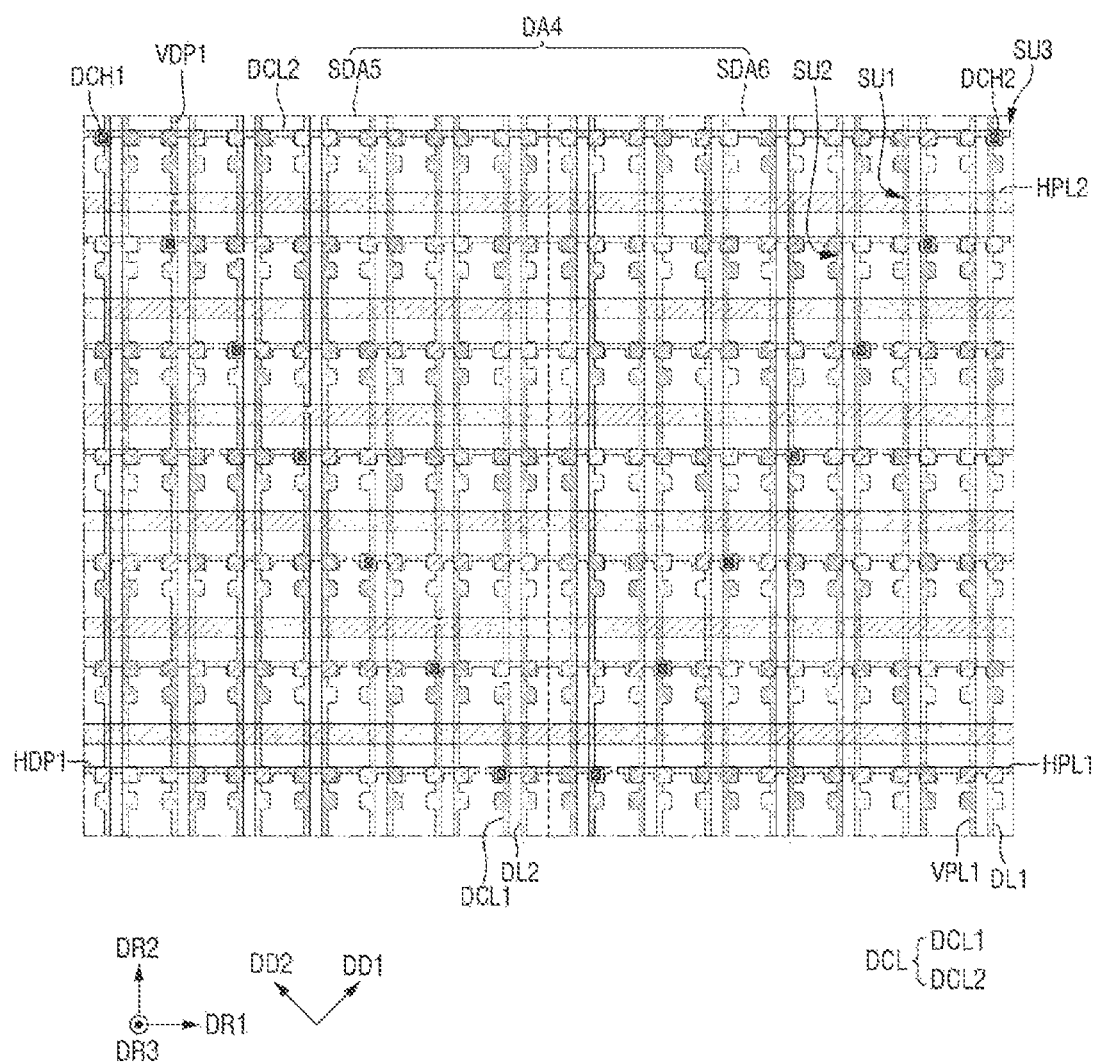
FIG. 19 is a layout diagram illustrating a portion of a fourth display area of FIG. 2 in detail.

FIG. 19 is a layout diagram illustrating a portion of a fourth display area of FIG. 2 in detail.

Referring to FIG. 19, the fourth display area DA4 includes a fifth sub-display area SDA5 and a sixth sub-display area SDA6. The fifth sub-display area SDA5 is an area in which first data connection holes DCH1 through which first data connection lines DCL1 and second data connection lines DCL2 are connected to each other, respectively, are disposed, and the sixth sub-display area SDA6 is an area in which second data connection holes DCH2 through which the second data connection lines DCL2 and first data lines DL1 are connected to each other, respectively, are disposed.

The fifth sub-display area SDA5 is substantially the same as the second sub-display area SDA2 described with reference to FIG. 7, and thus, a description of the fifth sub-display area SDA5 will be omitted. In addition, the sixth sub-display area SDA6 is substantially the same as the first sub-display area SDA1 described with reference to FIG. 7, and thus, a description of the sixth sub-display area SDA6 will be omitted.

Figure 20:
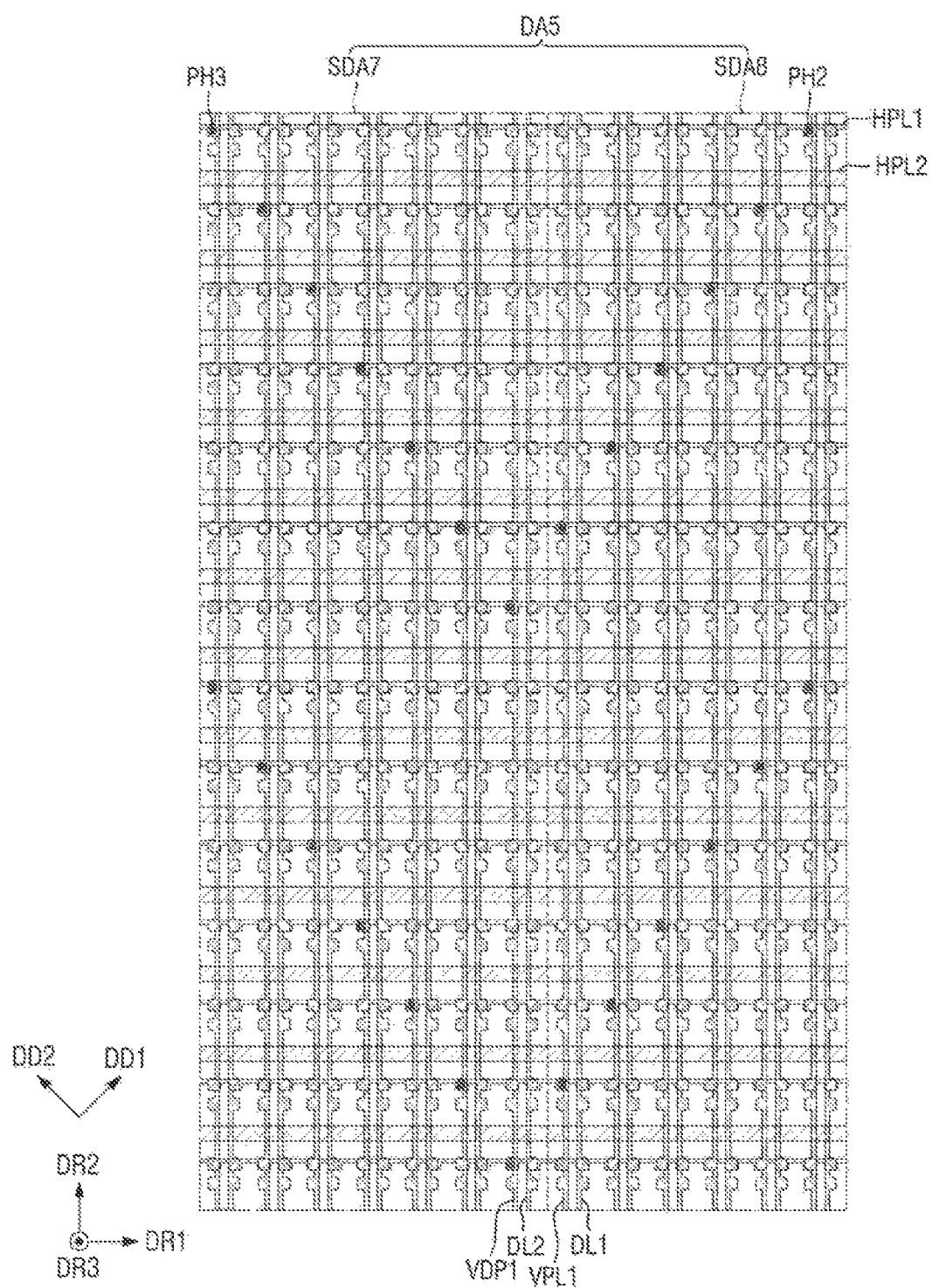
FIG. 20 is a layout diagram illustrating a portion of a fifth display area of FIG. 2 in detail.

FIG. 20 is a layout diagram illustrating a portion of a fifth display area of FIG. 2 in detail.

Referring to FIG. 20, the fifth display area DA5 includes a seventh sub-display area SDA7 and an eighth sub-display area SDA8. The seventh sub-display area SDA7 is an area in which third power holes PH3 through which first horizontal power supply lines HPL1 and first vertical dummy patterns VDP1 are connected to each other, respectively, are disposed, and the eighth sub-display area SDA8 is an area in which second power holes PH2 through which the first horizontal power supply lines HPL1 and first vertical power supply lines VPL1 are connected to each other, respectively, are disposed.

The seventh sub-display area SDA7 is substantially the same as the fourth sub-display area SDA4 described with reference to FIG. 18, and thus, a description of the seventh sub-display area SDA7 will be omitted. In addition, the eighth sub-display area SDA8 is substantially the same as the third sub-display area SDA3 described with reference to FIG. 18, and thus, a description of the eighth sub-display area SDA8 will be omitted.

Figure 21:
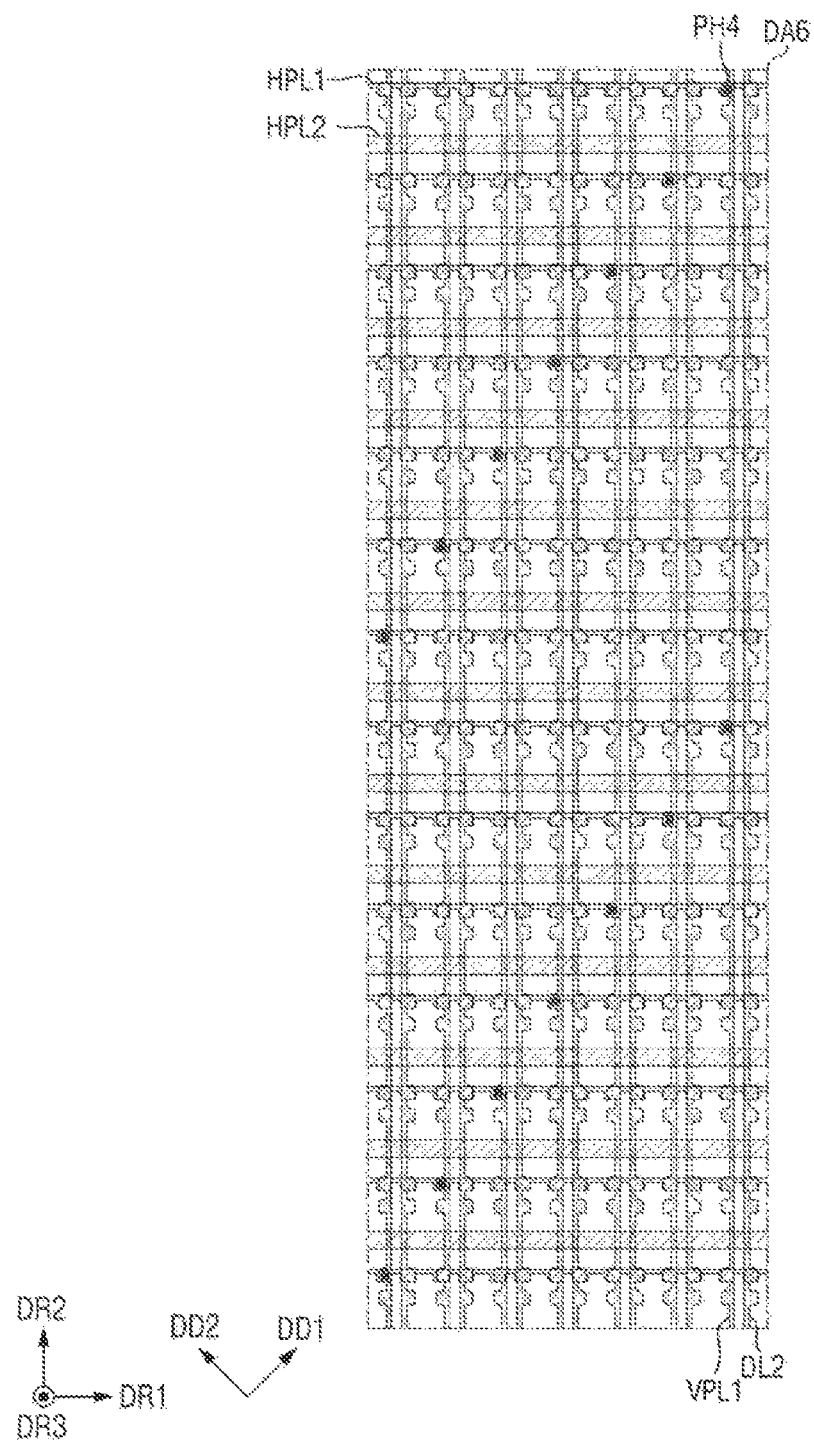
FIG. 21 is a layout diagram illustrating a portion of a sixth display area of FIG. 2 in detail.

FIG. 21 is a layout diagram illustrating a portion of a sixth display area of FIG. 2 in detail.

Referring to FIG. 21, the sixth display area DA6 is an area in which first vertical power supply lines VPL1 are connected to first horizontal power supply lines HPL1 through fourth power holes PH4.

Second data lines DL2 and the first vertical power supply lines VPL1 may be alternately disposed in the first direction DR1. That is, the first vertical power supply line VPL1 may be disposed between the second data lines DL2 neighboring to each other in the first direction DR1, and the second data line DL2 may be disposed between the first vertical power supply lines VPL1 neighboring each other in the first direction DR1.

Each of the second data lines DL2 and the first vertical power supply lines VPL1 may include first line portions having a first width and second line portions having a second width greater than the first width. The first line portions and the second line portions may be alternately disposed in the second direction DR2. Some of the second line portions may overlap the first vertical power supply lines VPL1 and the others of the second line portions may not overlap the first vertical power supply lines VPL1.

A plurality of second horizontal power supply lines HPL2 may extend in the first direction DR1 and may be arranged in the second direction DR2. The second source voltage may be applied to the plurality of second horizontal power supply lines HPL2.

A plurality of first vertical power supply lines VPL1 may extend in the second direction DR2 and may be arranged in the first direction DR1. In the sixth display area DA6, a plurality of first horizontal power supply lines HPL1 and the plurality of second horizontal power supply lines HPL2 may be alternately disposed in the second direction DR2. That is, the first horizontal power supply line HPL1 may be disposed between the second horizontal power supply lines HPL2 neighboring to each other in the second direction DR2, and the second horizontal power supply line HPL2 may be disposed between the first horizontal power supply lines HPL1 neighboring to each other in the second direction DR2.

The first horizontal power supply lines HPL1 may include third line portions having a third width and fourth line portions having a fourth width greater than the third width. The third line portions and the fourth line portions may be alternately disposed in the first direction DR1. Each of the fourth line portions may overlap the second data line DL2 or the first vertical power supply line VPL1.

The plurality of first vertical power supply lines VPL1 may be connected to the first horizontal power supply lines HPL1 through the fourth power holes PH4, respectively. It has been illustrated in FIG. 22 that the fourth power holes PH4 are arranged in the first diagonal direction DD1, but an exemplary embodiment of the present disclosure is not limited thereto. For example, the fourth power holes PH4 may be arranged in the second diagonal direction DD2. Alternatively, the fourth power holes PH4 may be arranged in the first diagonal direction DD1 and then arranged in the second diagonal direction DD2. That is, the fourth power holes PH4 may be arranged in a ">" shape. Alternatively, the fourth power holes PH4 may be arranged in the second diagonal direction DD2 and then arranged in the first diagonal direction DD1. That is, the fourth power holes PH4 may be arranged in a "<" shape. Alternatively, the fourth power holes PH4 may be arranged in a repeated pattern other than the ">" shape and the "<" shape.

Figure 22:
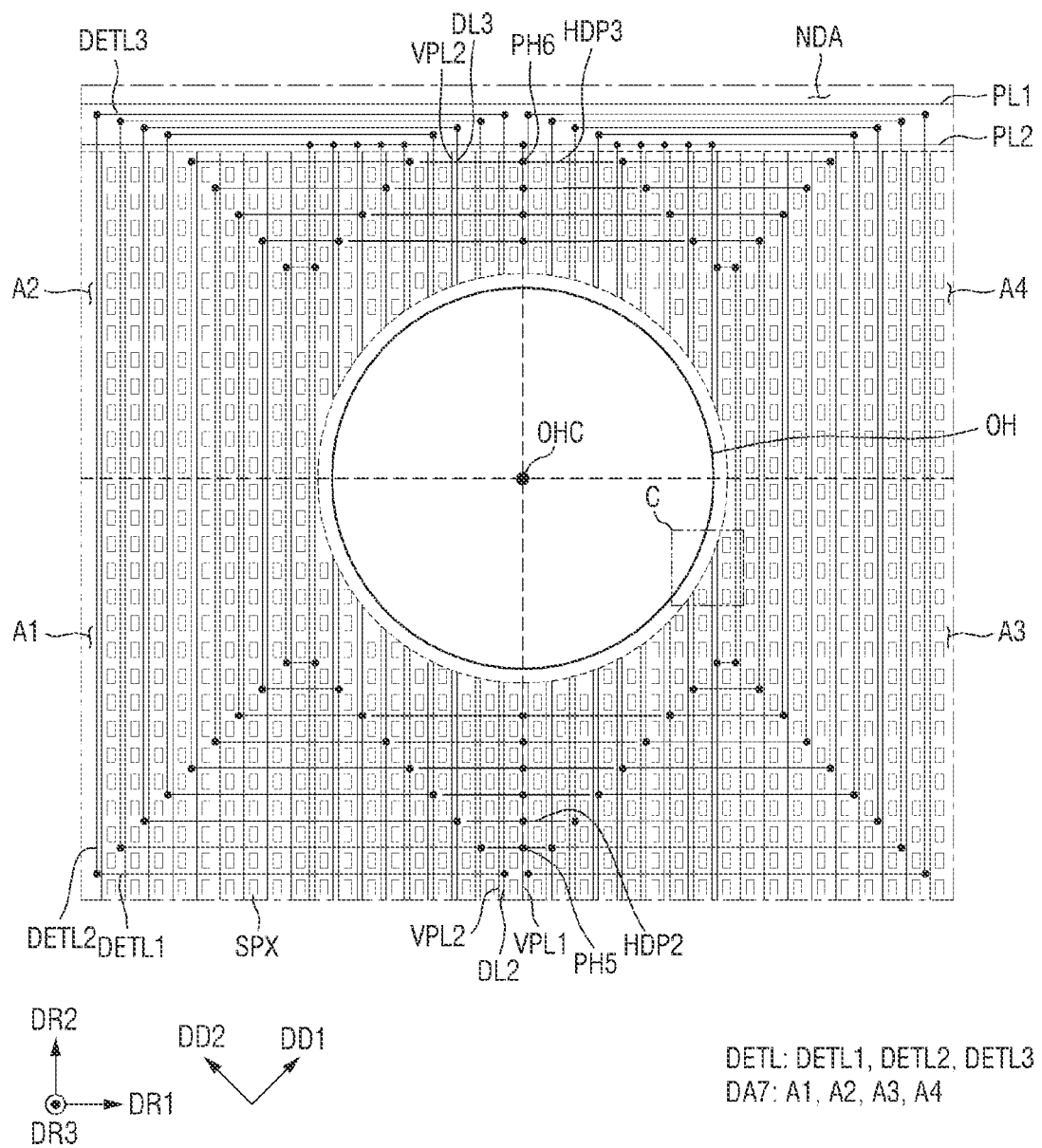
FIG. 22 is a layout diagram illustrating an example of a seventh display area of FIG. 2 in detail.
Figure 23:
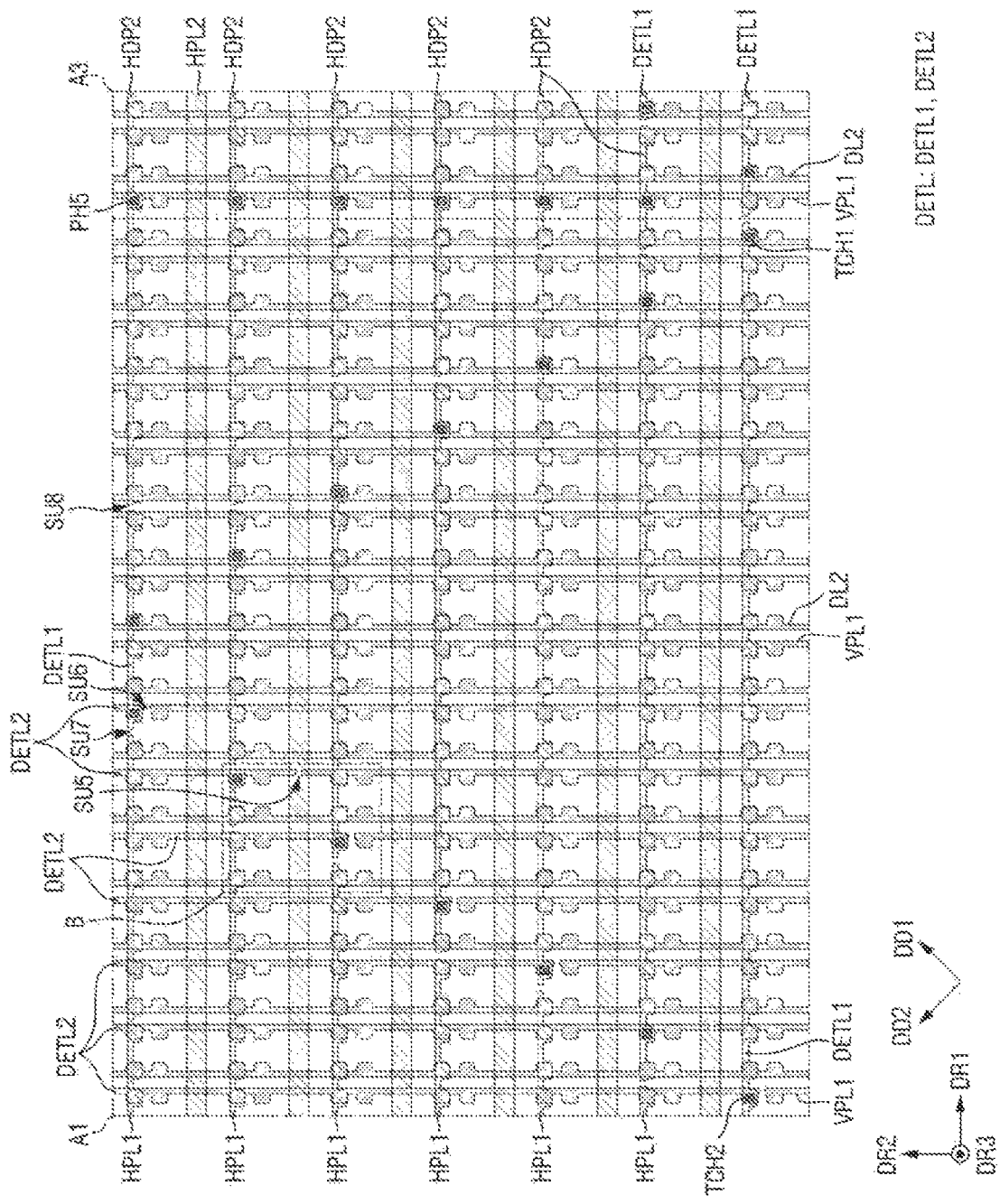
FIG. 23 is a layout diagram illustrating portions of a first area and a third area of the seventh display area of FIG. 22 in detail.
Figure 24:
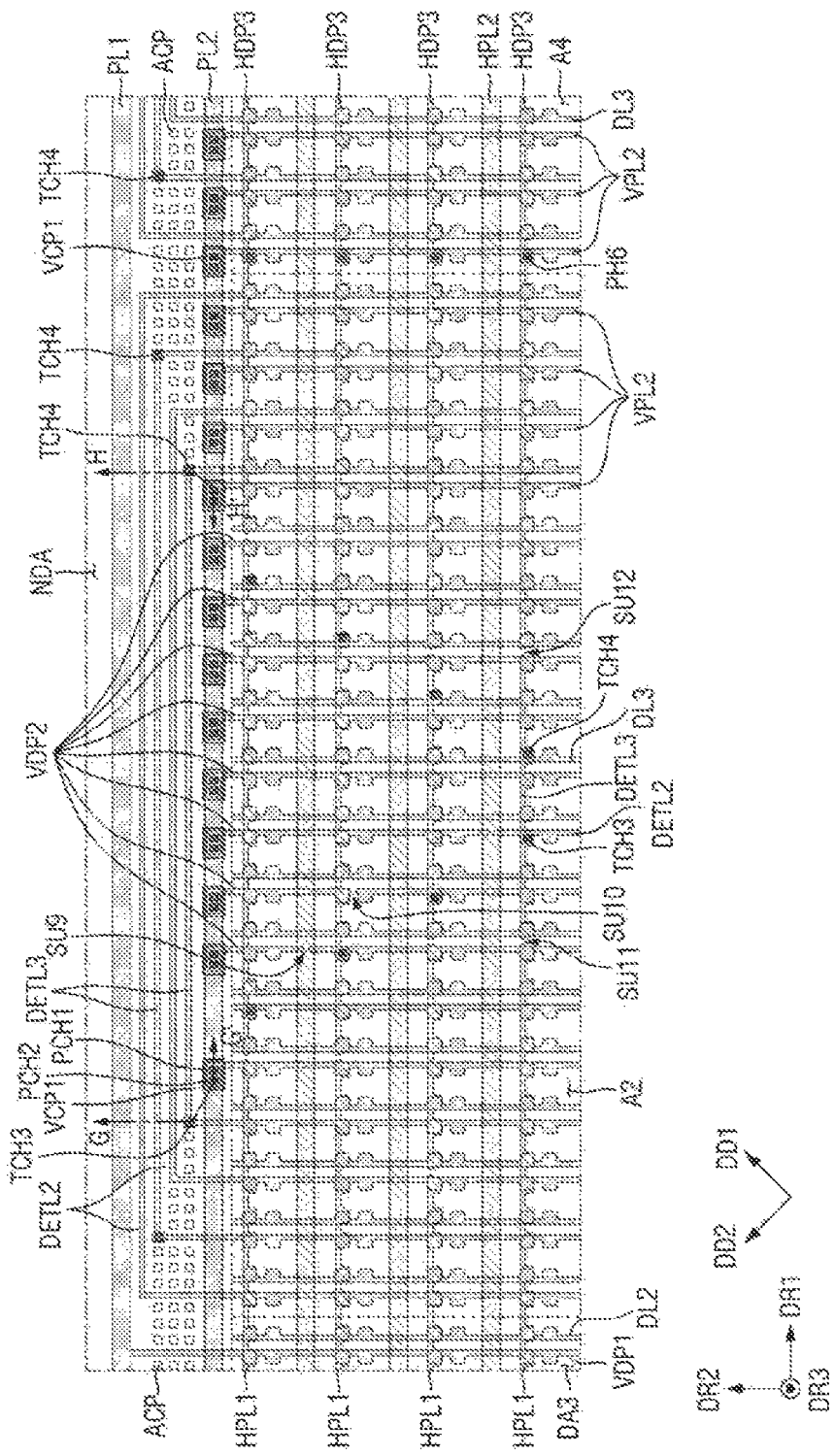
FIG. 24 is a layout diagram illustrating a second area and a fourth area of the seventh display area of FIG. 22 and a portion of a non-display area of FIG. 22 in detail.

FIG. 22 is a layout diagram illustrating an example of a seventh display area of FIG. 2 in detail. FIG. 23 is a layout diagram illustrating portions of a first area and a third area of the seventh display area of FIG. 22 in detail. FIG. 24 is a layout diagram illustrating a second area and a fourth area of the seventh display area and a portion of a non-display area of FIG. 22 in detail.

Referring to FIGS. 22 to 24, the seventh display area DA7 may include a first area A1, a second area A2, a third area A3, and a fourth area A4. Each of the first area A1 and the third area A3 is an area in which second data lines DL2 disposed on one side of the hole OH are connected to bypass lines (or detour lines) DETL, respectively. Each of the second area A2 and the fourth area A4 is an area in which third data lines DL3 disposed on the other side of the hole OH are connected to bypass lines DETL, respectively. One side of the hole OH may be a lower side of the hole OH, and the other side of the hole OH may be an upper side of the hole OH.

A plurality of second data lines DL2, a plurality of third data lines DL3, a plurality of first vertical power supply lines VPL1, a plurality of second vertical power supply lines VPL2, a plurality of first horizontal power supply lines HPL1, a plurality of second horizontal power supply lines HPL2, a plurality of second horizontal dummy patterns HDP2, a plurality of third horizontal dummy patterns HDP3, and a plurality of second vertical dummy patterns VDP2, and a plurality of bypass lines DETL may be disposed in the seventh display area DA7.

The plurality of second data lines DL2 may extend in the second direction DR2 and may be arranged in the first direction DR1. The plurality of third data lines DL3 may extend in the second direction DR2 and may be arranged in the first direction DR1.

The plurality of first vertical power supply lines VPL1 may extend in the second direction DR2 and may be arranged in the first direction DR1. The plurality of second vertical power supply lines VPL2 may extend in the second direction DR2 and may be arranged in the first direction DR1. The plurality of second vertical dummy patterns VDP2 may extend in the second direction DR2 and may be arranged in the first direction DR1.

Lengths of two second vertical dummy patterns VDP2 neighboring to each other in the first direction DR1 may be different from each other. For example, in the second area A2, a length of a second vertical dummy pattern VDP2 disposed on the right side of two second vertical dummy patterns VDP2 neighboring to each other may be greater than a length of a second dummy pattern VDP2 disposed on the left side of the two second vertical dummy patterns VDP2.

The plurality of second data lines DL2 and the plurality of first vertical power supply lines VPL1 may be alternately disposed in the first direction DR1. The plurality of third data lines DL3 and the plurality of second vertical power supply lines VPL2 may be alternately disposed in the first direction DR1. The plurality of third data lines DL3 and the plurality of second vertical dummy patterns VDP2 may be alternately disposed in the first direction DR1.

The plurality of first horizontal power supply lines HPL1 may extend in the first direction DR1 and may be arranged in the second direction DR2. The plurality of second horizontal power supply lines HPL2 may extend in the first direction DR1 and may be arranged in the second direction DR2. The plurality of first horizontal power supply lines HPL1 and the plurality of second horizontal power supply lines HPL2 may be alternately disposed in the second direction DR2. The first source voltage may be applied to the plurality of first horizontal power supply lines HPL1 and the second source voltage higher than the first source voltage may be applied to the plurality of second horizontal power supply lines HPL2.

Each of the plurality of bypass lines DETL may include a first sub-bypass line (or a first sub-detour line) DETL1, a second sub-bypass line (or a second sub-detour line) DETL2, and a third sub-bypass line (or a third sub-detour line) DETL3. The first sub-bypass lines DETL1 may extend in the first direction DR1, the second sub-bypass lines DETL2 may extend in the second direction DR2, and the third sub-bypass lines DETL3 may extend in the first direction DR1.

Lengths of two first sub-bypass lines DETL1 neighboring to each other in the second direction DR2 may be different from each other. For example, the first sub-bypass lines DETL1 may have lengths that decrease as they become close to the hole OH.

Lengths of two second sub-bypass lines DETL2 neighboring to each other in the first direction DR1 may be different from each other. For example, the second sub-bypass lines DETL2 may have lengths that decrease as they become close to the hole OH.

Lengths of two third sub-bypass lines DETL3 neighboring to each other in the second direction DR2 may be different from each other. For example, the third sub-bypass lines DETL3 may have lengths that decrease as they become close to the hole OH.

In each of the first area A1 and the third area A3, the second data lines DL2 may be connected to the first sub-bypass lines DETL1 through first bypass connection holes TCH1. In each of the first area A1 and the third area A3, the second sub-bypass lines DETL2 may be connected to the first sub-bypass lines DETL1 through second bypass connection holes TCH2.

The first bypass connection holes TCH1 may be arranged in the second diagonal direction DD2 and the second bypass connection holes TCH2 may be arranged in the first diagonal direction DD1. That is, the first bypass connection holes TCH1 and the second bypass connection holes TCH2 may be arranged in a "/\" shape, but an exemplary embodiment of the present disclosure is not limited thereto.

In each of the second area A2 and the fourth area A4, the second sub-bypass lines DETL2 may be connected to the third sub-bypass lines DETL3 through third bypass connection holes TCH3. In each of the second area A2 and the fourth area A4, the third data lines DL3 may be connected to the third sub-bypass lines DETL3 through fourth bypass connection holes TCH4.

The third bypass connection holes TCH3 may be arranged in the second diagonal direction DD2, and the fourth bypass connection holes TCH4 may be arranged in the first diagonal direction DD1. That is, the third bypass connection holes TCH3 and the fourth bypass connection holes TCH4 may be arranged in a "\/" shape, but an exemplary embodiment of the present disclosure is not limited thereto.

The plurality of second horizontal dummy patterns HDP2 may be disposed in the first area A1 and the third area A3. The plurality of second horizontal dummy patterns HDP2 may extend in the first direction DR1, and may be arranged in the second direction DR2. The plurality of second horizontal dummy patterns HDP2 and the plurality of second horizontal power supply lines HPL2 may be alternately disposed in the second direction DR2. Lengths of two second horizontal dummy patterns HDP2 neighboring to each other in the second direction DR2 may be different from each other. For example, the second horizontal dummy patterns HDP2 may have lengths that increase as they become close to the hole OH.

The plurality of second horizontal dummy patterns HDP2 may be connected to the first vertical power supply lines VPL1 through fifth power holes PH5, respectively. The fifth power holes PH5 may be arranged in the second direction DR2. The fifth power holes PH5 may be disposed adjacent to a boundary between the first area A1 and the third area A3. The fifth power holes PH5 may overlap the center OHC of the hole OH in the second direction DR2.

The plurality of third horizontal dummy patterns HDP3 may be disposed in the second area A2 and the fourth area A4. The plurality of third horizontal dummy patterns HDP3 may extend in the first direction DR1 and may be arranged in the second direction DR2. The plurality of third horizontal dummy patterns HDP3 and the plurality of second horizontal power supply lines HPL2 may be alternately disposed in the second direction DR2. Lengths of two third horizontal dummy patterns HDP3 neighboring to each other in the second direction DR2 may be different from each other. For example, the third horizontal dummy patterns HDP3 may have lengths that increase as they become close to the hole OH.

The plurality of third horizontal dummy patterns HDP3 may be connected to the second vertical power supply lines VPL2 through sixth power holes PH6, respectively. The sixth power holes PH6 may be arranged in the second direction DR2. The sixth power holes PH6 may be disposed adjacent to a boundary between the second area A2 and the fourth area A4. The sixth power holes PH6 may be disposed in a line extending in the second direction DR2 and overlapping the center OHC of the hole OH. Each of the second data lines DL2, the third data lines DL3, the first vertical power supply lines VPL1, the second vertical power supply lines VPL2, and the second sub-bypass lines DETL2 may include first line portions having a first width and second line portions having a second width greater than the first width. The first line portions and the second line portions may be alternately disposed in the second direction DR2. Some of the second line portions may overlap the first sub-bypass lines DETL1, the third sub-bypass lines DETL3, or the first horizontal dummy patterns HDP1, and the others of the second line portions may not overlap the first sub-bypass lines DETL1, the third sub-bypass lines DETL3, or the first horizontal dummy patterns HDP1.

Each of the first sub-bypass lines DETL1, the third sub-bypass lines DETL3, the first horizontal power supply lines HPL1, and the second horizontal dummy patterns HDP2 may include third line portions having a third width and fourth line portions having a fourth width greater than the third width. The third line portions and the fourth line portions may be alternately disposed in the first direction DR1. Each of the fourth line portions may overlap the second data line DL2, the third data line DL3, the first vertical power supply line VPL1, the second vertical power supply line VPL2, and the second sub-bypass line DETL2.

One end of the second sub-bypass line DETL2 may be disposed to be spaced apart from the first vertical power supply line VPL1 neighboring thereto. A fifth spacing portion SU5 between one end of the second sub-bypass line DETL2 and the first vertical power supply line VPL1 neighboring thereto along the second direction may overlap the second horizontal power supply line HPL2. The fifth spacing portion SU5 may be substantially the same as the first spacing portion SU1 described with reference to FIG. 10.

In addition, a sixth spacing portion SU6 between the one end of the second sub-bypass line DETL2 and the first vertical power supply line VPL1 neighboring thereto may not overlap the first horizontal power supply line HPL1 and the second horizontal power supply line HPL2. The sixth spacing portion SU6 may be substantially the same as the second spacing portion SU2 described with reference to FIGS. 11 and 12.

A seventh spacing portion SU7 is disposed between one end of the first sub-bypass line DETL1 and the first horizontal power supply line HPL1. The seventh spacing portion SU7 may not overlap other lines or electrodes.

An eighth spacing portion SU8 is disposed between the other end of the first sub-bypass line DETL1 and the second horizontal dummy pattern HDP2. The eighth spacing portion SU8 may not overlap other lines or electrodes.

A ninth spacing portion SU9 may be disposed between the second sub-bypass line DETL2 and the second vertical dummy pattern VDP2 along the second direction DR2, and may overlap the second horizontal power supply line HPL2.

A tenth spacing portion SU10 may be disposed between the second sub-bypass line DETL2 and the second vertical dummy pattern VDP2 along the second direction DR2, and may not overlap the first horizontal power supply line HPL1 and the second horizontal power supply line HPL2.

An eleventh spacing portion SU11 is disposed between one end of the third sub-bypass line DETL3 and the first horizontal power supply line HPL1 along the first direction DR1. The eleventh spacing portion SU11 may not overlap other lines or electrodes.

A twelfth spacing portion SU12 is disposed between the other end of the third sub-bypass line DETL3 and the third horizontal dummy pattern HDP3 along the first direction DR1. The twelfth spacing portion SU12 may not overlap other lines or electrodes. In addition, one end of the first sub-bypass line DETL1 and the first horizontal power supply line HPL1 neighboring thereto may be disposed to be spaced apart from each other. The seventh spacing portion SU7 between one end of the first sub-bypass line DETL1 and the first horizontal power supply line HPL1 neighboring thereto along the first direction DR1 may be disposed between the second data line DL2 and the second sub-bypass line DETL2 neighboring to each other.

In addition, the other end of the first sub-bypass line DETL1 and the second horizontal dummy pattern HDP2 neighboring thereto along the first direction DR1 may be disposed to be spaced apart from each other. The eighth spacing portion SU8 between one end of the first sub-bypass line DETL1 and the second horizontal dummy pattern HDP2 neighboring thereto along the first direction DR1 may be disposed between the second data line DL2 and the first vertical power supply line VPL1 neighboring to each other.

In addition, one end of the third sub-bypass line DETL3 and the first horizontal power supply line HPL1 neighboring thereto along the first direction DR1 may be disposed to be spaced apart from each other. The eleventh spacing portion SU11 between one end of the third sub-bypass line DETL3 and the first horizontal power supply line HPL1 neighboring thereto may be disposed between the third data line DL3 and the second sub-bypass line DETL2 neighboring to each other.

In addition, the other end of the third sub-bypass line DETL3 and the third horizontal dummy pattern HDP3 neighboring thereto along the first direction DR1 may be disposed to be spaced apart from each other. The twelfth spacing portion SU12 between the other end of the third sub-bypass line DETL3 and the third horizontal dummy pattern HDP3 neighboring thereto along the first direction DR1 may be disposed between the third data line DL3 and the second vertical power supply line VPL2 neighboring to each other.

The non-display area NDA may be disposed above the second area A2 and above the fourth area A4. The first power supply line PL1 and the second power supply line PL2 may be disposed in the non-display area NDA.

The second power supply line PL2 may extend in the first direction DR1 in the non-display area NDA. The second vertical power supply lines VPL2 and the second vertical dummy patterns VDP2 may be connected to power connection patterns VCP1 through second power connection holes PCH2, respectively, and the power connection patterns VCP1 may be connected to the second power supply line PL2 through first power connection holes PCH1. Accordingly, the second source voltage of the second power supply line PL2 may be applied to each of the second vertical power supply lines VPL2 and the second vertical dummy patterns VDP2.

In summary, as illustrated in FIGS. 4 and 22, the first vertical power supply lines VPL1 and the first vertical dummy patterns VDP1 disposed on one side of the hole OH are connected to the first power supply line PL1 on the lower side of the non-display area NDA, such that the first source voltage may be applied to the first vertical power supply lines VPL1 and the first vertical dummy patterns VDP1 disposed on one side of the hole OH. In contrast, as illustrated in FIG. 22, the second vertical power supply lines VPL2 and the second vertical dummy patterns VDP2 disposed on the other side of the hole OH are connected to the second power supply line PL2 on the upper side of the non-display area NDA, such that the second source voltage may be applied to the second vertical power supply lines VPL2 and the second vertical dummy patterns VDP2 disposed on the other side of the hole OH. That is, a source voltage applied to the first vertical power supply lines VPL1 and the first vertical dummy patterns VDP1 may be different from a source voltage applied to the second vertical power supply lines VPL2 and the second vertical dummy patterns VDP2.

The first power supply line PL1 may be disposed outside the second power supply line PL2. That is, in the non-display area NDA disposed above the second area A2 and above the fourth area A4, the first power supply line PL1 may be disposed above the second power supply line PL2.

Meanwhile, when the hole OH is disposed adjacent to the non-display area NDA, some of the second sub-bypass lines DETL2 and the third sub-bypass lines DETL3 may be disposed in the second area A2, and the others of the second sub-bypass lines DETL2 and the third sub-bypass lines DETL3 may be disposed in the non-display area NDA. The second sub-bypass lines DETL2 and the third sub-bypass lines DETL3 disposed in the non-display area NDA may be disposed between the first power supply line PL1 and the second power supply line PL2.

In order to minimize a width of the non-display area NDA, the second sub-bypass line DETL2 and the third sub-bypass line DETL3 neighboring to each other in the non-display area NDA may be disposed at different layers. In this case, the second sub-bypass line DETL2 may be connected to the third sub-bypass line DETL3 disposed at the same layer as the first sub-bypass line DETL1 through the third bypass connection hole TCH3. The third data line DL3 may be connected to the third sub-bypass line DETL3 disposed at the same layer as the first sub-bypass line DETL1 through the fourth bypass connection hole TCH4.

In addition, since the second sub-bypass line DETL2 and the third data line DL3 are disposed at the same layer, the second sub-bypass line DETL2 may be connected to the third data line DL3 without a separate connection hole.

Meanwhile, as illustrated in FIG. 24, the first vertical dummy patterns VDP1 disposed in the third display area DA3 may be directly connected to the first power supply line PL1 in the non-display area NDA.

Figure 25:
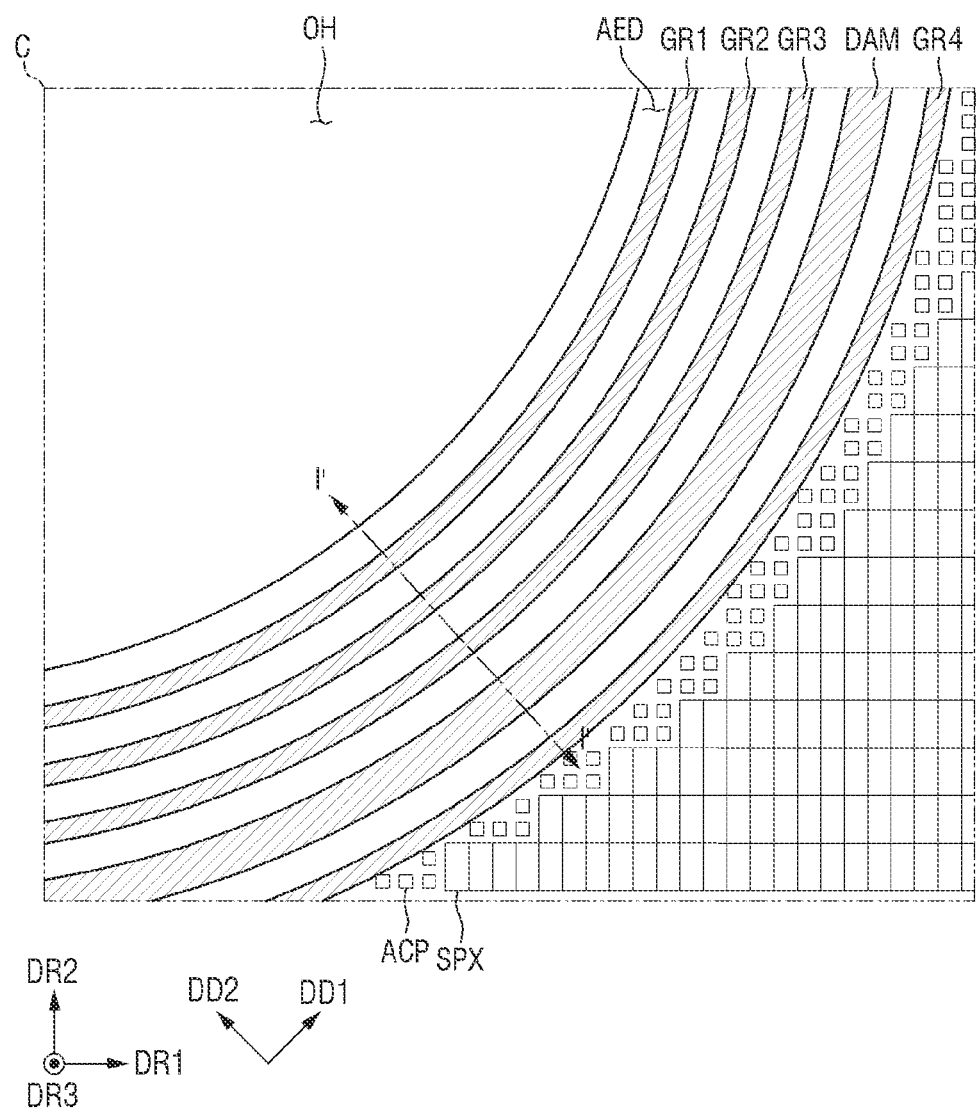
FIG. 25 is a layout diagram illustrating a hole of FIG. 22 in detail.
Figure 33:
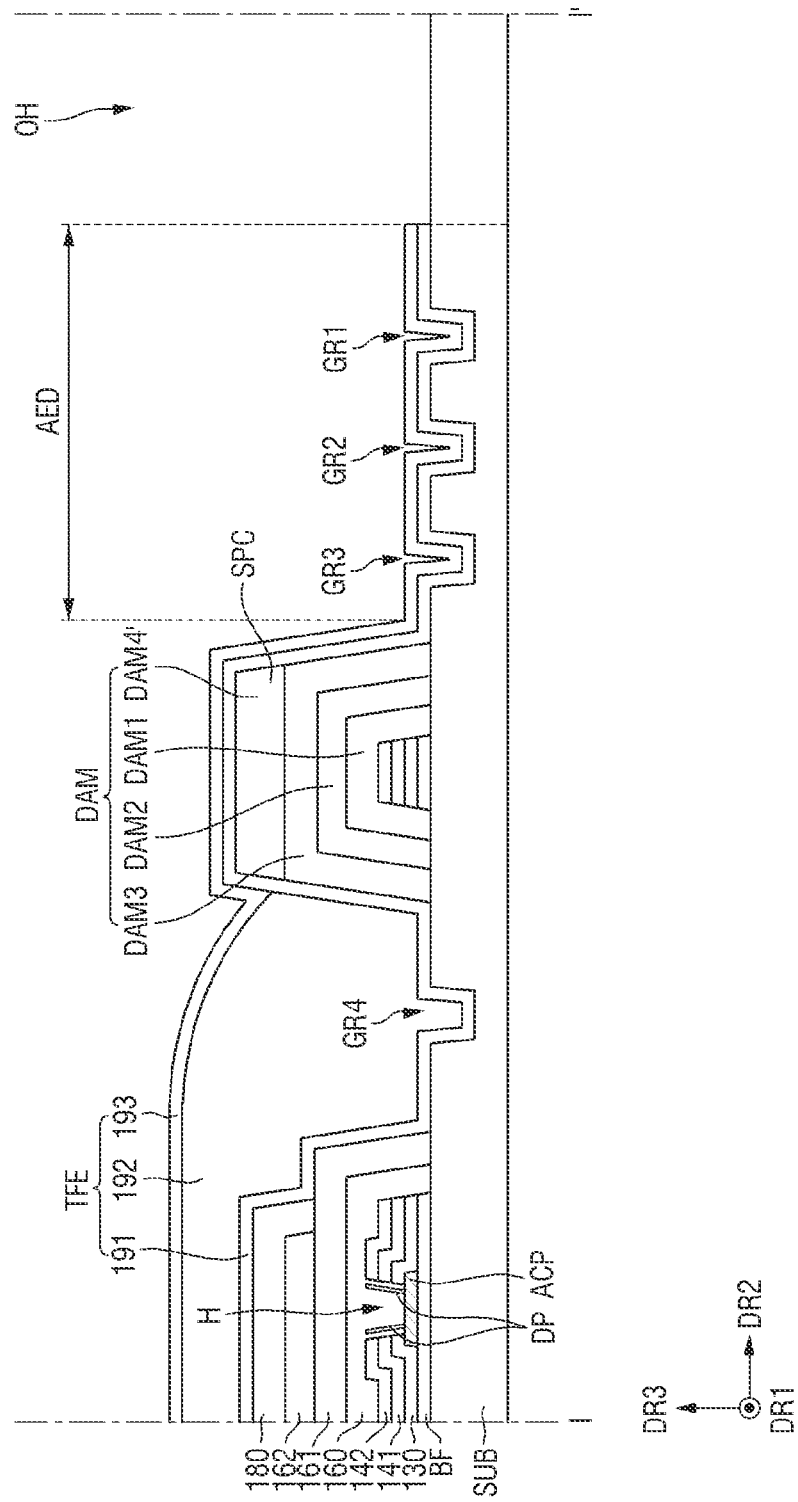
FIG. 33 is a cross-sectional view illustrating an example of the display panel taken along line H-H' of FIG. 25.

FIG. 25 is a layout diagram illustrating a portion of a hole of FIG. 22 in detail. FIG. 33 is a cross-sectional view illustrating an example of the display panel taken along line H-H' of FIG. 25.

Referring to FIGS. 25 and 33, the seventh display area DA7 may include an inorganic encapsulation area AED surrounding the hole OH.

The inorganic encapsulation area AED may include at least one dam DAM and a plurality of grooves GR1 to GR4 formed inside and outside the dam DAM. First to third grooves GR1 to GR3 may be disposed inside the dam DAM adjacent to the hole OH, and a fourth groove GR4 may be disposed outside the dam DAM. The first to third grooves GR1 to GR3 may be disposed between the dam DAM and the hole OH, and a fourth groove GR4 may be disposed between the dam DAM and sub-pixels SPX.

An organic film of an encapsulation layer TFE is blocked by the dam DAM not to flow toward the hole OH, and inorganic films of the encapsulation layer TFE are disposed inside the dam DAM, such that an inorganic encapsulation structure may be realized. The dam DAM may include a first dam DAM1 formed by the same process as a second planarization film 161 using the same material as the second planarization film 161, a second dam DAM2 formed by the same process as a third planarization film 162 using the same material as the third planarization film 162, a third dam DAM3 formed by the same process as a bank 180 using the same material as the bank 180, and a fourth dam DAM4 formed by the same process as a spacer SPC using the same material as the spacer SPC. The first to fourth grooves GR1 to GR4 may be formed by removing portions of an upper surface of a substrate SUB and may be recessed portions of the substrate SUB.

In addition, since a line bypass part bypassing the hole OH may not be disposed in areas surrounding the hole OH due to the bypass lines DETL, the sub-pixels SPX may be disposed close to the hole OH immediately adjacent to the inorganic encapsulation area AED. Therefore, a distance between the hole OH and an area in which the sub-pixels SPX are disposed may be minimized, and thus, it is possible to suppress an area between the hole OH and the sub-pixels SPX from being recognized by a user as the non-display area.

Meanwhile, active patterns ACP may be disposed in a space between the sub-pixels SPX and the hole OH. In addition, as illustrated in FIG. 33, exposure holes H formed through a gate insulating film 130, a first interlayer insulating film 141, and a second interlayer insulating film 142 to expose the active patterns ACP may be formed. Since a pattern density of active layers formed in the sub-pixels SPX may be uniformly maintained due to the active patterns ACP and the exposure holes H, it is possible to prevent the active layers or contact holes formed in the sub-pixels SPX from being over-etched.

In addition, dummy patterns DP may be disposed in the exposure hole H. The dummy patterns DP may be disposed to be spaced apart from sidewalls of the gate insulating film 130, the first interlayer insulating film 141, and the second interlayer insulating film 142. The dummy patterns DP may be the remainders of a first data metal layer DTL1. It has been illustrated in FIG. 33 that the dummy patterns DP are disposed adjacent to both sidewalls of the gate insulating film 130, the first interlayer insulating film 141, and the second interlayer insulating film 142 in the exposure hole H, but an exemplary embodiment of the present disclosure is not limited thereto. For example, the dummy patterns DP may be disposed adjacent to only one sidewalls of the gate insulating film 130, the first interlayer insulating film 141, and the second interlayer insulating film 142 in the exposure hole H or may not be disposed in the exposure hole H.

In addition, the active patterns ACP may be disposed between the first power supply line PL1 and the second power supply line PL2 in the non-display area NDA as illustrated in FIG. 24. For example, the active patterns ACP may be disposed adjacent to the second sub-bypass lines DETL2 and the third sub-bypass lines DETL3 disposed in the non-display area NDA.

Figure 26:
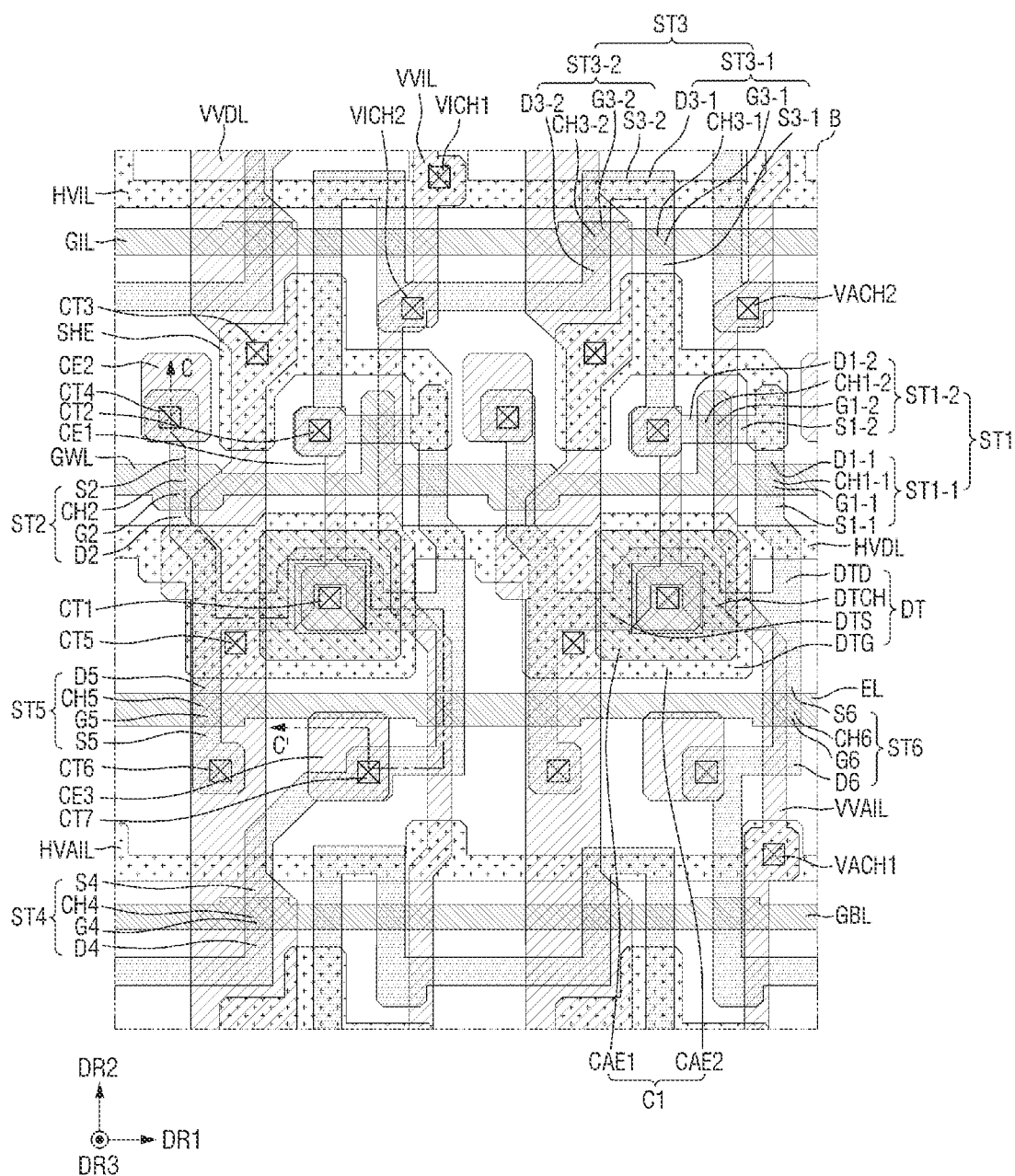
FIG. 26 is a layout diagram illustrating an example of area B of FIG. 23 in detail.
Figure 27:
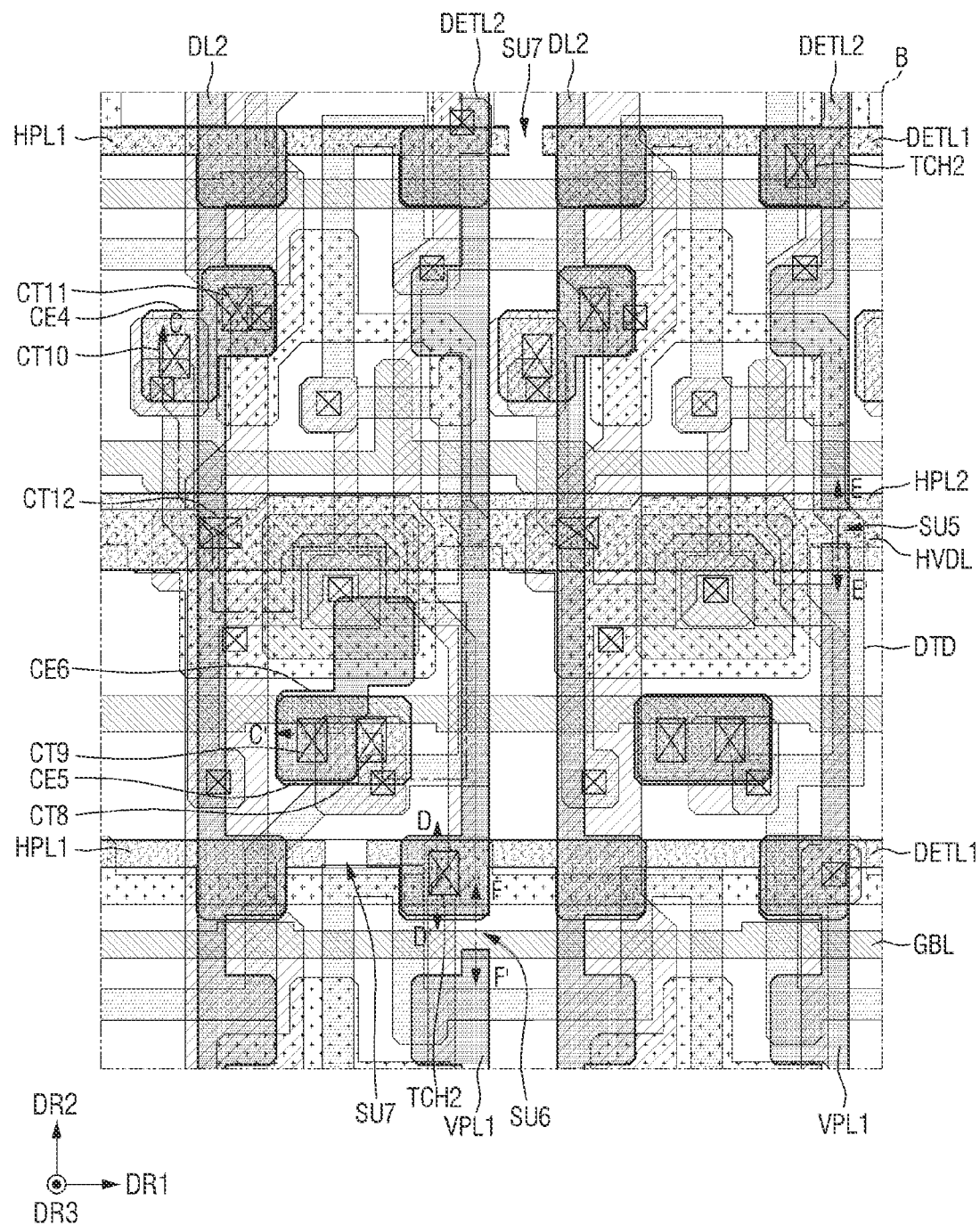
FIG. 27 is a layout diagram illustrating an example of area B of FIG. 23 in detail.

FIGS. 26 and 27 are layout diagrams illustrating examples of an area B of FIG. 23 in detail.

An active layer, a first gate layer, a second gate layer, and a first source/drain layer of a pixel driving circuit PDU are illustrated in FIG. 26, and an active layer, a first gate layer, a second gate layer, a first source/drain layer, a second source/drain layer, and a third source/drain layer of a pixel driving circuit PDU are illustrated in FIG. 27.

Referring to FIGS. 26 and 27, scan write lines GWL, the scan initialization lines GIL, scan bias lines GBL, and emission lines EL may extend in the first direction DR1. In addition, first horizontal initialization lines HVIL, second horizontal initialization lines HVAIL, first horizontal power supply lines HPL1, second horizontal power supply lines HPL2, horizontal driving voltage lines HVDL, and first sub-bypass lines DETL1 may extend in the first direction DR1.

First vertical initialization lines VVIL, second vertical initialization lines VVAIL, and vertical driving voltage lines VVDL may extend in the second direction DR2. In addition, second data lines DL2 and first vertical power supply lines VPL1 may extend in the second direction DR2.

The pixel driving circuit PDU may include a driving transistor DT, first to sixth transistors ST1 to ST6, a capacitor C1, and connection electrodes CE1 to CE6. The first transistor ST1 may include a first-first transistor ST1-1 and a first-second transistor ST1-2. The third transistor ST3 may include a third-first transistor ST3-1 and a third-second transistor ST3-2.

The driving transistor DT may include a channel layer DTCH, a gate electrode DTG, a first electrode DTS, and a second electrode DTD. The channel layer DTCH of the driving transistor DT may overlap the gate electrode DTG of the driving transistor DT. The gate electrode DTG of the driving transistor DT may be disposed on the channel layer DTCH of the driving transistor DT.

The gate electrode DTG of the driving transistor DT may be connected to a first connection electrode CE1 through a first contact hole CT1. The first connection electrode CE1 may be connected to a second electrode D1-2 of the first-second transistor ST1-2 through a second contact hole CT2. The first connection electrode CE1 may cross a k-th scan write line GWL.

The first electrode DTS of the driving transistor DT may be connected to a second electrode D2 of the second transistor ST2 and a second electrode D5 of the fifth transistor ST5.

The second electrode DTD of the driving transistor DT may be connected to a first electrode S1-1 of the first-first transistor ST1-1 and a first electrode S6 of the sixth transistor ST6.

The first-first transistor ST1-1 may include a channel layer CH1-1, a gate electrode G1-1, the first electrode S1-1, and a second electrode D1-1. The channel layer CH1-1 of the first-first transistor ST1-1 may overlap the gate electrode G1-1 of the first-first transistor ST1-1. The gate electrode G1-1 of the first-first transistor ST1-1 may be formed integrally with the scan write line GWL. The gate electrode G1-1 of the first-first transistor ST1-1 may be a portion of the scan write line GWL. The first electrode S1-1 of the first-first transistor ST1-1 may be connected to the second electrode DTD of the driving transistor DT. The second electrode D1-1 of the first-first transistor ST1-1 may be connected to a first electrode S1-2 of the first-second transistor ST1-2.

The second-second transistor ST1-2 may include a channel layer CH1-2, a gate electrode G1-2, the first electrode S1-2, and the second electrode D1-2. The channel layer CH1-2 of the first-second transistor ST1-2 may overlap the gate electrode G1-2 of the first-second transistor ST1-2. The gate electrode G1-2 of the first-second transistor ST1-2 may be formed integrally with the scan write line GWL. The gate electrode G1-2 of the first-second transistor ST1-2 may protrude from the scan write line GWL in the second direction DR2. The first electrode S1-2 of the first-second transistor ST1-2 may be connected to the second electrode D1-1 of the first-first transistor ST1-1. The second electrode D1-2 of the first-second transistor ST1-2 may be connected to the first connection electrode CE1.

The second transistor ST2 may include a channel layer CH2, a gate electrode G2, a first electrode S2, and the second electrode D2. The channel layer CH2 of the second transistor ST2 may overlap the gate electrode G2 of the second transistor ST2. The gate electrode G2 of the second transistor ST2 may be formed integrally with the scan write line GWL. The gate electrode G2 of the second transistor ST2 may be a portion of the scan write line GWL. The first electrode S1 of the second transistor ST2 may be connected to a second connection electrode CE2 through a fourth contact hole CT4. The second electrode D2 of the second transistor ST2 may be connected to the first electrode DTS of the driving transistor DT.

The third-first transistor ST3-1 may include a channel layer CH3-1, a gate electrode G3-1, a first electrode S3-1, and a second electrode D3-1. The channel layer CH3-1 of the third-first transistor ST3-1 may overlap the gate electrode G3-1 of the third-first transistor ST3-1. The gate electrode G3-1 of the third-first transistor ST3-1 may be formed integrally with the scan initialization line GIL. The gate electrode G3-1 of the third-first transistor ST3-1 may be a portion of the scan initialization line GIL. The first electrode S3-1 of the third-first transistor ST3-1 may be connected to the first connection electrode CE1. The second electrode D3-1 of the third-first transistor ST3-1 may be connected to a first electrode S3-2 of the third-second transistor ST3-2.

The third-second transistor ST3-2 may include a channel layer CH3-2, a gate electrode G3-2, the first electrode S3-2, and a second electrode D3-2. The channel layer CH3-2 of the third-second transistor ST3-2 may overlap the gate electrode G3-2 of the third-second transistor ST3-2. The gate electrode G3-2 of the third-second transistor ST3-2 may be formed integrally with the scan initialization line GIL. The gate electrode G3-2 of the third-second transistor ST3-2 may be a portion of the scan initialization line GIL. The first electrode S3-2 of the third-second transistor ST3-2 may be connected to the second electrode D3-1 of the third-first transistor ST3-1. The second electrode D3-2 of the third-second transistor ST3-2 may be connected to the first vertical initialization line VVIL through a second initialization contact hole VICH2.

The fourth transistor ST4 may include a channel layer CH4, a gate electrode G4, a first electrode S4, and a second electrode D4. The channel layer CH4 of the fourth transistor ST4 may overlap the gate electrode G4 of the fourth transistor ST4. The gate electrode G4 of the fourth transistor ST4 may be formed integrally with the scan bias line GBL. The gate electrode G4 of the fourth transistor ST4 may be a portion of the scan bias line GBL. A k-th scan bias line may be a k+1-th scan initialization line. The first electrode S4 of the fourth transistor ST4 may be connected to a third connection electrode CE3 through a seventh contact hole CH7. The second electrode D4 of the fourth transistor ST4 may be connected to the second vertical initialization line VVAIL through a fourth initialization contact hole VACH2.

The fifth transistor ST5 may include a channel layer CH5, a gate electrode G5, a first electrode S5, and the second electrode D5. The channel layer CH5 of the fifth transistor ST5 may overlap the gate electrode G5 of the fifth transistor ST5. The gate electrode G5 of the fifth transistor ST5 may be formed integrally with the emission line EML. The gate electrode G5 of the fifth transistor ST5 may be a portion of the emission line EML. The first electrode S5 of the fifth transistor ST5 may be connected to the vertical driving voltage line VVDL through a sixth contact hole CT6. The second electrode D5 of the fifth transistor ST5 may be connected to the first electrode DTS of the driving transistor DT.

The sixth transistor ST6 may include a channel layer CH6, a gate electrode G6, the first electrode S6, and a second electrode D6. The channel layer CH6 of the sixth transistor ST6 may overlap the gate electrode G6 of the sixth transistor ST6. The gate electrode G6 of the sixth transistor ST6 may be formed integrally with the emission line EML. The gate electrode G6 of the sixth transistor ST6 may be a portion of the emission line. The first electrode S6 of the sixth transistor ST6 may be connected to the second electrode DTD of the driving transistor DT. The second electrode D6 of the sixth transistor ST6 may be connected to the third connection electrode CE3 through the seventh contact hole CH7.

A first electrode CAE1 of the capacitor C1 may be formed integrally with the gate electrode DTG of the driving transistor DT. The first electrode CAE1 of the capacitor C1 may be a portion of the gate electrode DTG of the driving transistor DT. A second electrode CAE2 of the capacitor C1 may be formed integrally with the horizontal driving voltage line HVDL. The second electrode CAE2 of the capacitor C1 may be a portion of the horizontal driving voltage line HVDL. The second electrode CAE2 of the capacitor C1 may overlap the first electrode CAE1 of the capacitor C1 in a plan view. The horizontal driving voltage line HVDL may be connected to the vertical driving voltage line VVDL through a fifth contact hole CT5.

The first connection electrode CE1 may be connected to the gate electrode DTG of the driving transistor DT through the first contact hole CT1, and may be connected to the second electrode D1-2 of the first-second transistor ST1-2 and the first electrode S3-1 of the third-first transistor ST3-1 through the second contact hole CT2. The first connection electrode CE1 may extend in the second direction DR2. The first connection electrode CE1 may overlap the scan write line GWL and the horizontal driving voltage line HVDL.

The second connection electrode CE2 may be connected to the first electrode S2 of the second transistor ST2 through the fourth contact hole CT4. A fourth connection electrode CE4 may be connected to the second connection electrode CE2 through a tenth contact hole CT10. The second data line DL2 may be connected to the fourth connection electrode CE4 through an eleventh contact hole CT11.

The third connection electrode CE3 may be connected to the second electrode D6 of the sixth transistor ST6 through the seventh contact hole CT7. A fifth connection electrode CE5 may be connected to the third connection electrode CE3 through an eighth contact hole CT8. A sixth connection electrode CE6 may be connected to the fifth connection electrode CE5 through a ninth contact hole CT9.

A shielding electrode SHE may be connected to the vertical driving voltage line VVDL through a third contact hole CT3. The shielding electrode SHE may overlap the second electrode D1-2 of the first-first transistor ST1-1 and the first electrode S1-2 of the first-second transistor ST1-2. In addition, the shielding electrode SHE may overlap the first electrode S3-1 of the third-first transistor ST3-1.

The first horizontal initialization lines HVIL and the second horizontal initialization lines HVAIL may extend in the first direction DR1. The first horizontal initialization lines HVIL and the second horizontal initialization lines HVAIL may be alternately disposed in the second direction DR2.

The first vertical initialization lines VVIL and the second vertical initialization lines VVAIL may extend in the second direction DR2. The first vertical initialization lines VVIL and the second vertical initialization lines VVAIL may be alternately disposed in the second direction DR2.

The first vertical initialization line VVIL may be connected to the first horizontal initialization line HVIL through a first initialization contact hole VICH1. The first vertical initialization line VVIL may be connected to the second electrode D3-2 of the third transistor ST3-2 through the second initialization contact hole VICH2.

The second vertical initialization line VVAIL may be connected to the second horizontal initialization line HVAIL through a third initialization contact hole VACH1. The second vertical initialization line VVAIL may be connected to the second electrode D4 of the fourth transistor ST4 through the fourth initialization contact hole VACH2.

A first initialization voltage may be applied to the first horizontal initialization line HVIL and the first vertical initialization line VVIL, and a second initialization voltage may be applied to the second horizontal initialization line HVAIL and the second vertical initialization line VVAIL.

The first sub-bypass line DETL1 may be connected to the second sub-bypass line DETL2 through the second bypass connection hole TCH2.

The fifth spacing portion SU5 may be disposed between the second sub-bypass line DETL2 and the first vertical power supply line VPL1, and may overlap the second horizontal power supply line HPL2. In addition, the fifth spacing portion SU5 may overlap the horizontal driving voltage line HVDL and the second electrode DTD of the driving transistor DT.

The sixth spacing portion SU6 may be disposed between the second sub-bypass line DETL2 and the first vertical power supply line VPL1, and may overlap the scan bias line GBL.

Each of the seventh spacing portions SU7 is disposed between one end of the first sub-bypass line DETL1 and the first horizontal power supply line HPL1. The seventh spacing portions SU7 may not overlap other lines or electrodes.

Figure 29:
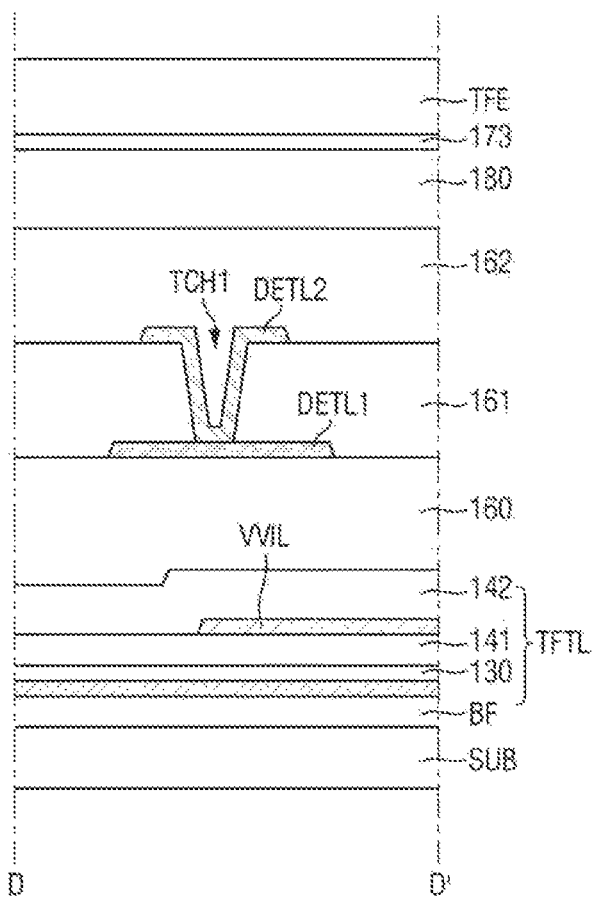
FIG. 29 is a cross-sectional view illustrating an example of the display panel taken along line D-D' of FIG. 27.
Figure 30:
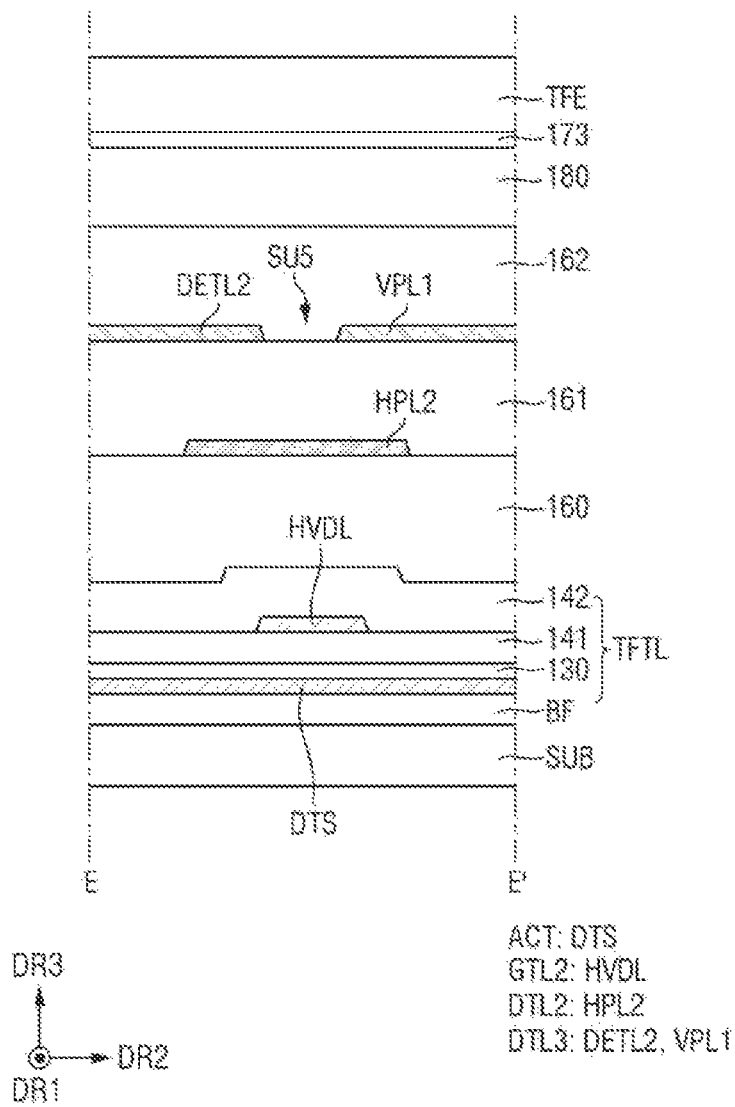
FIG. 30 is a cross-sectional view illustrating an example of the display panel taken along line E-E' of FIG. 27.
Figure 31:
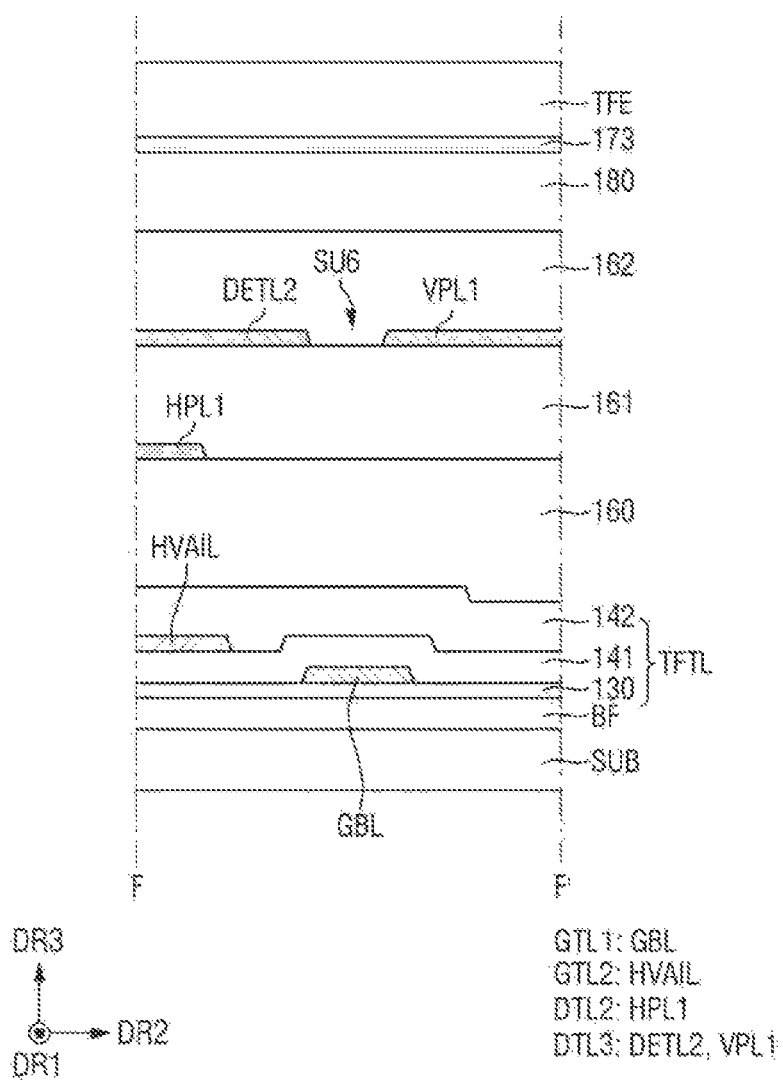
FIG. 31 is a cross-sectional view illustrating an example of the display panel taken along line F-F' of FIG. 27.

FIG. 28 is a cross-sectional view illustrating an example of the display panel taken along line C-C' of FIGS. 26 and 27. FIG. 29 is a cross-sectional view illustrating an example of the display panel taken along line D-D' of FIG. 27. FIG. 30 is a cross-sectional view illustrating an example of the display panel taken along line E-E' of FIG. 27. FIG. 31 is a cross-sectional view illustrating an example of the display panel taken along line F-F' of FIG. 27.

Referring to FIGS. 28 to 31, a thin film transistor layer TFTL may be disposed on a substrate SUB. The thin film transistor layer TFTL may be a layer at which a driving transistor DT, first to sixth transistors ST1 to ST6, and a capacitor C1 of each of pixel driving circuits PDU1 to PDU4 are formed.

The display panel 100 includes the substrate SUB, an active layer ACT, a first gate layer GTL1, a second gate layer GTL2, a first data metal layer DTL1, a second data metal layer DTL2, and a third data metal layer DTL3. In addition, the display panel 100 includes a buffer film BF, a gate insulating film 130, a first interlayer insulating film 141, a second interlayer insulating film 142, a first planarization film 160, a second planarization film 161, and a third planarization film 162.

The buffer film BF may be disposed on one surface of the substrate SUB. The buffer film BF may be formed on one surface of the substrate SUB in order to protect thin film transistors and an organic light emitting layer 172 of a light emitting element layer EML from moisture permeated through the substrate SUB which is vulnerable to moisture permeation. The buffer film BF may include a plurality of inorganic films that are alternately stacked. For example, the buffer film BF may be formed as a multiple film in which one or more inorganic films of a silicon nitride layer, a silicon oxynitride layer, a silicon oxide layer, a titanium oxide layer, and an aluminum oxide layer are alternately stacked. The buffer film BF may be omitted.

The active layer ACT may be disposed on the buffer film BF. The active layer ACT may include a silicon semiconductor such as polycrystalline silicon, single crystal silicon, low-temperature polycrystalline silicon, and amorphous silicon.

The active layer ACT may include the channel layer DTCH, the first electrode DTS, and the second electrode DTD of the driving transistor DT. The channel layer DTCH of the driving transistor DT may be a region overlapping the gate electrode DTG of the driving transistor DT in the third direction DR3 which is the thickness direction of the substrate SUB. The first electrode DTS of the driving transistor DT may be disposed on one side of the channel layer DTCH and the second electrode DTD may be disposed on the other side of the channel layer DTCH. The first electrode DTS and the second electrode DTD of the driving transistor DT may be regions that do not overlap the gate electrode DTG in the third direction DR3. The first electrode DTS and the second electrode DTD of the driving transistor DT may be regions having conductivity by doping a silicon semiconductor with ions or impurities.

In addition, the active layer ACT may further include channel layers CH1 and CH4 to CH6, first electrodes S1 and S4 to S6, and second electrodes D1 and D4 to D6 of the first and fourth to sixth transistors ST1 and ST4 to ST6. Each of the channel layers CH1 and CH4 to CH6 of the first and fourth to sixth transistors ST1 and ST4 to ST6 may overlap a corresponding gate electrode of the gate electrodes G1 and G4 to G6 in the third direction DR3. The first electrodes S1 and S4 to S6 and the second electrodes D1 and D4 to D6 of the first and fourth to sixth transistors ST1 and ST4 to ST6 may be regions having conductivity by doping silicon semiconductors with ions or impurities.

The gate insulating film 130 may be disposed on the active layer ACT. The gate insulating film 130 may be formed as an inorganic film, for example, a silicon nitride layer, a silicon oxynitride layer, a silicon oxide layer, a titanium oxide layer, or an aluminum oxide layer.

The first gate layer GTL1 may be disposed on the gate insulating film 130. The first gate layer GTL1 may include the gate electrode DTG of the driving transistor DT. In addition, the first gate layer GTL1 may further include the gate electrodes G1 to G6 of the first to sixth transistors ST1 to ST6, the first capacitor electrode CAE1, the scan write lines GWL, the scan initialization lines GIL, the scan bias lines GBL, and the emission lines EL. The first gate layer GTL1 may be formed as a single layer or a multiple layer made of any one of molybdenum (Mo), aluminum (Al), chromium (Cr), gold (Au), titanium (Ti), nickel (Ni), neodymium (Nd), and copper (Cu), or alloys thereof.

The first interlayer insulating film 141 may be disposed on the first gate layer GTL1. The first interlayer insulating film 141 may be formed as an inorganic film, for example, a silicon nitride layer, a silicon oxynitride layer, a silicon oxide layer, a titanium oxide layer, or an aluminum oxide layer.

The second gate layer GTL2 may be disposed on the first interlayer insulating film 141. The second gate layer GTL2 may include the second capacitor electrode CAE2, the shielding electrode SHE, the horizontal driving voltage line HVDL, the first horizontal initialization line HVIL, and the second horizontal initialization line HVAIL. The second gate layer GTL2 may be formed as a single layer or a multiple layer made of any one of molybdenum (Mo), aluminum (Al), chromium (Cr), gold (Au), titanium (Ti), nickel (Ni), neodymium (Nd), and copper (Cu), or alloys thereof.

The second interlayer insulating film 142 may be disposed on the second gate layer GTL2. The second interlayer insulating film 142 may be formed as an inorganic film, for example, a silicon nitride layer, a silicon oxynitride layer, a silicon oxide layer, a titanium oxide layer, or an aluminum oxide layer.

The first data metal layer DTL1 including the first to third connection electrodes CE1, CE2, and CE3, the vertical driving voltage line VVDL, the first vertical initialization line VVIL, and the second vertical initialization line VVAIL may be disposed on the second interlayer insulating film 142. The first data metal layer DTL1 may be formed as a single layer or a multiple layer made of any one of molybdenum (Mo), aluminum (Al), chromium (Cr), gold (Au), titanium (Ti), nickel (Ni), neodymium (Nd), and copper (Cu), or alloys thereof.

The first connection electrode CE1 may be connected to the gate electrode DTG of the driving transistor DT through the first contact hole CT1 formed through the first interlayer insulating film 141 and the second interlayer insulating film 142. The first connection electrode CE1 may be connected to the second electrode D1-2 of the first-second transistor ST1-2 and the first electrode S3-1 of the third-first transistor ST3-1 through the second contact hole CT2 formed through the gate insulating film 130, the first interlayer insulating film 141, and the second interlayer insulating film 142. The second connection electrode CE2 may be connected to the first electrode S2 of the second transistor ST2 through the fourth contact hole CT4 formed through the gate insulating film 130, the first interlayer insulating film 141, and the second interlayer insulating film 142. The third connection electrode CE3 may be connected to the second electrode D6 of the sixth transistor ST6 through the seventh contact hole CT7 formed through the gate insulating film 130, the first interlayer insulating film 141, and the second interlayer insulating film 142.

The vertical driving voltage line VVDL may be connected to the shielding electrode SHE through the third contact hole CT3 formed through the second interlayer insulating film 142. The vertical driving voltage line VVDL may be connected to the horizontal driving voltage line HVDL through the fifth contact hole CT5 formed through the second interlayer insulating film 142. The vertical driving voltage line VVDL may be connected to the first electrode S5 of the fifth transistor ST5 through the sixth contact hole CT6 formed through the gate insulating film 130, the first interlayer insulating film 141, and the second interlayer insulating film 142. Accordingly, the second source voltage may be applied to the shielding electrode SHE, the horizontal driving voltage line HVDL, and the first electrode S5 of the fifth transistor ST5.

The first planarization film 160 for planarizing a step due to the active layer ACT, the first gate layer GTL1, the second gate layer GTL2, and the first data metal layer DTL1 may be formed on the first data metal layer DTL1. The first planarization film 160 may be formed as an organic film made of an acrylic resin, an epoxy resin, a phenolic resin, a polyamide resin, a polyimide resin, or the like.

The second data metal layer DTL2 may be formed on the first planarization film 160. The second data metal layer DTL2 may include the fourth connection electrode CE4, the fifth connection electrode CE5, the first sub-bypass lines DETL1, the first horizontal power supply lines HPL1, and the second horizontal power supply lines HPL2. In addition, the second data metal layer DTL2 may further include the second data connection lines DCL2, the first horizontal dummy patterns HDP1, and the second horizontal dummy patterns HDP2. The second data metal layer DTL2 may be formed as a single layer or a multiple layer made of any one of molybdenum (Mo), aluminum (Al), chromium (Cr), gold (Au), titanium (Ti), nickel (Ni), neodymium (Nd), and copper (Cu), or alloys thereof.

The fourth connection electrode CE4 may be connected to the second connection electrode CE2 through the tenth contact hole CT10 formed through the first planarization film 160. The fifth connection electrode CE5 may be connected to the third connection electrode CE3 through the eighth contact hole CT8 formed through the first planarization film 160. The second horizontal power supply line HPL2 may be connected to the vertical driving voltage line VVDL through a twelfth contact hole CT12 formed through the first planarization film 160.

The second planarization film 161 for planarizing a step may be formed on the second data metal layer DTL2. The second planarization film 161 may be formed as an organic film made of an acrylic resin, an epoxy resin, a phenolic resin, a polyamide resin, a polyimide resin, or the like.

The third data metal layer DTL3 may be formed on the second planarization film 161. The third data metal layer DTL3 may include the sixth connection electrode CE6, the second data lines DL2, the second sub-bypass lines DETL2, and the first vertical power supply lines VPL1. In addition, the third data metal layer DTL3 may include the first data lines DL1, the third data lines DL3, the second vertical power supply lines VPL2, the first vertical dummy patterns VDP1, and the second vertical dummy patterns VDP2. The third data metal layer DTL3 may be formed as a single layer or a multiple layer made of any one of molybdenum (Mo), aluminum (Al), chromium (Cr), gold (Au), titanium (Ti), nickel (Ni), neodymium (Nd), and copper (Cu), or alloys thereof.

The sixth connection electrode CE6 may be connected to the fifth connection electrode CE5 through the ninth contact hole CT9 formed through the second planarization film 161. The second data line DL2 may be connected to the fourth connection electrode CE4 through the eleventh contact hole CT11 formed through the second planarization film 161.

The second sub-bypass line DETL2 may be connected to the first sub-bypass line DETL1 through the second bypass connection hole TCH2 formed through the second planarization film 161. Similarly, the second data line DL2 may be connected to the first sub-bypass line DETL1 through the first bypass connection hole TCH1 formed through the second planarization film 161.

In addition, the second sub-bypass line DETL2 may be connected to the third sub-bypass line DETL3 disposed in the seventh display area DA7 through the third bypass connection hole TCH3 formed through the second planarization film 161. The third data line DL3 may be connected to the third sub-bypass line DETL3 disposed in the seventh display area DA7 through the fourth bypass connection hole TCH4 formed through the second planarization film 161. A connection between the second sub-bypass line DETL2 and the third sub-bypass line DETL3 disposed in the non-display area NDA and a connection between the third data line DL3 and the third sub-bypass line DETL3 disposed in the non-display area NDA will be described in detail with reference to FIG. 32.

The third planarization film 162 for planarizing a step may be formed on the third data metal layer DTL3. The third planarization film 162 may be formed as an organic film made of an acrylic resin, an epoxy resin, a phenolic resin, a polyamide resin, a polyimide resin, or the like.

Light emitting elements 170 and a bank 180 may be disposed on the third planarization film 162. Each of the light emitting elements 170 may include a pixel electrode 171, an organic light emitting layer 172, and a common electrode 173. The light emitting elements 170 may share a common electrode 173.

The pixel electrode 171 of each of the light emitting elements 170 may be formed on the third planarization film 162. The pixel electrode 171 of each of the light emitting elements 170 may be connected to the sixth connection electrode CE6 through a pixel contact hole ANCT formed through the third planarization film 162. The pixel electrode 171 of each of the light emitting elements 170 may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

The bank 180 may be a pixel defining film or a light emitting area defining film defining light emitting areas EA. The bank 180 may partition the light emitting areas EA. Each of the light emitting areas EA refers to an area in which the pixel electrode 171, the organic light emitting layer 172, and the common electrode 173 are sequentially stacked and holes from the pixel electrode 171 and electrons from the common electrode 173 are recombined with each other in the organic light emitting layer 172 to emit light.

The bank 180 may be formed to cover an edge of the pixel electrode 171 of each of the light emitting elements 170. The bank 180 may be formed as an organic film made of an acrylic resin, an epoxy resin, a phenolic resin, a polyamide resin, a polyimide resin, or the like.

A spacer SPC for mounting a mask in a manufacturing process may be disposed on the bank 180. The spacer SPC may be formed as an organic film made of an acrylic resin, an epoxy resin, a phenolic resin, a polyamide resin, a polyimide resin, or the like.

The organic light emitting layer 172 is formed on the pixel electrode 171 of each of the light emitting elements 170. The organic light emitting layer 172 may include an organic material to emit light of a predetermined color. For example, the organic light emitting layer 172 may include a hole transporting layer, an organic material layer, and an electron transporting layer.

The common electrode 173 may be disposed on the organic light emitting layer 172 and the bank 180. The common electrode 173 may be formed to cover the organic light emitting layer 172. The common electrode 173 may be formed in common to the light emitting areas EA. A capping layer may be formed on the common electrode 173.

In a top emission structure, the common electrode 173 may be formed of a transparent conductive material (TCO) such as ITO or indium zinc oxide (IZO) capable of transmitting light therethrough or a semi-transmissive conductive material such as magnesium (Mg), silver (Ag), or an alloy of magnesium (Mg) and silver (Ag). When the common electrode 173 is formed of the semi-transmissive conductive material, emission efficiency of each of the light emitting areas EA may be increased by a micro cavity.

An encapsulation layer TFE may be formed on the light emitting elements 170. The encapsulation layer TFE may include at least one inorganic film in order to prevent oxygen or moisture from penetrating into the light emitting element layer EML. In addition, the encapsulation layer TFE may include at least one organic film in order to protect the light emitting element layer EML from foreign materials such as dust.

Meanwhile, it has been illustrated in an exemplary embodiment of FIGS. 28 to 31 that the display panel 100 includes the third data metal layer DTL3, but the third data metal layer DTL3 may be omitted in the display panel 100. In this case, the second data connection lines DCL2, the first sub-bypass lines DETL1, the first horizontal power supply lines HPL1, the second horizontal power supply lines HPL2, and the first horizontal dummy pattern HDP1, or the second horizontal dummy patterns HDP2 may be included in the first data metal layer DTL1 or be omitted. In addition, the first data lines DL1, the second data lines DL2, the third data lines DL3, the first data connection lines DCL1, the second sub-bypass lines DETL2, the first vertical power supply lines VPL1, the second vertical power supply lines VPL2, the first vertical dummy patterns VDP1, and the second vertical dummy patterns VDP2 may be formed to be included in the second data metal layer DTL2.

Figure 32:
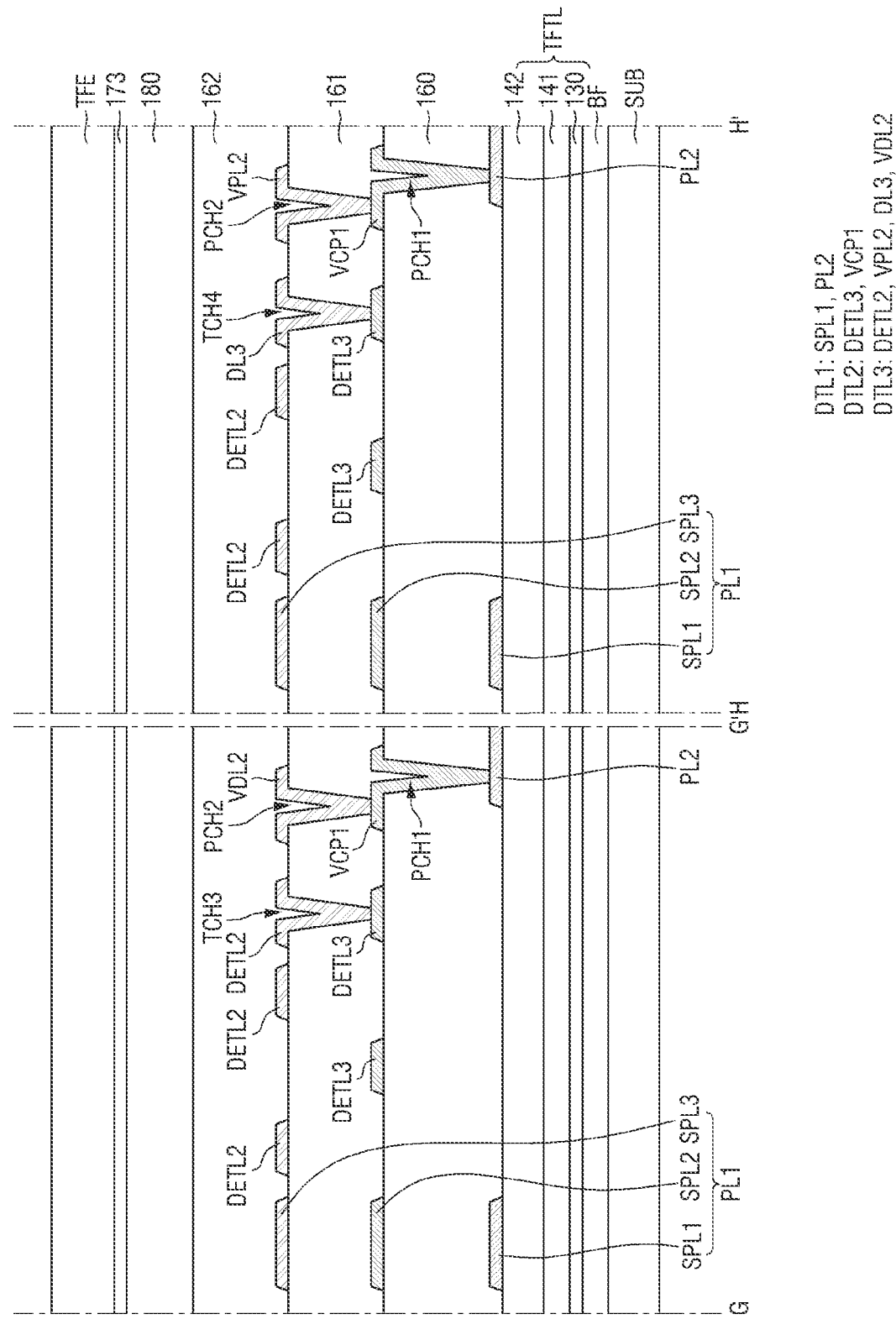
FIG. 32 is a cross-sectional view illustrating an example of the display panel taken along line G-G' of FIG. 24.

FIG. 32 is a cross-sectional view illustrating an example of the display panel taken along line G-G' of FIG. 24.

Referring to FIG. 32, the first power supply line PL1 may include a first sub-power supply line SPL1, a second sub-power supply line SPL2, and a third sub-power supply line SPL3.

The first data metal layer DTL1 may include the first sub-power supply line SPL1 and the second power supply line PL2. The second data metal layer DTL2 may further include the second sub-power supply line SPL2, the third sub-bypass lines DETL3, and the power connection pattern VCP1. The third data metal layer DTL3 may further include the third sub-power supply line SPL3, the second sub-bypass lines DETL2, the third data line DL3, and the second vertical power supply line VPL2.

The power connection pattern VCP1 may be connected to the second power supply line VDP2 through the first power connection hole PCH1 formed through the first planarization film 160.

The second sub-bypass line DETL2 may be connected to the third sub-bypass line DETL3 through the third bypass connection hole TCH3 formed through the second planarization film 161. Similarly, the third data line DL3 may be connected to the third sub-bypass line DETL3 through the fourth bypass connection hole TCH4 formed through the second planarization film 161.

The second vertical dummy pattern VDP2 may be connected to the power connection pattern VCP1 through the second power connection hole PCH2 formed through the second planarization film 161. Similarly, the second vertical power supply line VPL2 may be connected to the power connection pattern VCP1 through the second power connection hole PCH2 formed through the second planarization film 161.

The second sub-bypass line DETL2 and the third sub-bypass line DETL3 neighboring to each other may not overlap each other in the third direction DR3. That is, a width of the non-display area NDA may be minimized by alternately disposing the second sub-bypass lines DETL2 and the third sub-bypass lines DETL3 in the non-display area NDA.

Figure 34:
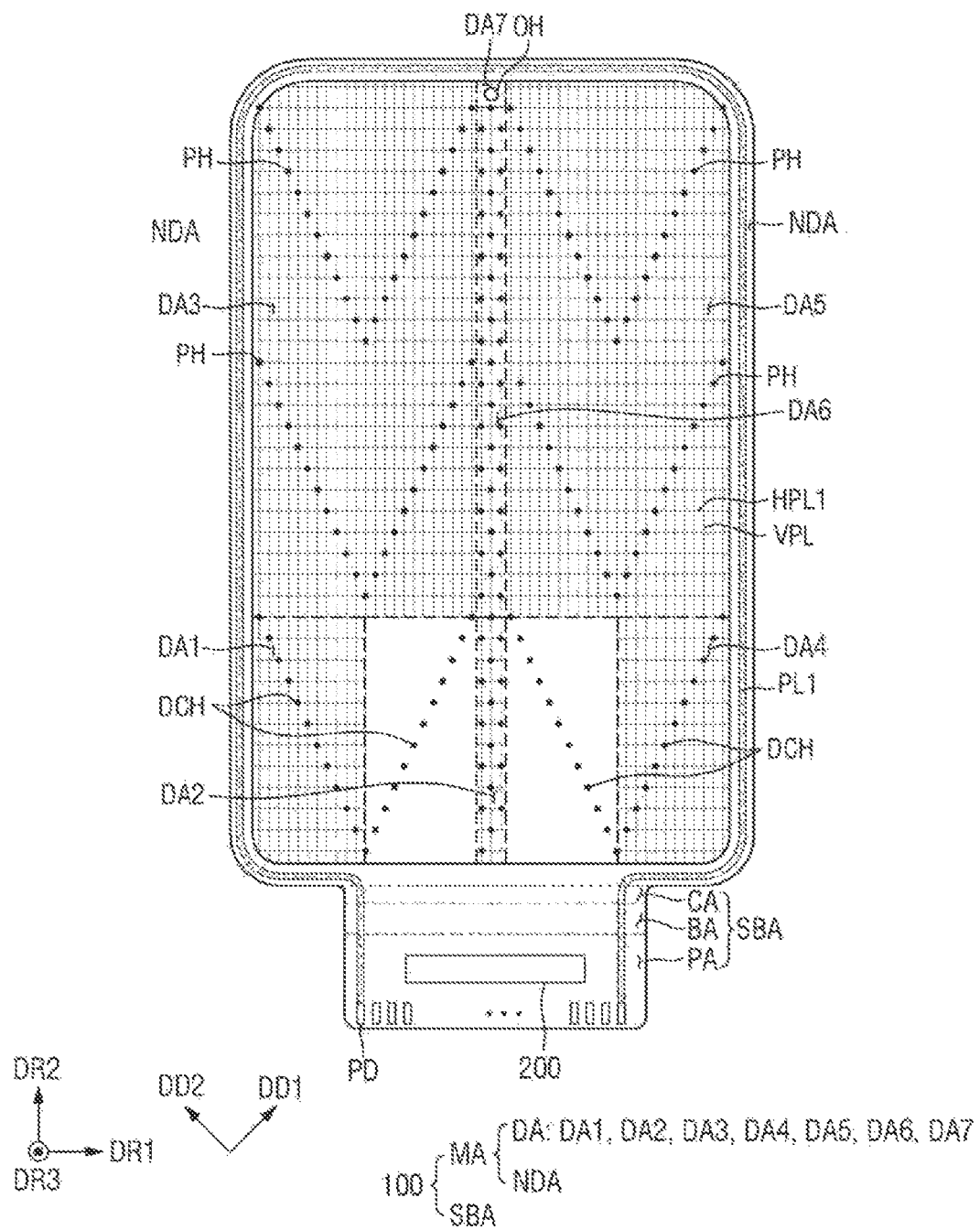
FIG. 34 is a layout diagram illustrating a display device according to another exemplary embodiment.

FIG. 34 is a layout diagram illustrating a display device according to another exemplary embodiment.

Another exemplary embodiment of FIG. 34 is different from an exemplary embodiment of FIG. 2 only in that a length of the seventh display area DA7 in the first direction DR1 is substantially the same as the length of the second display area DA2 in the first direction DR1 and the power holes PH are arranged in a Z shape in the second display area DA2 and the sixth display area DA6, and thus, a detailed description of another exemplary embodiment of FIG. 34 will be omitted.

Figure 35:
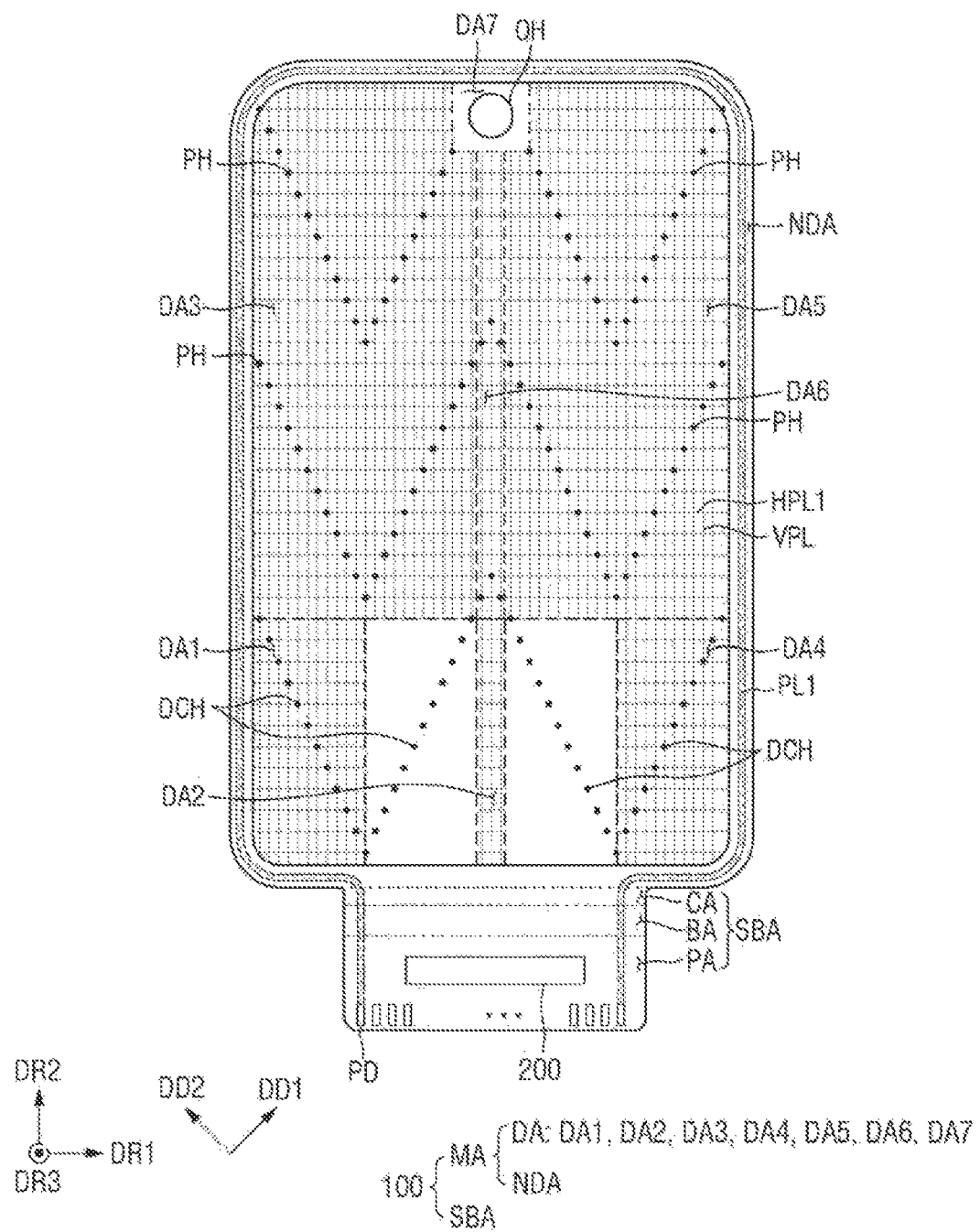
FIG. 35 is a layout diagram illustrating a display device according to still another exemplary embodiment.

FIG. 35 is a layout diagram illustrating a display device according to still another exemplary embodiment.

Still another exemplary embodiment of FIG. 35 is different from an exemplary embodiment of FIG. 2 only in that the power hole PH is not disposed in the second display area DA2 and the power holes PH in the third display area DA3 and the sixth display area DA6 are arranged in a "\/" shape together, and thus, a detailed description of still another exemplary embodiment of FIG. 35 will be omitted.

Figure 36:
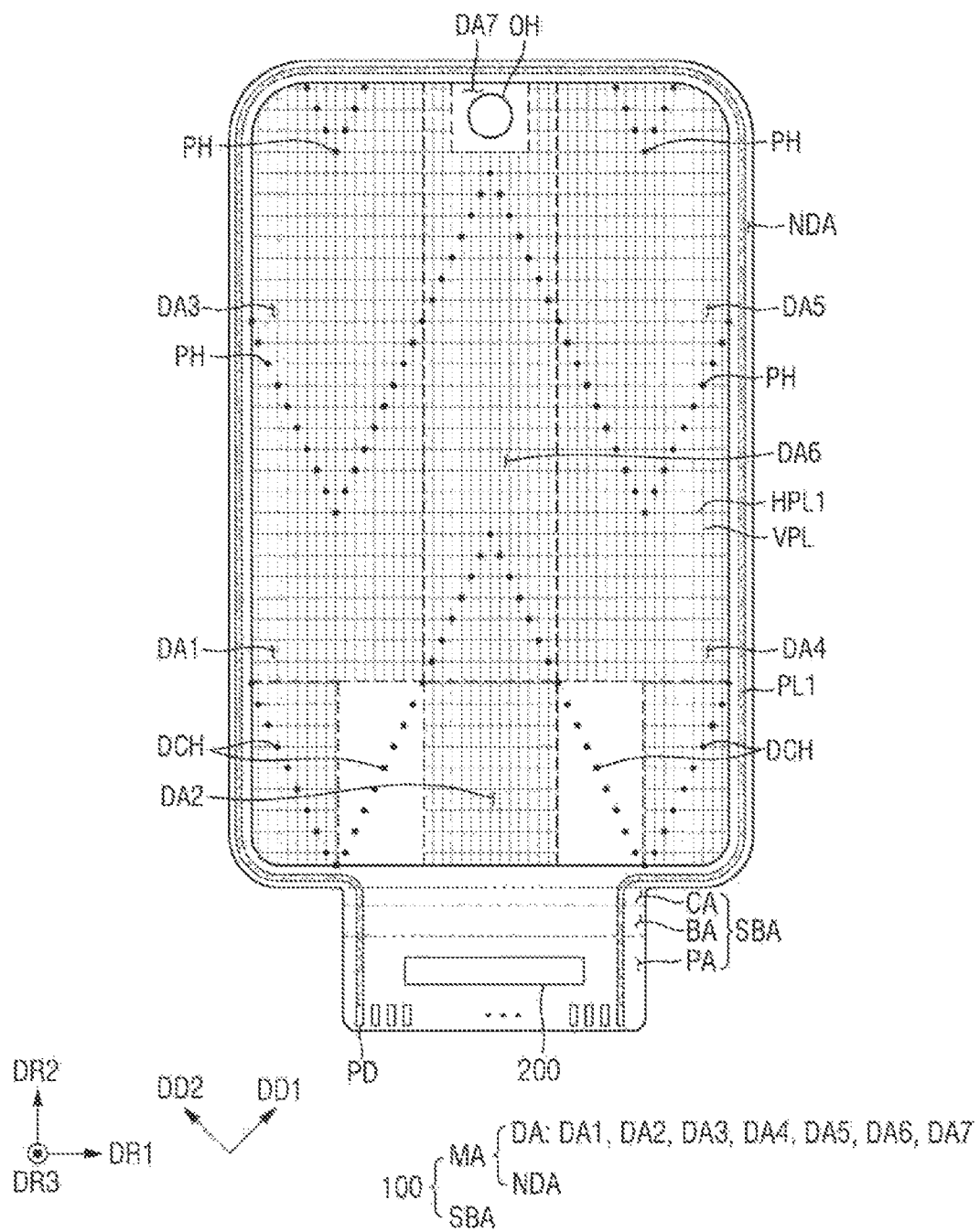
FIG. 36 is a layout diagram illustrating a display device according to still another exemplary embodiment.

FIG. 36 is a layout diagram illustrating a display device according to still another exemplary embodiment.

Still another exemplary embodiment of FIG. 36 is different from an exemplary embodiment of FIG. 2 only in that a length of the second display area DA2 in the first direction DR1 and a length of the sixth display area DA6 in the first direction DR1 are increased, the power holes PH are not disposed in the second display area DA2, and the power holes PH are repeatedly arranged in a "/\" shape in the sixth display area DA6, and thus, a detailed description of still another exemplary embodiment of FIG. 36 will be omitted.

Figure 37:
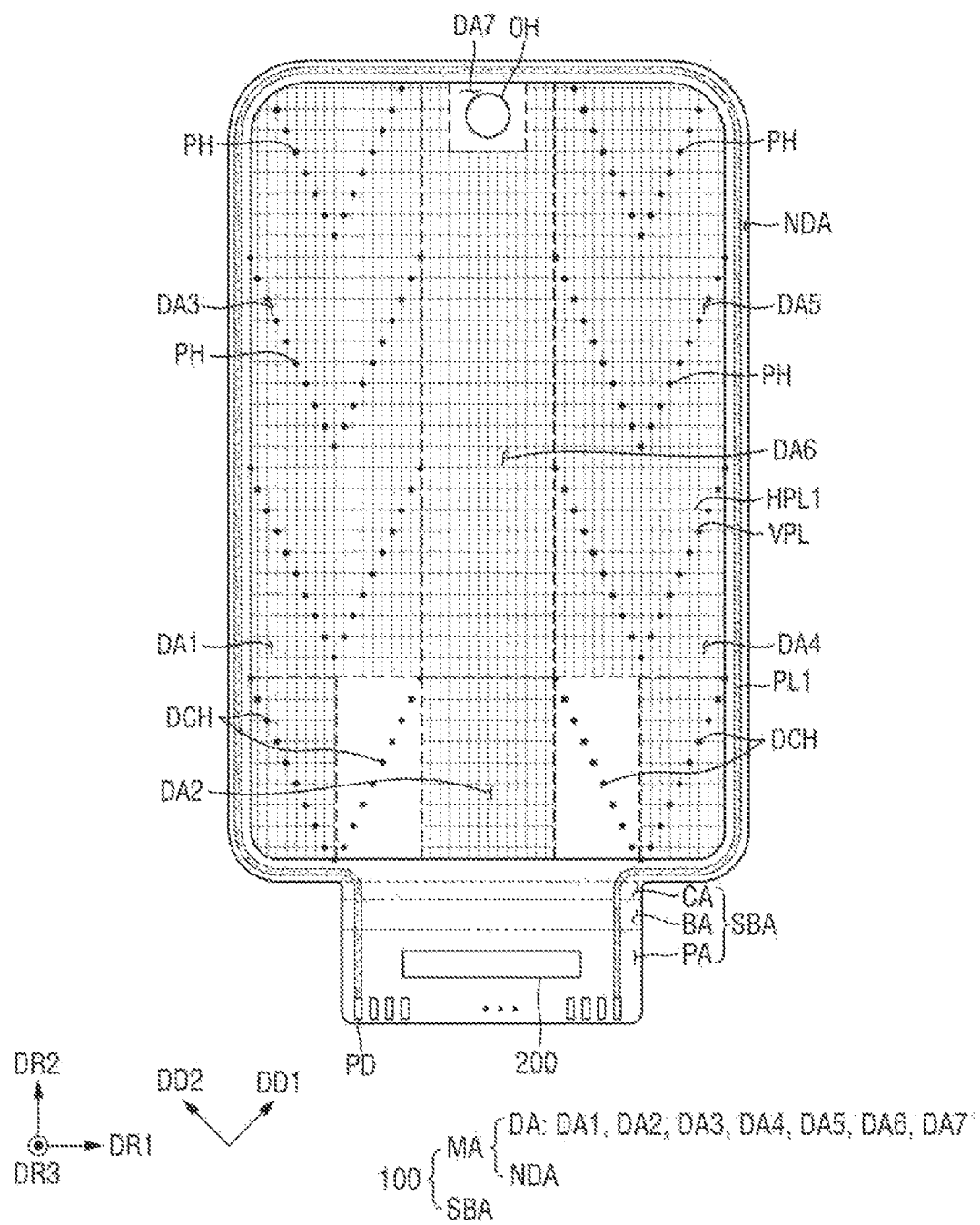
FIG. 37 is a layout diagram illustrating a display device according to still another exemplary embodiment.

FIG. 37 is a layout diagram illustrating a display device according to still another exemplary embodiment.

Still another exemplary embodiment of FIG. 37 is different from an exemplary embodiment of FIG. 2 only in that a length of the second display area DA2 in the first direction DR1 and a length of the sixth display area DA6 in the first direction DR1 are increased and the power holes PH are not disposed in the second display area DA2 and the sixth display area DA6, and thus, a detailed description of still another exemplary embodiment of FIG. 37 will be omitted.

Figure 38:
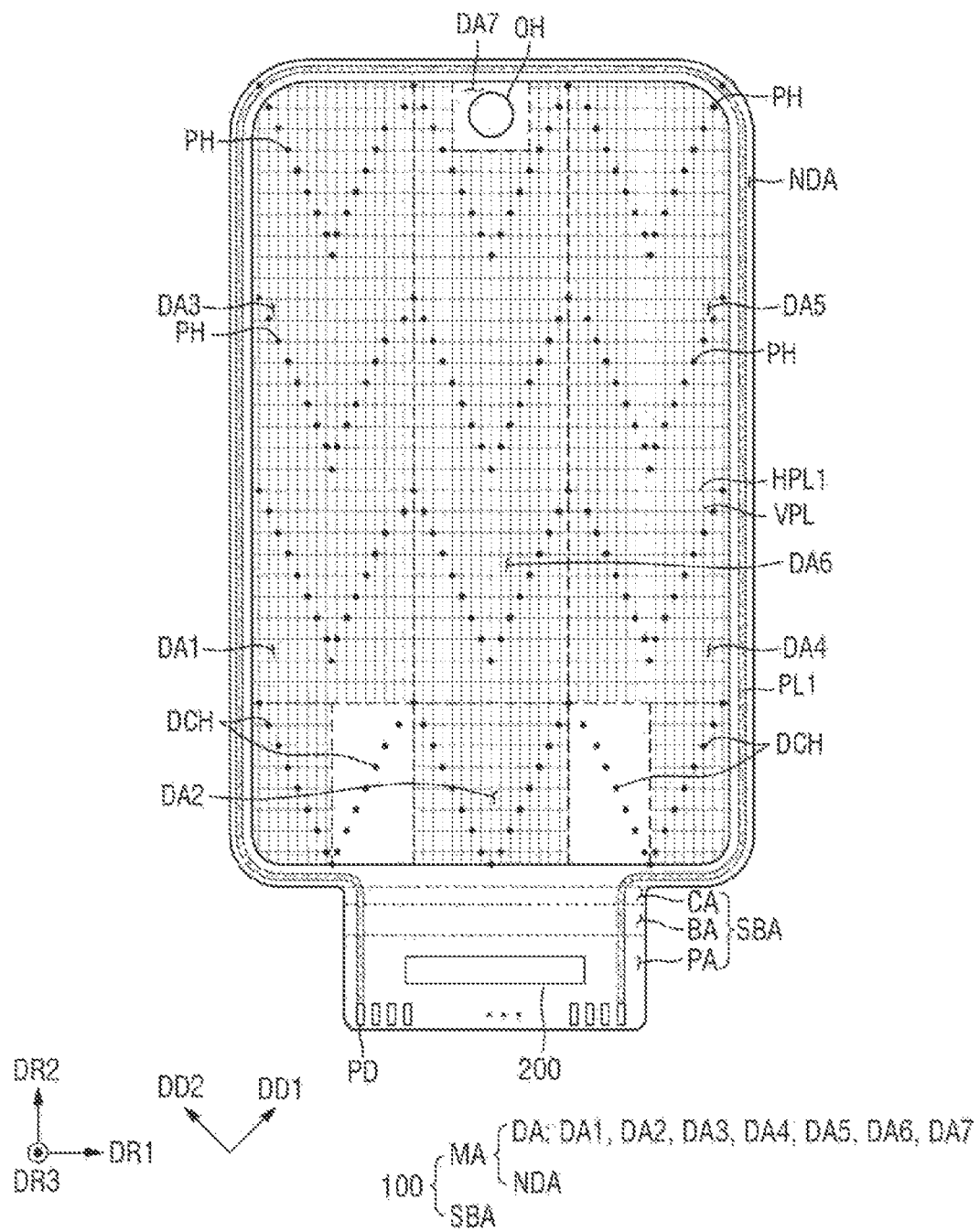
FIG. 38 is a layout diagram illustrating a display device according to still another exemplary embodiment.

FIG. 38 is a layout diagram illustrating a display device according to still another exemplary embodiment.

Still another exemplary embodiment of FIG. 38 is different from an exemplary embodiment of FIG. 2 only in that each of a length of the second display area DA2 in the first direction DR1 and a length of the sixth display area DA6 in the first direction DR1 is substantially the same as the length of the first display area DA1 in the first direction DR1, the length of the third display area DA3 in the first direction DR1, the length of the fourth display area DA4 in the first direction DR1, and the length of the fifth display area DA5 in the first direction DR1, and the power holes PH are arranged in a "\/" shape in the second display area DA2, the third display area DA3, the fifth display area DA5, and the sixth display area DA6, and thus, a detailed description of still another exemplary embodiment of FIG. 38 will be omitted.

Further, in FIGS. 34 to 38, the power holes PH may be arranged in a shape other than the "\/" shape within a range in which they may be designed by one of ordinary skill in the art.

The current disclosure should not be construed as being limited to the embodiments set forth herein. Rather, these embodiments are provided so that this disclosure will be thorough and complete and will fully convey the concept of the inventive concept to those skilled in the art.

While the current disclosure have been particularly shown and described with reference to some embodiments thereof, it will be understood by one of ordinary skill in the art that various changes in form and detail may be made therein without departing from the spirit and scope of the current disclosure as defined by the following claims.

What is claimed is:

1. A display device comprising:
 a display area including a hole and sub-pixels displaying an image;
 a plurality of first data lines disposed on one side of the hole in the display area and extending in a second direction crossing a first direction;
 a plurality of second data lines disposed on the other side of the hole in the display area and extending in the second direction;
 a plurality of bypass lines bypassing the hole in the display area and connecting the first data lines and the second data lines, respectively,
 a plurality of first horizontal power supply lines which extend in the first direction in the display area and to which a first source voltage is applied;
 a plurality of second horizontal power supply lines which extend in the first direction in the display area and to which a second source voltage higher than the first source voltage is applied; and
 a first vertical power supply line extending in the second direction in the display area and disposed to be spaced apart from one end of a bypass line along the second direction.

2. The display device of claim 1, wherein the bypass line includes:
 a first sub-bypass line extending in the first direction and connected to any one of the plurality of first data lines;
 a second sub-bypass line extending in the second direction and connected to the first sub-bypass line; and
 a third sub-bypass line extending in the first direction and connecting the second sub-bypass line and any one of the plurality of second data lines.

3. The display device of claim 2, wherein the first vertical power supply line is connected to any one of the plurality of first horizontal power supply lines.

4. The display device of claim 2, wherein a first spacing portion disposed between the first vertical power supply line and the one end of the second sub-bypass line of a first bypass line of the plurality of bypass lines overlaps any one of the plurality of second horizontal power supply lines.

5. The display device of claim 4, wherein each of the second sub-bypass line of the first bypass line and the first vertical power supply line includes:
 a first line portion having a first width; and
 a second line portion having a second width greater than the first width, and
 wherein the first spacing portion is a gap between the first line portion of the second sub-bypass line of the first bypass line and the first line portion of the first vertical power supply line.

6. The display device of claim 4, wherein a second spacing portion at which the second sub-bypass line of a second bypass line of the plurality of bypass lines and the first vertical power supply line are disposed to be spaced apart from each other does not overlap the plurality of second horizontal power supply lines.

7. The display device of claim 6, wherein each of the second sub-bypass line of the second bypass line and the first vertical power supply line includes:
 a first line portion having a first width; and
 a second line portion having a second width greater than the first width.

8. The display device of claim 7, wherein the second spacing portion is a gap between the first line portion of the second sub-bypass line of the second bypass line and the second line portion of the first vertical power supply line or a gap between the second line portion of the second sub-bypass line and the first line portion of the first vertical power supply line.

9. The display device of claim 7, wherein the second spacing portion is a gap between the second line portion of the second sub-bypass line of the second bypass line and the second line portion of the first vertical power supply line.

10. The display device of claim 2, further comprising a vertical dummy pattern extending in the second direction in the display area and disposed to be spaced apart from the other end of the second sub-bypass line along the second direction.

11. The display device of claim 10, further comprising a second power supply line which is disposed in a non-display area around the display area and to which the second source voltage is applied,
 wherein the vertical dummy pattern is connected to the second power supply line in the non-display area.

12. The display device of claim 2, further comprising a plurality of first horizontal dummy patterns extending in the first direction in the display area and disposed to be spaced apart from one end of the first sub-bypass line along the first direction.

13. The display device of claim 12, wherein the first horizontal dummy patterns are connected to the first vertical power supply line through first power holes, respectively.

14. The display device of claim 13, wherein the first power holes are arranged in the second direction.

15. The display device of claim 13, wherein the first power holes overlap a center of the hole in the second direction.

16. The display device of claim 2, further comprising a plurality of second horizontal dummy patterns extending in the first direction in the display area and disposed to be spaced apart from one end of the third sub-bypass line along the first direction.

17. The display device of claim 16, further comprising: a second vertical power supply line extending in the second direction in the display area,
wherein the second horizontal dummy patterns are connected to the second vertical power supply line through second power holes.

18. The display device of claim 17, wherein the second power holes are arranged in the second direction.

19. The display device of claim 17, wherein the second power holes overlap a center of the hole in the second direction.

20. The display device of claim 16, wherein the first vertical power supply line receives the first source voltage and the second vertical power supply line receives the second source voltage higher than the first source voltage.

21. A display device comprising:
a display area including a hole and sub-pixels displaying an image;
a plurality of first data lines disposed on one side of the hole in the display area and extending in a second direction crossing a first direction;
a plurality of second data lines disposed on the other side of the hole in the display area and extending in the second direction; and
a plurality of bypass lines bypassing the hole in the display area and connecting the first data lines and the second data lines, respectively,
wherein each of the plurality of bypass lines includes:
a first sub-bypass line extending in the first direction and connected to any one of the plurality of first data lines;
a second sub-bypass line extending in the second direction and connected to the first sub-bypass line; and
a third sub-bypass line extending in the first direction and connecting the second sub-bypass line and any one of the plurality of second data lines,
wherein second sub-bypass lines and third sub-bypass lines of some of the plurality of bypass lines are disposed in the display area and second sub-bypass lines and third sub-bypass lines of the rest of the plurality of bypass lines are disposed in the non-display area.

22. The display device of claim 21, further comprising a first power supply line which is disposed in a non-display area disposed around the display area and to which the first source voltage is applied,
wherein the second sub-bypass lines and the third sub-bypass lines of the rest of the plurality of bypass lines are disposed between the first power supply line and the second power supply line.

23. The display device of claim 21, wherein a second sub-bypass line and a third sub-bypass line adjacent to each other among the second sub-bypass lines and the third sub-bypass lines of the rest of the plurality of bypass lines are disposed at different layers.

24. The display device of claim 21, further comprising an optical device disposed in the hole and sensing light incident through the hole.

25. The display device of claim 21, further comprising:
a plurality of active patterns;
at least one insulating film disposed on the plurality of active patterns; and
an exposure hole formed through the at least one insulating layer to expose any one of the plurality of active patterns.

26. The display device of claim 25, further comprising a dummy pattern disposed on the active pattern in the exposure hole.

27. The display device of claim 26, wherein the dummy pattern is disposed to be spaced apart from a sidewall of the at least one insulating film in the exposure hole.

28. The display device of claim 26, wherein the active pattern is disposed between the hole and the sub-pixels.

29. The display device of claim 26, wherein the active pattern is disposed in a non-display area around the display area.

30. The display device of claim 29, wherein second sub-bypass lines and third sub-bypass lines of some of the plurality of bypass lines are disposed in the display area, and second sub-bypass lines and third sub-bypass lines of the rest of the plurality of bypass lines are disposed in the non-display area, and
wherein the active pattern is disposed between a second sub-bypass line and a third sub-bypass line adjacent to each other among the second sub-bypass lines and the third sub-bypass lines of the rest of the plurality of bypass lines.

31. A display device comprising:
a plurality of first data lines extending in a second direction crossing a first direction;
a plurality of second data lines extending in the second direction;
a plurality of bypass lines connecting the first data lines and the second data lines, respectively;
a plurality of first horizontal power supply lines which extend in the first direction and to which a first source voltage is applied; and
a plurality of vertical power supply lines which extend in the second direction and to which a second source voltage is applied,
wherein each of the plurality of bypass lines includes:
a first sub-bypass line extending in the first direction and connected to any one of the plurality of first data lines;
a second sub-bypass line extending in the second direction and connected to the first sub-bypass line; and
a third sub-bypass line extending in the first direction and connecting the second sub-bypass line and any one of the plurality of second data lines, and
wherein a first spacing portion disposed between a second sub-bypass line of a first bypass line of the plurality of bypass lines and any one of the vertical power supply lines overlaps any one of the plurality of first horizontal power supply lines.

32. The display device of claim 31, wherein a second spacing portion disposed between a second sub-bypass line of a second bypass line of the plurality of bypass lines and another of the vertical power supply lines does not overlap the plurality of first horizontal power supply lines.

33. The display device of claim 31, further comprising a plurality of second horizontal power supply lines which extend in the first direction and to which a second source voltage higher than the first source voltage is applied,
wherein the vertical power supply line is connected to any one of the plurality of second horizontal power supply lines.

34. A display device comprising:
a plurality of first data lines extending in a second direction crossing a first direction;
a plurality of second data lines extending in the second direction;
a plurality of bypass lines connecting the first data lines and the second data lines, respectively;

a plurality of horizontal power supply lines which extend in the first direction and to which a first source voltage is applied; and a plurality of vertical power supply lines which extend in the second direction and to which a second source voltage is applied, wherein each of the plurality of bypass lines includes:

a first sub-bypass line extending in the first direction and connected to any one of the plurality of first data lines;

a second sub-bypass line extending in the second direction and connected to the first sub-bypass line;

a third sub-bypass line extending in the first direction and connecting the second sub-bypass line and any one of the plurality of second data lines, and a first spacing portion disposed between a second sub-bypass line of a first bypass line of the plurality of bypass lines and any one of the vertical power supply lines does not overlap the plurality of horizontal power supply lines.

35. The display device of claim 34, wherein a second spacing portion disposed between a second sub-bypass line of a second bypass line of the plurality of bypass lines and another of the vertical power supply lines overlaps any one of the plurality of horizontal power supply lines.

* * * * *